(12) United States Patent
Yamazaki et al.

(10) Patent No.: US 7,875,931 B2
(45) Date of Patent: Jan. 25, 2011

(54) SEMICONDUCTOR DEVICE WITH ISOLATION USING IMPURITY

(75) Inventors: Shunpei Yamazaki, Setagaya (JP); Yasuyuki Arai, Atsugi (JP); Ikuko Kawamata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/785,965

(22) Filed: Apr. 23, 2007

(65) Prior Publication Data

US 2007/0252209 A1 Nov. 1, 2007

(30) Foreign Application Priority Data

Apr. 28, 2006 (JP) ............................. 2006-126984

(51) Int. Cl.
  *H01L 27/12* (2006.01)
(52) U.S. Cl. ...................... 257/347; 257/350; 257/401; 257/E29.112; 257/E29.264; 257/E27.103
(58) Field of Classification Search ................. 257/347, 257/350, 401, E29.112, E29.264, E27.081, 257/E27.103
  See application file for complete search history.

(56) References Cited

U.S. PATENT DOCUMENTS

| | | | |
|---|---|---|---|
| 5,605,847 A | 2/1997 | Zhang | |
| 5,886,364 A | 3/1999 | Zhang | |
| 5,998,838 A | 12/1999 | Tanabe et al. | |
| 6,258,638 B1 | 7/2001 | Tanabe et al. | |
| 6,335,540 B1 | 1/2002 | Zhang | |
| 6,388,291 B1 | 5/2002 | Zhang et al. | |
| 6,433,361 B1 | 8/2002 | Zhang et al. | |
| 6,441,436 B1 * | 8/2002 | Wu et al. ..................... | 257/350 |
| 6,444,508 B1 | 9/2002 | Tanabe et al. | |
| 6,573,589 B2 | 6/2003 | Zhang | |
| 6,703,267 B2 | 3/2004 | Tanabe et al. | |
| 2003/0094669 A1* | 5/2003 | Nakashima .................. | 257/506 |
| 2004/0038488 A1* | 2/2004 | Mouli ......................... | 438/292 |
| 2004/0096999 A1* | 5/2004 | Lin et al. ...................... | 438/30 |
| 2005/0023577 A1* | 2/2005 | Ito .............................. | 257/288 |
| 2005/0042825 A1* | 2/2005 | Kitamura et al. ............. | 438/257 |
| 2006/0014332 A1* | 1/2006 | Mouli ......................... | 438/149 |
| 2007/0252233 A1 | 11/2007 | Yamazaki et al. | |
| 2007/0252234 A1 | 11/2007 | Kawamata et al. | |

FOREIGN PATENT DOCUMENTS

JP  10-242471  9/1998

* cited by examiner

*Primary Examiner*—Hung Vu
*Assistant Examiner*—Vernon P Webb
(74) *Attorney, Agent, or Firm*—Eric J. Robinson; Robinson Intellectual Property Law Office, P.C.

(57) ABSTRACT

In order to form a plurality of semiconductor elements over an insulating surface, in one continuous semiconductor layer, an element region serving as a semiconductor element and an element isolation region having a function to electrically isolate element regions from each other by repetition of PN junctions. The element isolation region is formed by selective addition of an impurity element of at least one or more kinds of oxygen, nitrogen, and carbon and an impurity element that imparts an opposite conductivity type to that of the adjacent element region in order to electrically isolate elements from each other in one continuous semiconductor layer.

21 Claims, 28 Drawing Sheets

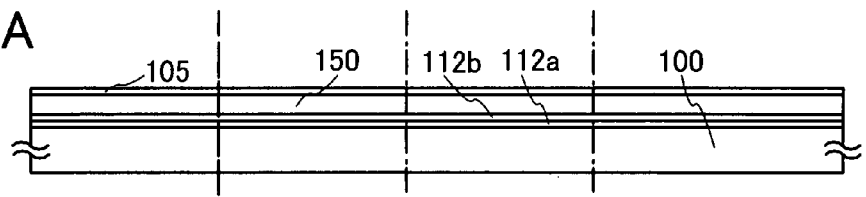
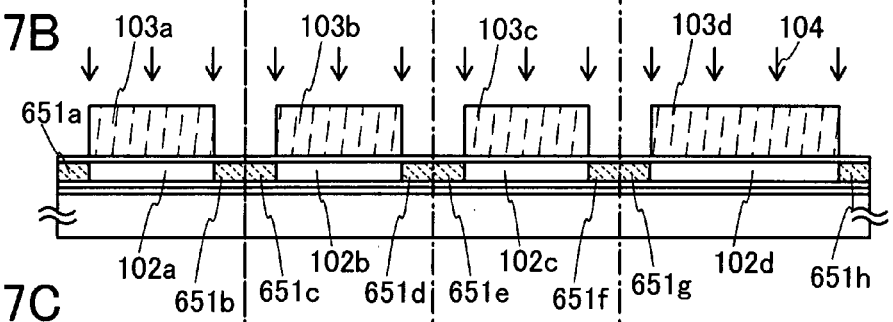
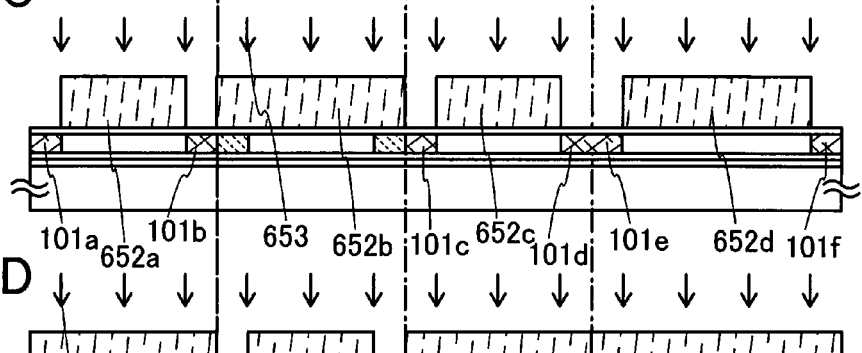
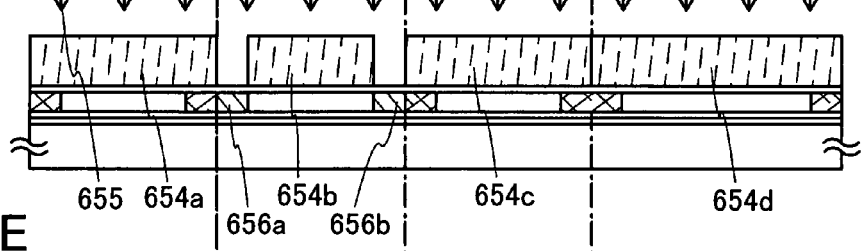
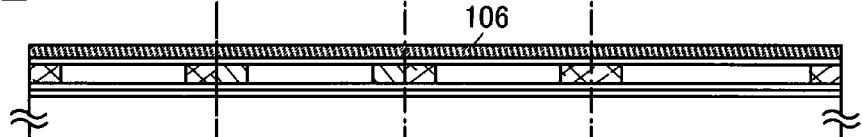
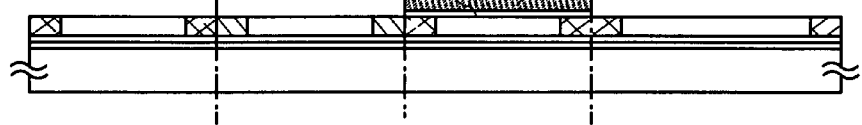

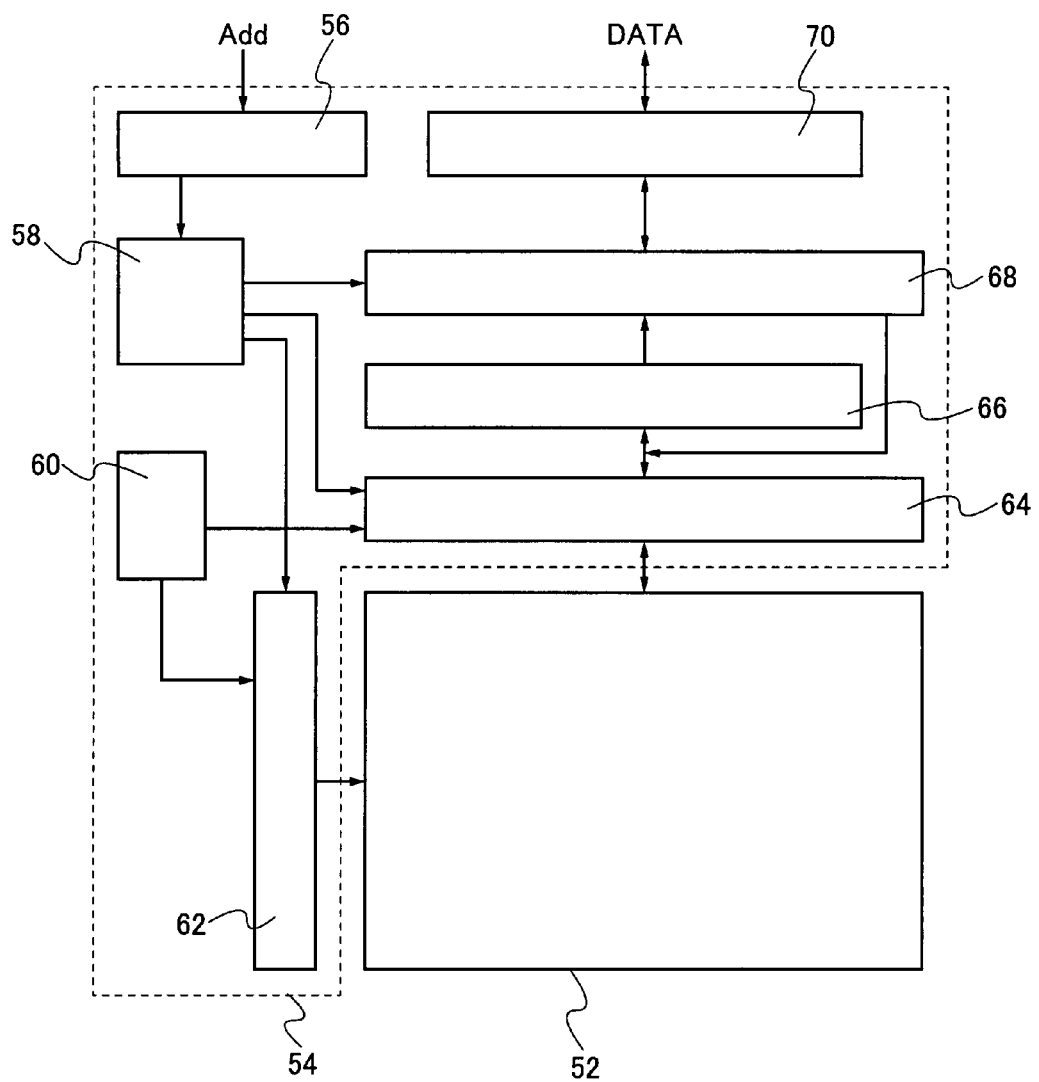

190

191

197

193

194

195

196

SEMICONDUCTOR DEVICE WITH ISOLATION USING IMPURITY

BACKGROUND OF THE INVENTION

1. Field of the Invention

The present invention relates to a semiconductor device having a plurality of semiconductor elements and a manufacturing method thereof.

2. Description of the Related Art

In a case where a plurality of semiconductor elements are provided over an insulating surface, a method is employed, by which a semiconductor film formed over an insulating surface is processed by etching processing into a plurality of island-shaped semiconductor layers. The semiconductor element has a stacked structure of a plurality of thin films, and in a case of a planar type thin film transistor, a gate insulating layer is stacked to cover semiconductor layers divided into island shapes.

The semiconductor layers processed into island shapes have steps in edge portions thereof, and accordingly, defects such as thinning of the gate insulating layer and breakage of a film are generated.

When the gate insulating layer is thinned, a characteristic defect of a semiconductor device is generated, such as leakage current flowing between a gate electrode and the semiconductor layer and a short-circuit (a short) caused by contact between the gate electrode and the semiconductor layer.

In order to solve the above-described problems, a method is conducted, in which two gate insulating layers having different shapes are stacked to relieve steps resulting from the edge portion of the semiconductor layer and to improve coverage (for example, see Patent Document 1: Japanese Published Patent Application No. H10-242471).

SUMMARY OF THE INVENTION

However, by such a method of relieving steps, defects such as a short caused by contact between a semiconductor layer and a gate electrode and leakage current cannot be prevented sufficiently depending on a thickness of a semiconductor layer and a gate insulating layer. In particular, there has been a problem that the leakage current significantly occurs in a case where a semiconductor element is miniaturized (for example, a gate length is less than or equal to 1 μm).

It is an object of the present invention to provide a highly reliable semiconductor device in which defects such as a short and leakage current between a gate electrode and a semiconductor layer that are caused by a coverage defect of a semiconductor layer with a gate insulating layer are prevented, and a manufacturing method of such a semiconductor device.

In the present invention, in order to form a plurality of semiconductor elements over an insulating surface, without dividing a semiconductor layer into a plurality of island-shaped semiconductor layers, an element region serving as a semiconductor element and an element isolation region having a function of electrically insulating and isolating element regions that has high resistance and forms a PN junction with the element region are formed in one continuous semiconductor layer.

The element isolation region is formed by selective addition of a first impurity element that does not contribute to improvement in conductivity and a second impurity element that imparts an opposite conductivity type to that of the source region and the drain region in the element region in order to electrically isolate elements from each other in one continuous semiconductor layer. It is to be noted that the expression "an object that does not contribute to conductivity" is used for the meaning "an object that does not contribute to improvement in conductivity".

As the first impurity element that does not contribute to conductivity, an impurity element of at least one or more kinds of oxygen, nitrogen, and carbon can be used. In the element isolation region to which the first impurity element is added, conductivity is lowered by mixture of the first impurity element that does not contribute to conductivity, and resistance of the element isolation region is increased because its crystallinity is lowered by a physical impact (it can also be referred to as a so-called sputtering effect) on the semiconductor layer at adding. In the element isolation region with the increased resistance, electron field-effect mobility is also lowered, and accordingly, elements can be electrically isolated from each other. On the other hand, in a region to which an impurity element is not added, electron field-effect mobility that is high enough to be able to serve as an element is kept, and accordingly, the region can be used as an element region.

The element region has a source region, a drain region, and a channel formation region. The source region and the drain region are impurity regions having one conductivity type (for example, n-type impurity regions or p-type impurity regions). An impurity element that imparts an opposite conductivity type to that of the source region and the drain region in the element region is added to the element isolation region, whereby the element isolation region is made to be an impurity region having an opposite conductivity type to that of the source region and the drain region in the adjacent element region. That is, in a case where the source region and the drain region in the element region are n-type impurity regions, the adjacent element isolation region may be formed as a p-type impurity region. Similarly, in a case where the source region and the drain region in the element region are p-type impurity regions, the adjacent element isolation region may be formed as an n-type impurity region. The element region and the element isolation region that are adjacent to each other form a PN junction. Accordingly, the element regions can be further insulated and isolated from each other by the element isolation region provided between the element regions.

One feature of the present invention is that one continuous semiconductor layer is isolated into a plurality of element regions in the manner that resistance of the element isolation region by which the element regions are insulated and isolated from each other is increased by addition of the first impurity element that does not contribute to conductivity, and further, a PN junction is formed in a position where the element region and the element isolation region are in contact with each other by addition of the second impurity element that imparts an opposite conductivity type to that of the source region and the drain region in the element region. By the present invention, the element regions can be isolated from each other by an effect caused by each of the first impurity element and the second impurity element. Thus, a higher effect of insulation and isolation of the element can be obtained.

It is to be noted that, in this specification, an element region includes an element formation region in which an element has not been formed yet. Therefore, even when an element is not completed in the manufacturing step of the element (at the stage before other electrode layers or insulating layers are formed), an element formation region that is insulated and isolated from another element formation region by an element isolation region that is a high-resistance region provided in the semiconductor layer will be called an element region.

The addition (introduction) of the impurity element that does not contribute to conductivity in forming the element isolation region can be performed by an ion implantation method, an (ion) doping method, or the like.

Further, in the element isolation region, the first impurity element and the second impurity element may have concentration gradients. For example, in a case where the element isolation region is formed in the semiconductor layer provided over the substrate, in the element isolation region, the second impurity element may be selectively added at higher concentration on the substrate side, and the first impurity element may be selectively added at higher concentration on the semiconductor layer surface side. Of course, the first impurity element and the second impurity element may be added at approximately uniform concentration in the element isolation region. That is, the peak concentration of the first impurity element and the peak concentration of the second impurity element can be appropriately set in the element isolation region.

The resistivity of the element isolation region is preferably greater than or equal to $1 \times 10^{10}$ $\Omega \cdot$cm, and the concentration of the first impurity element such as oxygen, nitrogen, or carbon is preferably greater than or equal to $1 \times 10^{20}$ $\Omega \cdot$cm$^{-3}$ and less than $4 \times 10^{22}$ $\Omega \cdot$cm$^{-3}$.

Crystallinity of the element isolation region is lowered by addition of the impurity element; therefore, it can be said that the element isolation region is made to be amorphous. On the other hand, because the element region is a crystalline semiconductor layer, in a case where a semiconductor element is formed in the element region, crystallinity of the channel formation region is higher than that of the element isolation region, and high electron field-effect mobility can be obtained as a semiconductor element.

As the impurity element added to the element isolation region, a rare gas element such as argon (Ar), neon (Ne), krypton (Kr), or xenon (Xe) may be used. By further addition of such a rare gas element that is an element having comparatively high mass as well as oxygen, nitrogen, and carbon, a physical impact on the semiconductor layer can be increased, whereby crystallinity of the element isolation region can be lowered more effectively.

Therefore, with the use of the present invention, a semiconductor layer can be isolated into a plurality of element regions without being divided into island shapes. Steps resulting from the edge portion of the semiconductor layer are not generated. Thus, a gate insulating layer is formed over a flat semiconductor layer, leading to improvement in coverage of the semiconductor layer with the gate insulating layer. Accordingly, the present invention can provide a highly reliable semiconductor device in which defects such as a short and leakage current between the gate electrode and the semiconductor layer that are caused by a coverage defect of the semiconductor layer with the gate insulating layer are prevented, and a manufacturing method of such a semiconductor device.

It is to be noted that in the present invention, a semiconductor device refers to a device which can function by utilizing the semiconductor characteristics. With the use of the present invention, a device having a circuit including semiconductor elements (e.g., transistors, memory elements, and/or diodes) or a semiconductor device such as a chip including a processor circuit can be manufactured.

One mode of a semiconductor device of the present invention includes, over an insulating surface, a semiconductor layer including an element isolation region and an element region, where the element region includes a source region, a drain region, and a channel formation region; the element isolation region and the element region are in contact with each other; the element isolation region includes a first impurity element and a second impurity element; the first impurity element is at least one or more kinds of oxygen, nitrogen, and carbon; the second impurity element is an impurity element that imparts an opposite conductivity type to that of the source region and the drain region to the element isolation region; and crystallinity of the element isolation region is lower than that of the channel formation region.

Another mode of a semiconductor device of the present invention includes, over an insulating surface, a semiconductor layer including an element isolation region, and a first element region and a second element region that are adjacent to each other with the element isolation region interposed therebetween, where the first element region includes a first source region, a first drain region, and a first channel formation region; the second element region includes a second source region, a second drain region, and a second channel formation region; the first source region, the first drain region, the second source region, and the second drain region have the same conductivity type; the element isolation region includes a first impurity element and a second impurity element; the first impurity element is at least one or more kinds of oxygen, nitrogen, and carbon; the second impurity element is an impurity element that imparts an opposite conductivity type to that of the first source region, the first drain region, the second source region, and the second drain region to the element isolation region; and crystallinity of the element isolation region is lower than that of the first channel formation region and the second channel formation region.

Another mode of a semiconductor device of the present invention includes, over an insulating surface, a semiconductor layer including a first element region, a first element isolation region, a second element isolation region, and a second element region, where the first element region includes a first source region, a first drain region, and a first channel formation region; the second element region includes a second source region, a second drain region, and a second channel formation region; the first source region and the first drain region are n-type impurity regions; the second source region and the second drain region are p-type impurity regions; the first element isolation region includes a first impurity element of at least one or more kinds of oxygen, nitrogen, and carbon and an impurity element that imparts p-type conductivity to the first element isolation region; the second element isolation region includes a first impurity element of at least one or more kinds of oxygen, nitrogen, and carbon and an impurity element that imparts n-type conductivity to the second element isolation region; and crystallinity of the first element isolation region and the second element isolation region is lower than that of the first channel formation region and the second channel formation region.

Another mode of a manufacturing method of a semiconductor device of the present invention includes the steps of forming a semiconductor layer over an insulating surface, forming an element region and an element isolation region that includes a first impurity element and a second impurity element in the semiconductor layer by selective addition of the first impurity element of at least one or more kinds of oxygen, nitrogen, and carbon and the second impurity element that imparts one conductivity type, to the semiconductor layer, forming an insulating layer over the element region and the element isolation region, forming a conductive layer over the element region and the insulating layer, and forming a source region and a drain region having an opposite conductivity type to that of the channel formation region and the second impurity element in the element region.

Another mode of a manufacturing method of a semiconductor device of the present invention includes the steps of forming a semiconductor layer over an insulating surface, forming an element region and an element isolation region including a first impurity element and a second impurity element in the semiconductor layer by selective addition of the first impurity element of at least one or more kinds of oxygen, nitrogen, and carbon and the second impurity element that imparts one conductivity type, to the semiconductor layer, forming an insulating layer over the element region and the element isolation region, forming a conductive layer over the element region and the insulating layer, and forming a source region and a drain region having an opposite conductivity type to that of the channel formation region and the element isolation region in the element region by addition of an impurity element that imparts an opposite conductivity type to that of the second impurity element to the element region.

Another mode of a manufacturing method of a semiconductor device of the present invention includes the steps of forming a semiconductor layer over an insulating surface, forming an insulating layer over the semiconductor layer, forming an element region and an element isolation region including a first impurity element and a second impurity element in the semiconductor layer by selective addition of the first impurity element of at least one or more kinds of oxygen, nitrogen, and carbon and the second impurity element that imparts one conductivity type, to the semiconductor layer through the insulating layer, forming a conductive layer over the element region and the insulating layer, and forming a source region and a drain region having an opposite conductivity type to that of a channel formation region and the second impurity element in the element region.

Another mode of a manufacturing method of a semiconductor device of the present invention includes the steps of forming a semiconductor layer over an insulating surface, forming an insulating layer over the semiconductor layer, forming an element region and an element isolation region including a first impurity element and a second impurity element in the semiconductor layer by selective addition of the first impurity element of at least one or more kinds of oxygen, nitrogen, and carbon and the second impurity element that imparts one conductivity type, to the semiconductor layer through the insulating layer, forming a conductive layer over the element region and the insulating layer, and forming a source region and a drain region having an opposite conductivity type to that of a channel formation region and the element isolation region in the element region by selective addition of an impurity element that imparts an opposite conductivity type to the second impurity element, to the element region.

Therefore, with the use of the present invention, a semiconductor layer can be isolated into a plurality of element regions without being divided into island shapes. Hence, steps resulting from the edge portion of the semiconductor layer are not generated, and thus a gate insulating layer is formed over a flat semiconductor layer, leading to improvement in coverage of the semiconductor layer with the gate insulating layer.

Accordingly, a highly reliable semiconductor device in which defects such as a short and leakage current between a gate electrode and a semiconductor layer that are caused by a coverage defect of a semiconductor layer with a gate insulating layer are prevented, and a manufacturing method of such a semiconductor device can be provided. Hence, miniaturization and high integration can be further performed in a semiconductor device, and high performance of the semiconductor device can be achieved.

BRIEF DESCRIPTION OF THE DRAWINGS

In the accompanying drawings:

FIGS. 7A to 7F are views illustrating a manufacturing method of a semiconductor device of the present invention;

FIG. 19 is a diagram showing an example of a circuit block diagram of a semiconductor device;

DETAILED DESCRIPTION OF THE INVENTION

Figure 1A:
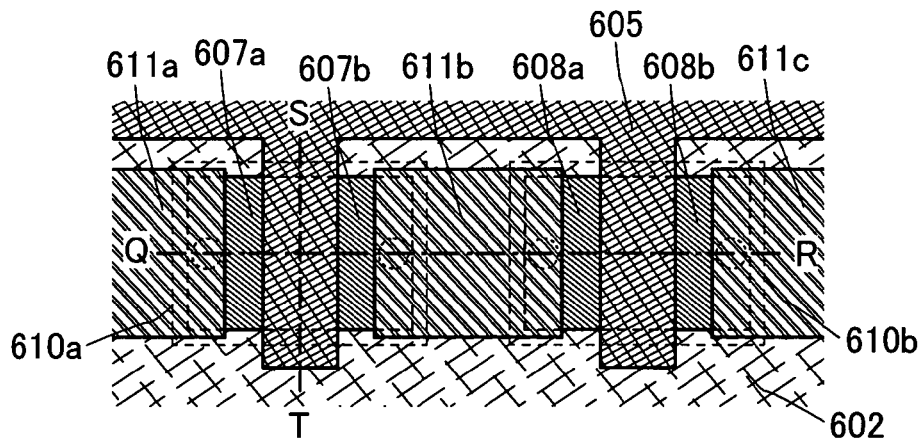
FIGS. 1A to 1C are views illustrating a top view and cross-sectional views of a semiconductor device of the present invention.

Embodiment Modes of the present invention will be described below in detail with reference to the drawings. However, the present invention is not limited to explanation to be given below, and it is to be easily understood that various changes in modes and details thereof will be apparent to those skilled in the art without departing from the purpose and the scope of the present invention. Therefore, the present invention should not be interpreted as being limited to the description of the embodiment modes to be given below. It is to be noted that, in embodiment of the present invention to be described below, the same portions or portions having a similar function are denoted by the same reference numerals through different drawings, and repetitive explanation thereof will be omitted.

Embodiment Mode 1

In this embodiment mode, as an example of a highly reliable semiconductor device in which defects such as a short and leakage current between a gate electrode layer and a semiconductor layer that are caused by a coverage defect of a semiconductor layer with a gate insulating layer are prevented, an NMOS (N-channel Metal Oxide Semiconductor) and a CMOS (Complementary Metal Oxide Semiconductor) will be described with reference to drawings.

Figure 1B:
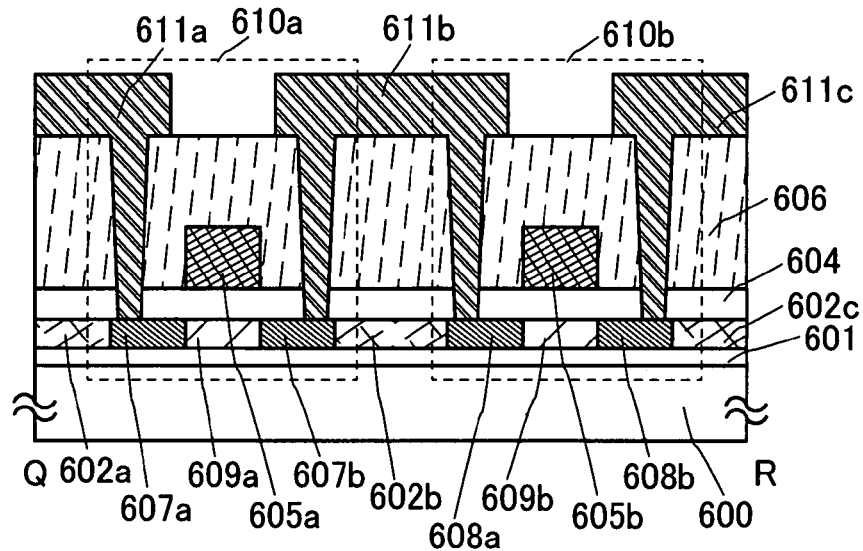
Figure 1C:
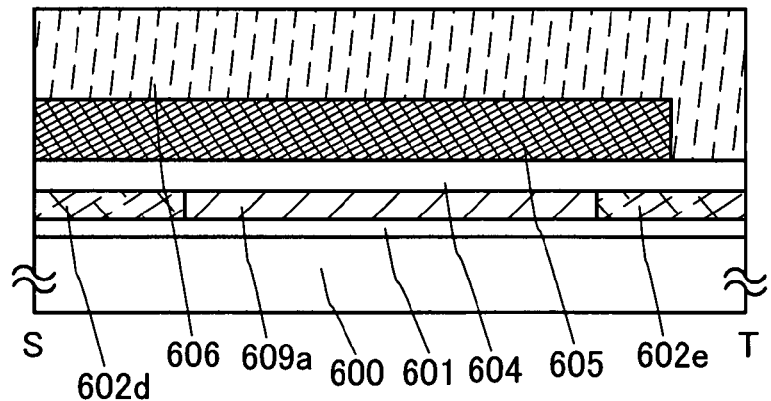

FIGS. 1A to 1C show an example of a semiconductor device with an NMOS structure of this embodiment mode. FIG. 1A is a top view, FIG. 1B is a cross-sectional view taken along a line Q-R in FIG. 1A, and FIG. 1C is a cross-sectional view taken along a line S-T in FIG. 1A.

Over a substrate 600 over which an insulating layer 601 serving as a base film of a semiconductor layer is formed, an NMOS structure having a transistor 610a that is an n-channel thin film transistor and a transistor 610b that is an n-channel transistor, and an insulating layer 606 are formed. The transistor 610a includes an element region having n-type impurity regions 607a and 607b and a channel formation region 609a, and a gate electrode layer 605a. The transistor 610b includes an element region having n-type impurity regions 608a and 608b and a channel formation region 609b, and a gate electrode layer 605b. A gate insulating layer 604 and an insulating layer 606 are formed contiguous with the transistor 610a and the transistor 610b. Further, a wiring layer 611a that is a source electrode layer or a drain electrode layer connected to the n-type impurity region 607a, a wiring layer 611b that is a source electrode layer or a drain electrode layer connected to the n-type impurity region 607b and the n-type impurity region 608a, and a wiring layer 611c that is a source electrode layer or a drain electrode layer connected to the n-type impurity region 608b are provided, and the transistor 610a and the transistor 610b are electrically connected to each other by the wiring layer 611b (see FIGS. 1A to 1C).

In the semiconductor layer, the element region having the n-type impurity regions 607a and 607b and the channel formation region 609a included in the transistor 610a and the element region having the n-type impurity regions 608a and 608b and the channel formation region 609b included in the transistor 610b are electrically isolated from each other by an element isolation region 602 (602a, 602b, 602c, 602d, and 602e).

Figure 4A:
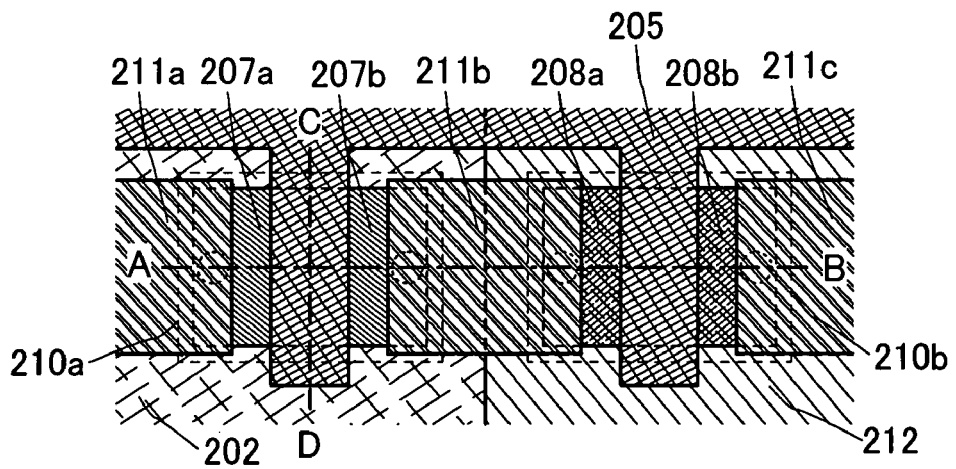
FIGS. 4A to 4C are views illustrating a top view and cross-sectional views of a semiconductor device of the present invention.
Figure 4B:
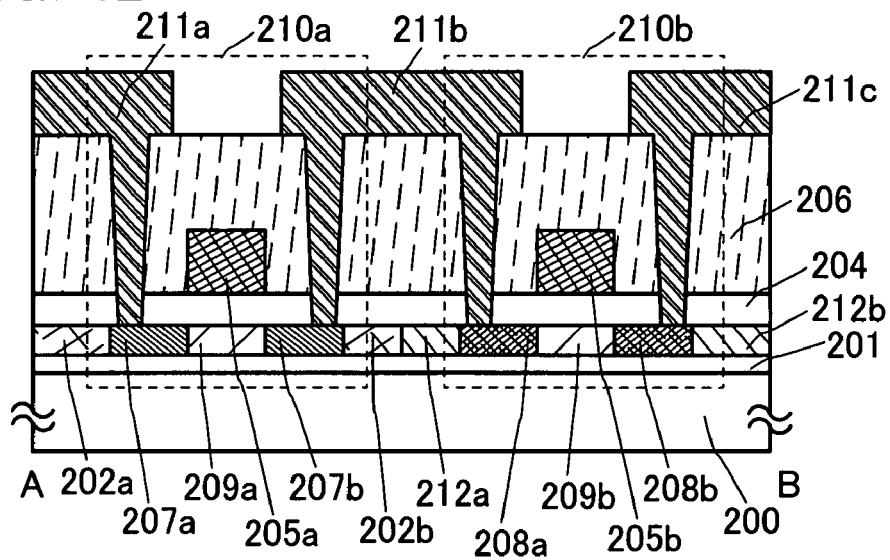
Figure 4C:
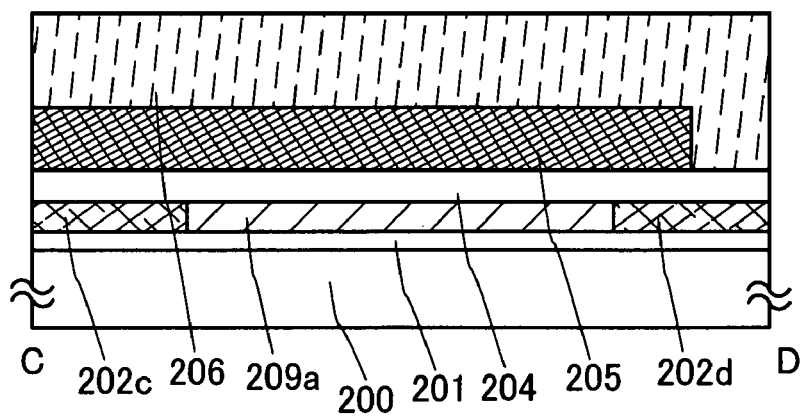

FIGS. 4A to 4C show an example of a semiconductor device with a CMOS structure of this embodiment mode.

FIG. 4A is a top view, FIG. 4B is a cross-sectional view taken along a line A-B in FIG. 4A, and FIG. 4C is a cross-sectional view taken along a line C-D in FIG. 4A.

Over a substrate 200 over which an insulating layer 201 serving as a base film of a semiconductor layer is formed, a CMOS structure having a transistor 210a that is an n-channel thin film transistor and a transistor 210b that is a p-channel thin film transistor, and an insulating layer 206 are formed. The transistor 210a includes an element region having n-type impurity regions 207a and 207b and a channel formation region 209a, and a gate electrode layer 205a. The transistor 210b includes an element region having p-type impurity regions 208a and 208b and a channel formation region 209b, and a gate electrode layer 205b. A gate insulating layer 204 and the insulating layer 206 are formed contiguous with the transistor 210a and 210b. Further, a wiring layer 211a that is a source electrode layer or a drain electrode layer connected to the n-type impurity region 207a, a wiring layer 211b that is a source electrode layer or a drain electrode layer connected to the n-type impurity region 207b and the p-type impurity region 208a, and a wiring layer 211c that is a source electrode layer or a drain electrode layer connected to the p-type impurity region 208b are provided, and the transistor 210a and the transistor 210b are electrically connected to each other by the wiring layer 211b (see FIGS. 4A to 4C).

In the semiconductor layer, the element region having the n-type impurity regions 207a and 207b and the channel formation region 209a included in the transistor 210a and the element region having the p-type impurity regions 208a and 208b and the channel formation region 209b included in the transistor 210b are electrically isolated from each other by an element isolation region 202 (202a, 202b, 202c, and 202d) and an element isolation region 212 (212a and 212b).

The element isolation region is formed by selective addition of a first impurity element that does not contribute to conductivity and a second impurity element that imparts an opposite conductivity type to that of a source region and a drain region in the element region, in order to electrically isolate elements from each other in one semiconductor layer.

As the first impurity element that does not contribute to conductivity, an impurity element of at least one or more kinds of oxygen, nitrogen, and carbon can be used. In the element isolation region to which the first impurity element is added, conductivity is lowered by mixture of the first impurity element that does not contribute to conductivity, and resistance of the element isolation region is increased because its crystallinity is lowered by a physical impact (it can also be referred to as a so-called sputtering effect) on the semiconductor layer at adding. In the element isolation region with the increased resistance, electron field-effect mobility is also lowered, and accordingly, elements can be electrically isolated from each other. On the other hand, in a region to which an impurity element is not added, electron field-effect mobility that is high enough to be able to serve as an element is kept, and accordingly, the region can be used as an element region.

The element region has a source region, a drain region, and a channel formation region. The source region and the drain region are impurity regions having one conductivity type (for example, n-type impurity regions or p-type impurity regions). An impurity element that imparts an opposite conductivity type to that of the source region and the drain region in the element region is added to the element isolation region, whereby the element isolation region is made to be an impurity region having an opposite conductivity type to that of the source region and the drain region in the adjacent element region. That is, in a case where the source region and the drain region in the element region are n-type impurity regions, the adjacent element isolation region may be formed as a p-type impurity region. Similarly, in a case where the source region and the drain region in the element region are p-type impurity regions, the adjacent element isolation region may be formed as an n-type impurity region. The element region and the element isolation region that are adjacent to each other form a PN junction. Accordingly, the element regions can be further insulated and isolated from each other by the element isolation region provided between the element regions.

One feature of the present invention is that one semiconductor layer is isolated into a plurality of element regions in the manner that resistance of the element isolation region by which the element regions are insulated and isolated from each other is increased by addition of the first impurity element that does not contribute to conductivity, and further, a PN junction is formed in a position where the element region and the element isolation region are in contact with each other by addition of the second impurity element that imparts an opposite conductivity type to that of the source region and the drain region in the element region. By the present invention, the element regions can be isolated from each other by an effect caused by each of the first impurity element and the second impurity element. Thus, a higher effect of insulation and isolation of the element can be obtained.

FIGS. 1A to 1C show a case where a plurality of n-channel thin film transistors are formed. Because the element isolation region 602 (602a, 602b, 602c, 602d, and 602e) is provided to be in contact with the n-type impurity regions 607a, 607b, 608a, and 608b, the element isolation region 602 may be formed as a p-type impurity region by addition of an impurity element that imparts p-type conductivity (for example, boron (B), aluminum (Al), gallium (Ga), or the like) as a second impurity element that imparts an opposite conductivity type to that of the n-type impurity regions 607a, 607b, 608a, and 608b.

Although an NMOS structure is shown as an example in this embodiment mode, a PMOS structure is also employed in the similar manner. Because the source region and the drain region in the element region are p-type impurity regions, a second impurity element that imparts n-type conductivity may be added so that the adjacent element isolation region becomes an n-type impurity region. Accordingly, the present invention can employ any of an NMOS structure, a PMOS structure, and a CMOS structure.

FIGS. 4A to 4C show a case where a CMOS structure is formed. Because the element isolation region 202 (202a, 202b, 202c, and 202d) is provided to be in contact with the n-type impurity regions 207a and 207b, the element isolation region 202 may be formed as a p-type impurity region by addition of an impurity element that imparts p-type conductivity (for example, boron (B), aluminum (Al), gallium (Ga), or the like) as a second impurity element that imparts an opposite conductivity type to that of the n-type impurity regions 207a and 207b.

On the other hand, because the element isolation region 212 (212a and 212b) is provided to be in contact with the p-type impurity regions 208a and 208b, the element isolation region 212 may be formed as an n-type impurity region by addition of an impurity element that imparts n-type conductivity (for example, phosphorus (P), arsenic (As), or the like) as a second impurity element that imparts an opposite conductivity type to that of the p-type impurity regions 208a and 208b. As a result, an n-type impurity region and a p-type impurity region are alternately provided to be adjacent to each other, and accordingly, impurity regions having the same conductivity type can be insulated and isolated from each other.

The addition (introduction) of the first impurity element and the second impurity element in forming the element isolation region can be performed by an ion implantation method, an (ion) doping method, or the like.

Further, in the element isolation region, the first impurity element and the second impurity element may have concentration gradients. For example, in a case where the element isolation region is formed in the semiconductor layer provided over the substrate, in the element isolation region, the second impurity element may be selectively added at higher concentration on the substrate side, and the first impurity element may be selectively added at higher concentration on the semiconductor layer surface side. Of course, the first impurity element and the second impurity element may be added at approximately uniform concentration in the element isolation region. That is, the peak concentration of the first impurity element and the peak concentration of the second impurity element can be appropriately set in the element isolation region.

An example of adding the first impurity element and the second impurity element in the element isolation region will be described with reference to FIGS. 3A to 3D and FIGS. 28A to 28D. FIGS. 3A to 3D show a case where source regions and drain regions included in element regions isolated by element isolation regions have the same conductivity, like an NMOS structure or a PMOS structure. FIGS. 28A to 28D show a case where source regions and drain regions included in element regions isolated by element isolation regions have an opposite conductivity type to each other, like a CMOS structure.

In FIGS. 3A to 3D, over a substrate 700 provided with an insulating layer 701, a semiconductor layer 702 including element isolation regions 703a, 703b, and 703c, n-type impurity regions 704a and 704b, and n-type impurity regions 705a and 705b is formed, and over the semiconductor layer 702, conductive layers 708a and 708b are formed with an insulating layer 709 interposed between the semiconductor layer 702 and the conductive layers 708a and 708b.

Figure 3A:
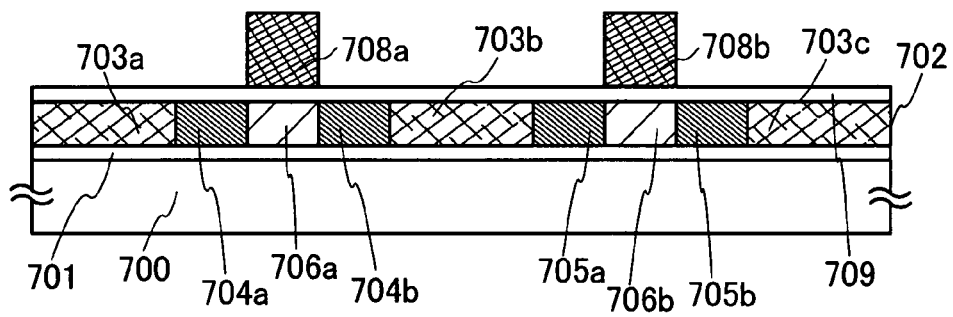
FIGS. 3A to 3D are views illustrating cross sectional views of a semiconductor device of the present invention.

The element isolation region is formed by addition of the first impurity element and the second impurity element as described above. The element isolation regions 703a, 703b, and 703c in FIG. 3A show an example in which a first impurity element that is an impurity element of at least one or more kinds of oxygen, nitrogen, and carbon and the second impurity element that imparts an opposite conductivity type to that of the source region and the drain region in the element region are included almost uniformly. An impurity element that imparts p-type conductivity is used as the second impurity element because the source region and the drain region in the element region are n-type impurity regions. Accordingly, the element isolation regions 703a, 703b, and 703c become p-type impurity regions. The element isolation regions 703a, 703b, and 703c are provided between the n-type impurity regions 704a and 704b and the n-type impurity regions 705a and 705b, leading to PN junctions. Hence, an element region having the n-type impurity regions 704a and 704b and a channel formation region 706a and an element region having the n-type impurity regions 705a and 705b and a channel formation region 706b can be insulated and isolated from each other.

Figure 3B:
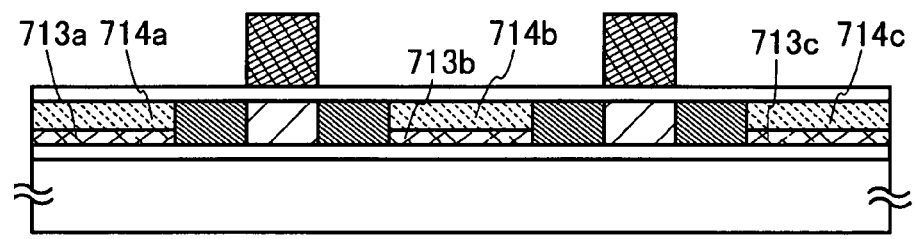

An element isolation region in FIG. 3B has a stacked structure of first element isolation regions 713a, 713b, and 713c and second element isolation regions 714a, 714b, and 714c, respectively. However, the first element isolation region and the second element isolation region are not formed using a stack of thin films but are regions to which a first impurity element and a second impurity element are added; therefore, their boundaries are not clear. The first element isolation regions 713a, 713b, and 713c are regions to which the second impurity element that imparts an opposite conductivity type to that of the source region and the drain region in the element region is added, and the second element isolation regions 714a, 714b, and 714c are regions to which the first impurity element that does not contribute to conductivity is added. In such a manner, in the element isolation region, the first impurity element and the second impurity element may be selectively added, and each of the first impurity element and the second impurity element may have concentration gradients in the element isolation region.

Figure 3C:
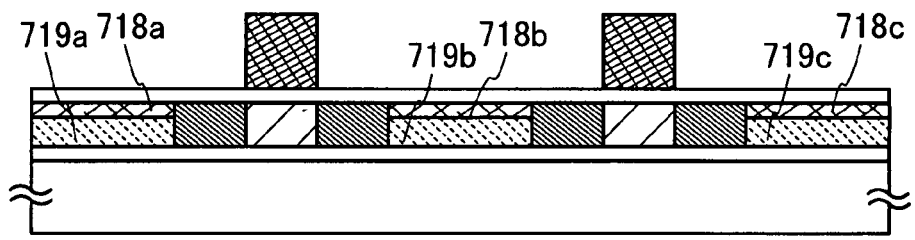

An element isolation region in FIG. 3C has a stacked structure of first element isolation regions 719a, 719b, and 719c and second element isolation regions 718a, 718b, and 718c, respectively. The second element isolation regions 718a, 718b, and 718c are regions to which the second impurity element that imparts an opposite conductivity type to that of the source region and the drain region in the element region is added, and the first element isolation regions 719a, 719b, and 719c are regions to which the first impurity element that does not contribute to conductivity is added.

Figure 3D:
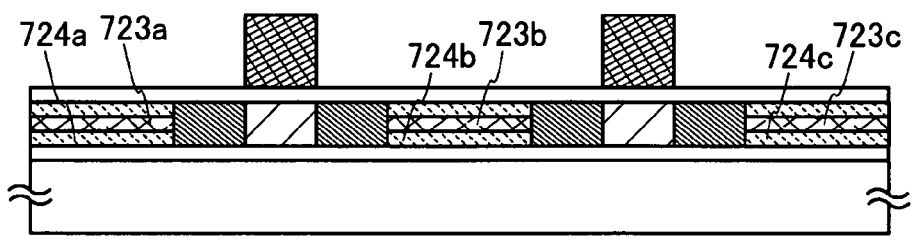

An element isolation region in FIG. 3D has a stacked structure of first element isolation regions 724a, 724b, and 724c and second element isolation regions 723a, 723b, and 723c, respectively. The second element isolation regions 723a, 723b, and 723c are regions to which the second impurity element that imparts an opposite conductivity type to that of the source region and the drain region in the element region is added, and the first element isolation regions 724a, 724b, and 724c are regions to which the first impurity element that does not contribute to conductivity is added. As described above, a structure may be employed, where the region to which the second impurity element is added is provided in a center portion of the semiconductor layer in a thickness direction.

In FIGS. 28A to 28D, over a substrate 700 provided with an insulating layer 701, a semiconductor layer 732 including element isolation regions 733a and 733b, element isolation regions 739a and 739b, n-type impurity regions 734a and 734b, and p-type impurity regions 735a and 735b is formed, and over the semiconductor layer 732, conductive layers 738a and 738b are formed with an insulating layer 709 interposed between the semiconductor layer 732 and the conductive layers 738a and 738b.

Figure 28A:
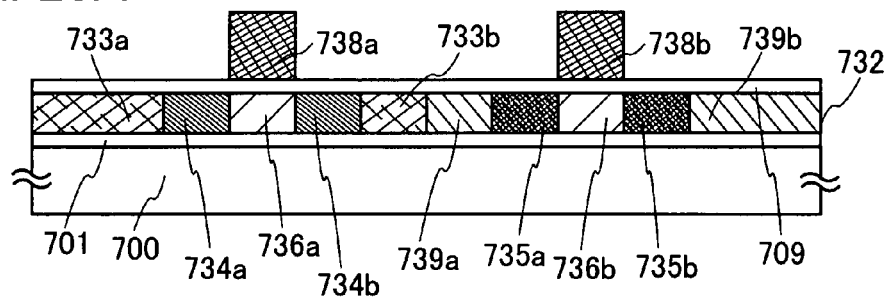
FIGS. 28A to 28D are views illustrating cross-sectional views of a semiconductor device of the present invention.

The element isolation region is formed by addition of the first impurity element and the second impurity element as described above. The element isolation regions 733a and 733b and the element isolation regions 739a and 739b in FIG. 28A show an example in which a first impurity element that is an impurity element of at least one or more kinds of oxygen, nitrogen, and carbon and a second impurity element that imparts an opposite conductivity type to that of the source region and the drain region in the element region are included almost uniformly. An impurity element that imparts p-type conductivity is used as the second impurity element in the element isolation regions 733a and 733b because the source region and the drain region in the adjacent element region are n-type impurity regions 734a and 734b. Accordingly, the element isolation regions 733a and 733b become p-type impurity regions. The element isolation regions 733a and 733b are provided by interposing the n-type impurity regions 734a and 734b, leading to PN junctions. On the other hand, an impurity element that imparts n-type conductivity is used as the second impurity element in the element isolation region 739a and 739b because the source region and the drain region in the adjacent element region are p-type impurity regions 735a and 735b. Accordingly, the element isolation regions 739a and 739b become n-type impurity regions. The element isolation regions 739a and 739b are provided by interposing the p-type impurity regions 735a and 735b, leading to PN junctions. Hence, an element region having the n-type impurity regions 734a and 734b and a channel formation region 736a and an element region having the p-type impurity regions 735a and 735b and a channel formation region 736b can be insulated and isolated from each other.

Figure 28B:
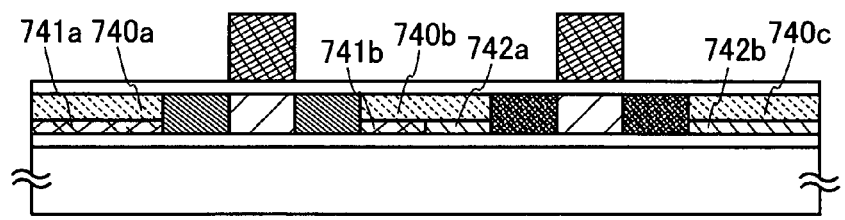

As an element isolation region in FIG. 28B, first element isolation regions 741a and 741b interposing n-type impurity regions 734a and 734b are provided and second element isolation regions 742a and 742b interposing p-type impurity regions 735a and 735b are provided. The first element isolation regions 741a and 741b are formed by addition of an impurity element that imparts p-type conductivity as the second impurity element, and the second element isolation regions 742a and 742b are formed by addition of an impurity element that imparts n-type conductivity. Further, third element isolation regions 740a, 740b, and 740c including the first impurity element are formed over the first element isolation regions 741a and 741b and the second element isolation regions 742a and 742b. In such a manner, in the element isolation region, the first impurity element and the second impurity element may be selectively added, and each of the first impurity element and the second impurity element may have concentration gradients in the element isolation region.

Figure 28C:
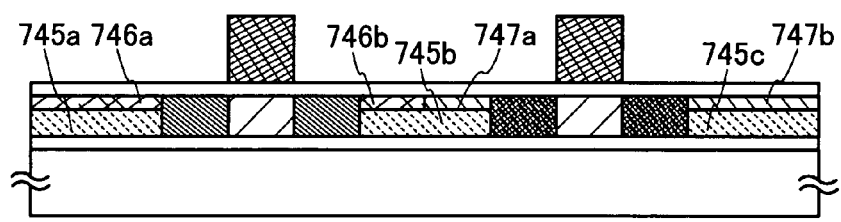

An element isolation region in FIG. 28C has a stacked structure of first element isolation regions 746a and 746b to which an impurity element that imparts p-type conductivity is added as the second impurity element and second element isolation regions 747a and 747b to which an impurity element that imparts n-type conductivity is added as the second impurity element, respectively, over third element isolation region 745a, 745b, and 745c to which the first impurity element is added.

Figure 28D:
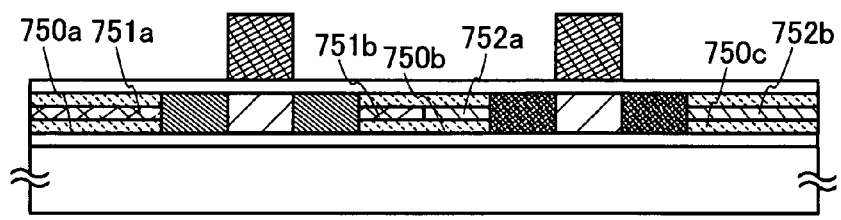

An element isolation region in FIG. 28D has a stacked structure of first element isolation regions 751a and 751b to which an impurity element that imparts p-type conductivity is added as the second impurity element and second element isolation regions 752a and 752b to which an impurity element that imparts n-type conductivity is added as the second impurity element, respectively, over third element isolation region 750a, 750b, and 750c to which the first impurity element is added. As described above, a structure may be employed, where a region to which an impurity element is added is provided in a center portion of the semiconductor layer in a thickness direction.

As described above, in the present invention, the first impurity element and the second impurity element are included in the element isolation region. However, the first impurity element and the second impurity element may be selectively added, and at least one of the first impurity element and the second impurity element may be added. Of course, one of the first impurity element and the second impurity element can be added to the entire element isolation region and the other can be selectively added.

The resistivity of the element isolation region is preferably greater than or equal to $1 \times 10^{10}$ $\Omega \cdot cm$, and the concentration of the first impurity element such as oxygen, nitrogen, or carbon is preferably greater than or equal to $1 \times 10^{20}$ $\Omega \cdot cm^{-3}$ and less than $4 \times 10^{22}$ $\Omega \cdot cm^{-3}$.

Crystallinity of the element isolation region is lowered by addition of the impurity element; therefore, it can be said that the element isolation region is made to be amorphous. On the other hand, because the element region is a crystalline semiconductor layer, in a case where a semiconductor element is formed in the element region, crystallinity of the channel formation region is higher than that of the element isolation region, and high electron field-effect mobility can be obtained as a semiconductor element.

As the impurity element added to the element isolation region, a rare gas element such as argon (Ar), neon (Ne), krypton (Kr), or xenon (Xe) may be used. By further addition of such a rare gas element that is an element having comparatively high mass as well as oxygen, nitrogen, and carbon, a physical impact on the semiconductor layer can be increased, whereby crystallinity of the element isolation region can be lowered more effectively.

In FIG. 1C, a gate electrode layer 605 is formed to extend over the channel formation region 609a and the element isolation regions 602d and 602e in the semiconductor layer, with the gate insulating layer 604 interposed between the gate electrode layer 605 and the semiconductor layer. In the present invention, the element isolation region and the element region are provided in the continuous semiconductor layer; therefore, the element isolation regions 602d and 602e and the element region, which is the channel formation region 609a, are contiguous. Thus, the surface thereof has high flatness and no steep step.

Similarly, in FIG. 4C, a gate electrode layer 205 is formed to extend over the channel formation region 209a and the element isolation regions 202d and 202e in the semiconductor layer, with the gate insulating layer 204 interposed between the gate electrode layer 205 and the semiconductor layer. In the present invention, the element isolation region and the element region are provided in the continuous semiconductor layer; therefore, the element isolation regions 202c and 202d and the element region, which is the channel formation region 209a, are contiguous. Thus, the surface thereof has high flatness and no steep step.

Each of the gate insulating layers 604 and 204 is formed over the highly flat semiconductor layer; therefore, coverage is good and shape defects are not easily generated. Accordingly, defects such as leakage current and a short can be prevented between the gate electrode layers 605 and 205 formed over the gate insulating layers 604 and 204, respectively, and the element region. Thus, a semiconductor device having an NMOS structure, a PMOS structure, or a CMOS structure of this embodiment mode can be a highly reliable semiconductor device in which defects such as a short and leakage current between the gate electrode and the semiconductor layer that are caused by a coverage defect of the semiconductor layer with the gate insulating layer are prevented.

In FIG. 1B, the impurity region is shown by hatching and a blank space. This does not mean that the blank space is not doped with an impurity element, but makes it intuitively understand that the concentration distribution of the impurity element in this region reflects the mask and the doping condition. It is to be noted that this is similar in other drawings of this specification, as well.

As the substrate 200 that is a substrate having an insulating surface, a glass substrate, a quartz substrate, a sapphire substrate, a ceramic substrate, a metal substrate over the surface of which an insulating layer is formed, or the like can be used.

As the insulating layer 201, the gate insulating layer 204, and the insulating layer 206, silicon oxide, silicon nitride, silicon oxynitride, silicon nitride oxide, or the like can be used, which may be formed in a single layer or a stacked structure of two layers, three layers, or the like. It is to be noted that, in this specification, silicon oxynitride refers to a substance in which the content of oxygen is higher than that of nitrogen, and can also be referred to as silicon oxide containing nitrogen. In the same manner, silicon nitride oxide refers to a substance in which the content of nitrogen is higher than that of oxygen, and can also be referred to as silicon nitride containing oxygen.

In addition, as another material of the insulating layer 201, the gate insulating layer 204, and the insulating layer 206, a material selected from aluminum nitride, aluminum oxynitride in which the content of oxygen is higher than that of nitrogen, aluminum nitride oxide or aluminum oxide in which the content of nitrogen is higher than that of oxygen, diamond like carbon (DLC), nitrogen-containing carbon, polysilazane, and other substances containing an inorganic insulating material can be used. A material containing siloxane may also be used. Siloxane corresponds to a material containing the Si—O—Si bond. It is to be noted that siloxane is composed of a skeleton structure formed by the bond of silicon (Si) and oxygen (O). As a substituent thereof, an organic group containing at least hydrogen (for example, an alkyl group or an aryl group) is used. Alternatively, a fluoro group may also be used as the substituent. Further alternatively, a fluoro group and an organic group containing at least hydrogen may also be used as the substituent. In addition, an oxazole resin can be used, and for example, photo-curable type polybenzoxazole or the like can be used.

The insulating layer 201, the gate insulating layer 204, and the insulating layer 206 can be formed by a sputtering method, a PVD (Physical Vapor Deposition) method, a low pressure CVD method (LPCVD method), or a CVD (Chemical Vapor Deposition) method such as a plasma CVD method. Alternatively, a droplet discharging method by which a pattern can be selectively formed, a printing method by which a pattern can be transferred or described (a method, such as a screen printing method or an offset printing method, by which a pattern is formed), or other methods such as a coating method such as a spin coating method, a dipping method, a dispenser method, or the like can also be used.

An etching process for processing into a desired shape may employ either plasma etching (dry etching) or wet etching. In a case of processing a large-sized substrate, plasma etching is suitable. As an etching gas, a fluorine-based gas such as $CF_4$ or $NF_3$ or a chlorine-based gas such as $Cl_2$ or $BCl_3$ is used, to which an inert gas such as He or Ar may be appropriately added. When an etching process by atmospheric pressure discharge is employed, local electric discharge can also be realized, which does not require a mask layer to be formed over an entire surface of the substrate.

Alternatively, the gate insulating layer may be formed by performing plasma treatment on the semiconductor layer. By performance of plasma treatment under a nitrogen atmosphere or an oxygen atmosphere, for example, by performance of nitridation treatment or oxidization treatment on the surface and in the vicinity of the surface of the semiconductor layer using silicon, a nitrogen plasma-treated layer or an oxygen plasma-treated layer can be formed. When oxidization treatment or nitridation treatment (or both of the oxidization treatment and nitridation treatment may be performed) is performed on the gate insulating layer by plasma treatment, the surface of the gate insulating layer is modified, whereby a denser gate insulating layer can be formed. Accordingly, defects such as pinholes can be suppressed and a characteristic or the like of the semiconductor device can be improved.

Plasma used for solid-phase oxidation treatment or solid-phase nitridation treatment by plasma treatment is preferable under the following conditions: excited by microwave (typically, 2.45 GHz) at an electron density of greater than or equal to $1 \times 10^{11}$ cm$^{-3}$ and less than or equal to $1 \times 10^{13}$ cm$^{-3}$ and at an electron temperature of greater than or equal to 0.5 eV and less than or equal to 1.5 eV. The conditions are preferred to form a dense insulating layer at a practical reaction rate solid-phase oxidation treatment or solid-phase nitridation treatment at 500° C. or less.

The oxidation of the surface of the semiconductor layer by this plasma treatment is performed under an oxygen atmosphere (e.g., under an atmosphere containing oxygen ($O_2$) or dinitrogen monoxide ($N_2O$), and a rare gas (containing at least one of He, Ne, Ar, Kr, and Xe), or under an atmosphere containing oxygen or dinitrogen monoxide, hydrogen ($H_2$), and a rare gas). The nitridation of the surface of the semiconductor layer by this plasma treatment is performed under a nitrogen atmosphere (e.g., under an atmosphere containing nitrogen ($N_2$) and a rare gas (containing at least one of He, Ne, Ar, Kr, and Xe), under an atmosphere containing nitrogen, hydrogen, and a rare gas, or under an atmosphere containing $NH_3$ and a rare gas). As the rare gas, Ar can be used for example. Further, a gas in which Ar and Kr are mixed may also be used. The plasma treatment includes oxidation treatment, nitridation treatment, oxynitridation treatment, hydrogenation treatment, and surface modification treatment performed on a semiconductor layer, an insulating layer, and a conductive layer. By excitation of plasma with microwave introduction, plasma with a low electron temperature (less than or equal to 3 eV, preferably less than or equal to 1.5 eV) and high electron density (greater than or equal to $1\times10^{11}$ $cm^{-3}$) can be produced. With oxygen radicals (which may include OH radicals) and/or nitrogen radicals (which may include NH radicals) generated by this high-density plasma, the surface of the semiconductor layer can be oxidized and/or nitrided. By mixture of a rare gas such as argon into the plasma treatment gas, oxygen radicals or nitrogen radicals can be effectively generated by excited species of the rare gas.

When a silicon layer is used as a typical example of the semiconductor layer, the surface of the silicon layer is oxidized by plasma treatment, so that a dense oxide layer without distortion at the interface can be formed. Furthermore, by nitridation of the surface of the oxide layer by plasma treatment so that oxygen in the superficial layer portion is replaced with nitrogen to form a nitride layer, the density of the insulating layer can be further improved. Consequently, an insulating layer which is high in dielectric strength voltage can be formed.

However, when plasma treatment is performed in the present invention, the plasma treatment is performed under the condition where an electric characteristic of a transistor is not adversely affected.

Further, even after forming the substrate, the insulating layer, the interlayer insulating layer, or other insulating layers, conductive layers, and the like included in the semiconductor device, oxidation treatment or nitridation treatment by plasma treatment may be performed on the surface of the substrate, the insulating layer, or the interlayer insulating layer. By the oxidation treatment or the nitridation treatment performed on the surface of the insulating layer by plasma treatment, the surface of the insulating layer can be modified, so that an insulating layer that is denser than an insulating layer formed by a CVD method or a sputtering method can be formed. Therefore, defects such as pin holes can be suppressed, and the characteristics and the like of the semiconductor device can be improved. The above-described plasma treatment can also be performed on conductive layers or the like such as a gate electrode layer, a source wiring layer, and a drain wiring layer. In that case, the surface of the layer or the vicinity of the surface can be nitrided or oxidized.

The semiconductor layer is preferably formed using a single-crystalline semiconductor or a polycrystalline semiconductor. For example, the semiconductor layer can be obtained by crystallizing a semiconductor layer that is formed over an entire surface of the substrate by a sputtering method, a plasma CVD method, or a low pressure CVD method. The semiconductor material is preferably silicon, and a silicon germanium semiconductor can also be used as well. Crystallization of the semiconductor layer can be performed by a laser crystallization method, a thermal crystallization method using rapid thermal annealing (RTA) or an annealing furnace, a crystallization method using a metal element that promotes the crystallization, or a method combining them.

A p-type impurity may be injected into the semiconductor layer. As the p-type impurity, for example, boron may be used and added at a concentration of approximately from $5\times10^{15}$ atoms/$cm^3$ to $1\times10^{16}$ atoms/$cm^3$. The impurity is added to control the threshold voltage of a transistor, and the impurity effectively operates when it is added to the channel formation regions 209*a* and 209*b*.

The wiring layer and the gate electrode layer included in the transistor can be formed from a material selected from indium tin oxide (ITO), indium zinc oxide (IZO) in which zinc oxide (ZnO) is mixed with indium oxide, a conductive material in which silicon oxide ($SiO_2$) is mixed with indium oxide, organoindium, organotin, indium oxide containing tungsten oxide, indium zinc oxide containing tungsten oxide, indium oxide containing titanium oxide, or indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of such metals; or metal nitride thereof.

A structure of the thin film transistor is not limited to that in this embodiment mode, and the thin film transistor may have a single-gate structure in which one channel formation region is formed, a double-gate structure in which two channel formation regions are formed, or a triple-gate structure in which three channel formation regions are formed. A thin film transistor in the peripheral driver circuit region may have a single-gate structure, a double-gate structure, or a triple-gate structure.

Therefore, with the use of the present invention, a semiconductor layer can be isolated into a plurality of element regions without being divided into island shapes. Steps resulting from the edge portion of the semiconductor layer are not generated, and thus a gate insulating layer is formed over a flat semiconductor layer, leading to improvement in coverage of the semiconductor layer with the gate insulating layer. Accordingly, the present invention can provide a highly reliable semiconductor device in which defects such as a short and leakage current between the gate electrode layer and the semiconductor layer that are caused by coverage defect of the semiconductor layer with the gate insulating layer are prevented, and a manufacturing method of such a semiconductor device. Hence, miniaturization and integration can be further performed in a semiconductor device, and high performance of the semiconductor device can be accomplished. In addition, because a defect caused by a shape defect of such a film can be reduced, in a manufacturing process, a semiconductor device can be produced with good yield.

Embodiment Mode 2

In this embodiment mode, as a highly reliable semiconductor device in which defects such as a short and leakage current between an electrode layer and a semiconductor layer that are caused by a coverage defect of a semiconductor layer with an insulating layer are prevented, an example of a nonvolatile semiconductor storage device will be described with reference to the drawings.

Features of a nonvolatile storage element lie in that its structure is similar to that of a MOSFET (Metal Oxide Semiconductor Field Effect Transistor) and a region capable of accumulating charges for a long period of time is provided over a channel formation region. The charge accumulation region is formed over an insulating layer and is insulated and isolated from the surroundings; therefore, it is also referred to as a floating gate electrode layer. Because the floating gate electrode layer has a function to accumulate charges, it is also referred to as a charge accumulation layer. In this specification, this charge accumulation region including the floating gate electrode layer is mainly referred to as a charge accumulation layer. A control gate electrode layer is provided over the floating gate electrode layer with an insulating layer interposed therebetween.

In a so-called floating gate type nonvolatile semiconductor storage device having such a structure, charges are accumulated and released in/from the charge accumulation layer by voltage applied to the control gate electrode layer. In other words, the so-called floating gate type nonvolatile semiconductor memory device has a mechanism of storing data by injection and release of charges stored in the charge accumulation layer. Specifically, the injection of charges into the charge accumulation layer and the release of charges from the charge accumulation layer are carried out by application of high voltage between the control gate electrode layer and a semiconductor layer in which a channel formation region is formed. Here, Fowler-Nordheim (F-N) tunneling current (in the case of NAND type) or hot electrons (in the case of NOR-type) is said to flow in the insulating layer over the channel formation region. Thus, the insulating layer is also called a tunnel insulating layer.

Figure 2A:
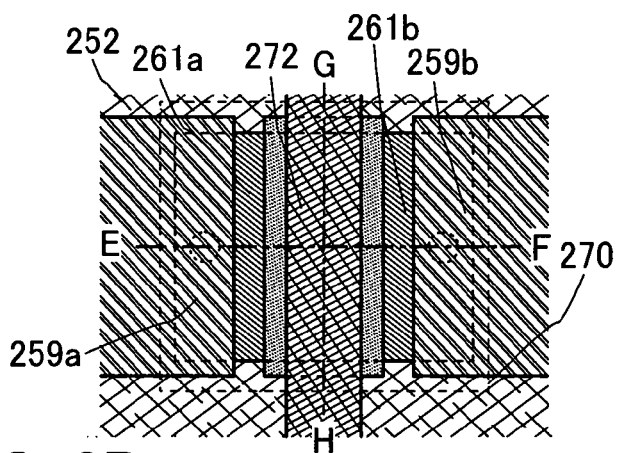
FIGS. 2A to 2C are views illustrating a top view and cross-sectional views of a semiconductor device of the present invention.
Figure 2B:
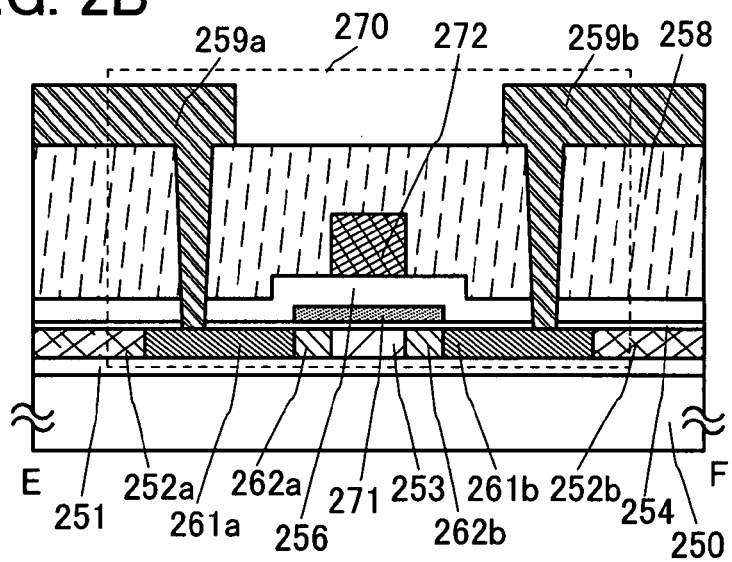
Figure 2C:
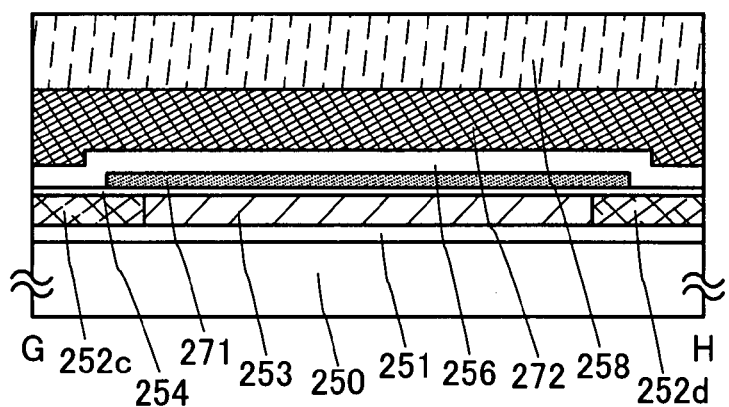

FIGS. 2A to 2C show an example of a semiconductor device that is a nonvolatile semiconductor storage device of this embodiment mode. FIG. 2A is a top view, FIG. 2B is a cross-sectional view taken along a line E-F in FIG. 2A, and FIG. 2C is a cross-sectional view taken along a line G-H in FIG. 2A.

A memory element 270 that is a nonvolatile memory element and an interlayer insulating layer 258 are formed over a substrate 250 over which an insulating layer 251 serving as a base film of a semiconductor layer is formed. The memory element 270 includes an element region having high-concentration impurity regions 261a and 261b, low-concentration impurity regions 262a and 262b, and a channel formation region 253, a first insulating layer 254, a charge accumulation layer 271, a second insulating layer 256, a control gate electrode layer 272, and wiring layers 259a and 259b. Element isolation regions 252a and 252b are formed to be in contact with the element region (see FIGS. 2A to 2C).

An impurity element that imparts n-type conductivity (phosphorus (P), arsenic (As), or the like) or an impurity element that imparts p-type conductivity (for example, boron (B), aluminum (Al), gallium (Ga), or the like) is included as an impurity element that imparts one conductivity type in the high-concentration impurity regions 261a and 261b and the low-concentration impurity regions 262a and 262b. The high-concentration impurity regions 261a and 261b are regions serving as a source and a drain in the memory element.

In the semiconductor layer, the element region having the high-concentration impurity regions 261a and 261b, the low-concentration impurity regions 262a and 262b, and the channel formation region 253 is electrically isolated from other memory elements by an element isolation region 252 (252a, 252b, 252c, and 252d) surrounding its periphery.

The element isolation region is formed by selective addition of a first impurity element that does not contribute to conductivity and a second impurity element that imparts an opposite conductivity type to that of a source region and a drain region in the element region in order to electrically isolate elements from each other in one semiconductor layer.

As the first impurity element that does not contribute to conductivity, an impurity element of at least one or more kinds of oxygen, nitrogen, and carbon can be used. The element isolation region to which the first impurity element is added, conductivity is lowered by mixture of the first impurity element that does not contribute to conductivity, and resistance of the element isolation region is increased because its crystallinity is lowered by a physical impact (it can also be referred to as a so-called sputtering effect) on the semiconductor layer at adding. In the element isolation region with the increased resistance, electron field-effect mobility is also lowered, and accordingly, elements can be electrically isolated from each other. On the other hand, in a region to which an impurity element is not added, electron field-effect mobility that is high enough to be able to serve as an element is kept, and accordingly, the region can be used as an element region.

The element region has a source region, a drain region, and a channel formation region. The source region and the drain region are impurity regions having one conductivity type (for example, n-type impurity regions or p-type impurity regions). An impurity element that imparts an opposite conductivity type to that of the source region and the drain region in the element region is added to the element isolation region, whereby the element isolation region is made to be an impurity region having an opposite conductivity type to that of the source region and the drain region in the adjacent element region. That is, in a case where the source region and the drain region in the element region are n-type impurity regions, the adjacent element isolation region may be formed as a p-type impurity region. Similarly, in a case where the source region and the drain region in the element region are p-type impurity regions, the adjacent element isolation region may be formed as an n-type impurity region. The element region and the element isolation region that are adjacent to each other form a PN junction. Accordingly, the element regions can be further insulated and isolated from each other by the element isolation region provided between the element regions.

One feature of the present invention is that one semiconductor layer is isolated into a plurality of element regions in the manner that resistance of the element isolation region by which the element regions are insulated and isolated from each other is increased by addition of the first impurity element that does not contribute to conductivity, and further, a PN junction is formed in a position where the element region and the element isolation region are in contact with each other by addition of the second impurity element that imparts an opposite conductivity type to that of the source region and the drain region in the element region. By the present invention, the element regions can be isolated from each other by an effect caused by each of the first impurity element and the second impurity element. Thus, a higher effect of insulation and isolation of the element can be obtained.

FIGS. 4A to 4C show a case where a plurality of memory elements is formed. Because the element isolation region 252 (252a, 252b, 252c, and 252d) is provided to be in contact with the n-type high-concentration impurity regions 261a and 261b, the element isolation region 252 may be formed as a p-type impurity region by addition of an impurity element that imparts p-type conductivity (for example, boron (B), aluminum (Al), gallium (Ga), or the like) as a second impurity element that imparts an opposite conductivity type to that of the source region and the drain region in the element region.

The addition (introduction) of the first impurity element and the second impurity element in forming the element isolation region can be performed by an ion implantation method, an (ion) doping method, or the like.

The resistivity of the element isolation region is preferably greater than or equal to $1 \times 10^{10}$ Ω·cm, and the concentration of the first impurity element such as oxygen, nitrogen, or carbon is preferably greater than or equal to $1 \times 10^{20}$ Ω·cm$^{-3}$ and less than $4 \times 10^{22}$ Ω·cm$^{-3}$.

Crystallinity of the element isolation region is lowered by addition of the impurity element; therefore, it can be said that the element isolation region is made to be amorphous. On the other hand, because the element region is a crystalline semiconductor layer, in a case where a semiconductor element is formed in the element region, crystallinity of the channel formation region is higher than that of the element isolation region, and high electron field-effect mobility can be obtained as a semiconductor element.

As the impurity element added to the element isolation region, a rare gas element such as argon (Ar), neon (Ne), krypton (Kr), or xenon (Xe) may be used. By further addition of such a rare gas element that is an element having comparatively high mass as well as oxygen, nitrogen, and carbon, a physical impact on the semiconductor layer can be increased, whereby crystallinity of the element isolation region can be lowered more effectively.

In FIG. 2C, a control gate electrode layer 272 is formed to extend over the channel formation region 253 and the element isolation regions 252c and 252d in the semiconductor layer, with the first insulating layer 254, the charge accumulation layer 271, and the second insulating layer 256 interposed between the control gate electrode layer 272 and the semiconductor layer. In the present invention, the element isolation region and the element region are provided in the continuous semiconductor layer; therefore, the element isolation regions 252c and 252d and the element region, which is the channel formation region 253, are contiguous. Thus, the surface thereof has high flatness and no steep step.

The first insulating layer 254 is formed over the highly flat semiconductor layer; therefore, coverage is good and shape defects are not easily generated. Accordingly, defects such as leakage current and a short can be prevented between the charge accumulation layer 271 formed over the first insulating layer 254 and channel formation region 253. Thus, a semiconductor device that is a nonvolatile semiconductor storage device of this embodiment mode can be a highly reliable semiconductor device in which defects such as a short and leakage current between the charge accumulation layer and the semiconductor layer that are caused by a coverage defect of the semiconductor layer with the first insulating layer 254 are prevented.

In FIGS. 2A to 2C, an example is shown in which the element region in the semiconductor layer is narrower than the charge accumulation layer 271 in the line G-H direction and wider than that of the control gate electrode layer 272 in the line E-F direction. However, the present invention is not limited thereto. FIGS. 26A to 26C and FIGS. 27A to 27C each show the other combinations of the sizes of the element region, the charge accumulation layer, and the control gate electrode layer. FIGS. 26A to 26C and FIGS. 27A to 27C are similar to FIGS. 2A to 2C other than the charge accumulation layer and the control gate electrode layer; therefore, the same reference numerals as those in FIGS. 2A to 2C are used, and explanation will be omitted.

Figure 26A:
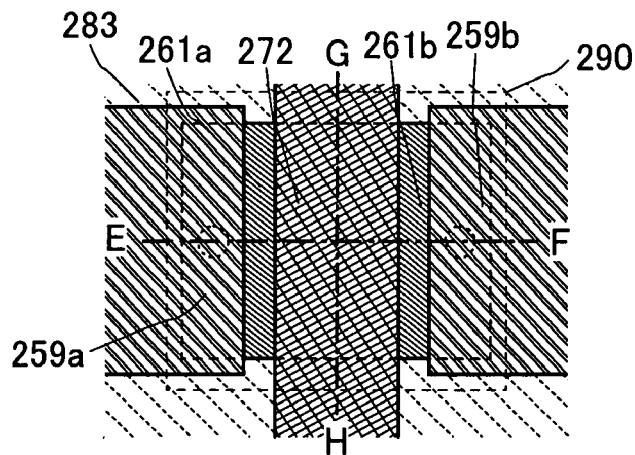
FIGS. 26A to 26C are views illustrating a top view and cross-sectional views of a semiconductor device of the present invention.
Figure 26B:
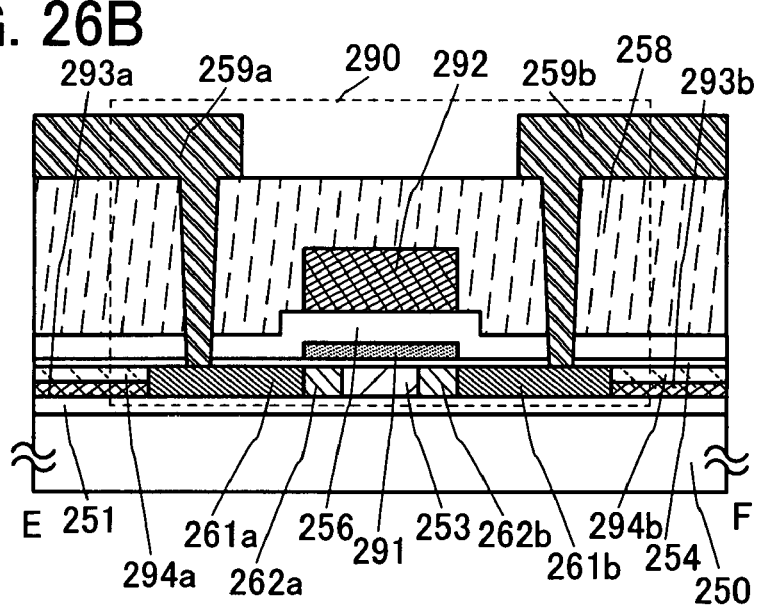
Figure 26C:
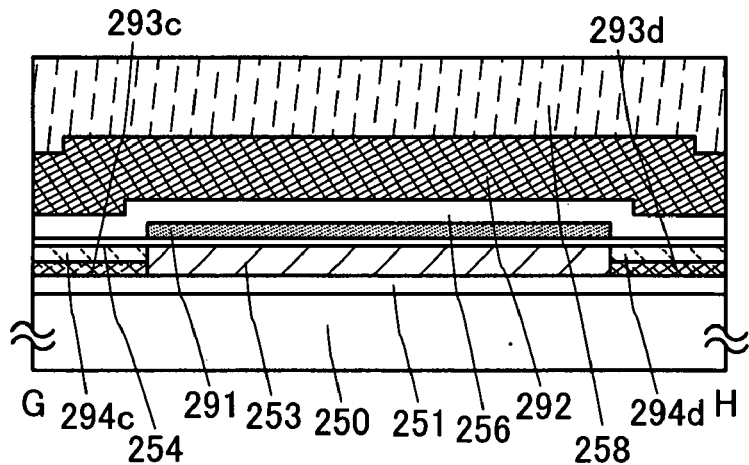

In a memory element 290 in FIGS. 26A to 26C, the width of an element region in a semiconductor layer is almost the same as that of a charge accumulation layer 291 in the line G-H direction, and is wider than that of a control gate electrode layer 292 in the line E-F direction. Therefore, in FIG. 26B, the edge portion of the charge accumulation layer 291 and the edge portion of the control gate electrode layer 292 roughly coincide with each other with a second insulating layer 256 interposed between the charge accumulation layer 291 and the control gate electrode layer 292, and in FIG. 26C, the edge portion of a channel formation region 253 in the element region and the edge portion of the charge accumulation layer 291 roughly coincide with each other with a first insulating layer 254 interposed between the channel formation region 253 and the charge accumulation layer 291. Further, a second impurity element is selectively added to an element isolation region in FIGS. 26A to 26C, and the element isolation region includes first element isolation regions 293a and 293b and second element isolation region 294a and 294b. An example is shown in which the second impurity element that imparts an opposite conductivity type to that of the source region and the drain region in the element region is selectively added to the first element isolation regions 293a and 293b, and only the first impurity element is added to the second element isolation region 294a and 294b. As described above, in the present invention, the first impurity element and the second impurity element are included in the element isolation region. However, the first impurity element and the second impurity element may be selectively added, and at least one of the first impurity element and the second impurity element may be added. Of course, one of the first impurity element and the second impurity element can be added to the entire element isolation region and the other can be selectively added.

Figure 27A:
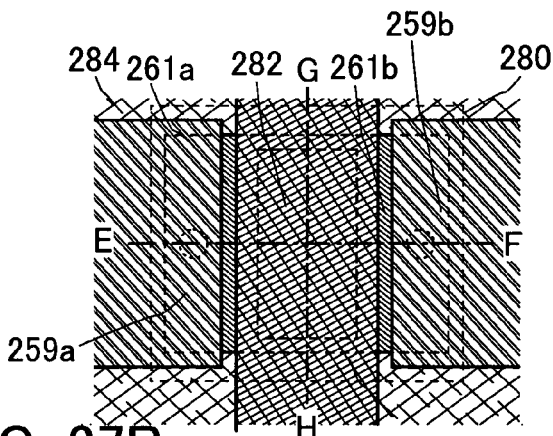
FIGS. 27A to 27C are views illustrating a top view and cross-sectional views of a semiconductor device of the present invention.
Figure 27B:
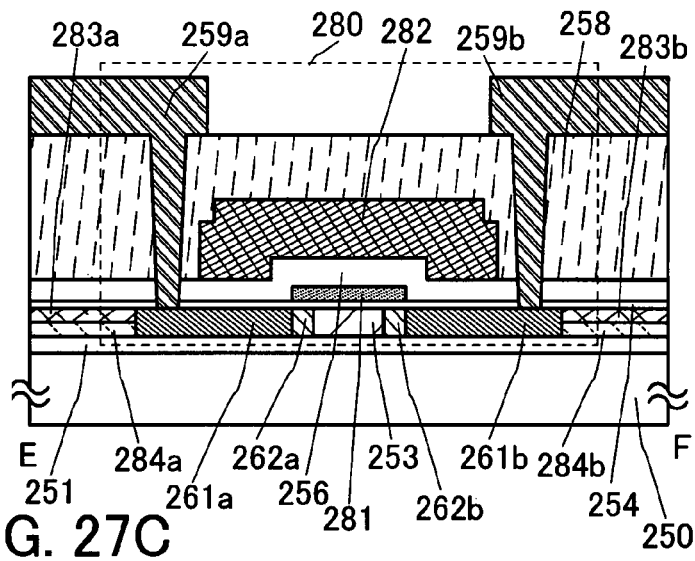
Figure 27C:
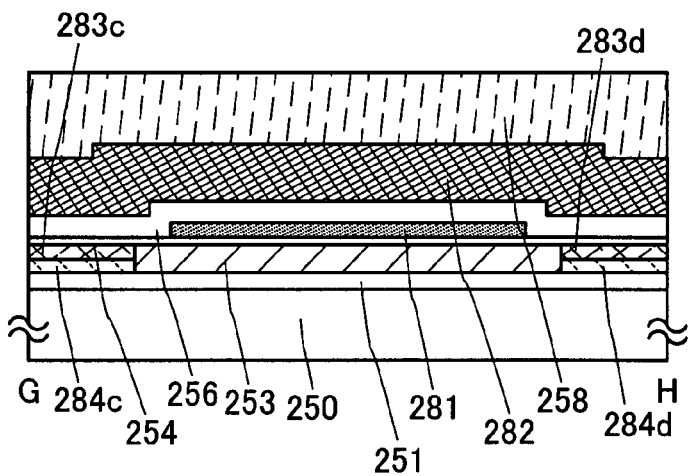

In a memory element 280 in FIGS. 27A to 27C, an element region in a semiconductor layer is wider than a charge accumulation layer 281 in the line G-H direction, and wider than a control gate electrode layer 282 in the line E-F direction. Therefore, in FIG. 27B, the edge portion of the charge accumulation layer 281 is positioned on the inner side than the edge portion of the control gate electrode layer 282 with a second insulating layer 256 interposed between the charge accumulation layer 281 and the control gate electrode layer 282. In FIG. 27C, the edge portion of a channel formation region 253 in the element region is positioned on the outer side than the edge portion of the charge accumulation layer 281 with a first insulating layer 254 interposed between the channel formation region 253 and the charge accumulation layer 281. Similarly to FIGS. 26A to 26C, the second impurity element is selectively added to an element isolation region in FIGS. 27A to 27C, and the first element isolation regions 284a and 284b and second element isolation regions 283a and 283b are formed. In FIGS. 27A to 27C, a second impurity element is selectively added to the second element isolation regions 283a and 283b, and a first impurity element is added to the first element isolation regions 284a and 284b and the second element isolation regions 283a and 283b. In such a manner, the region to which the second impurity element that imparts an opposite conductivity type to that of the source region and the drain region in the element region is added may be in the vicinity of the surface of the semiconductor layer or in the vicinity of the substrate.

In such a manner, by a combination of the sizes of the element region, the charge accumulation layer, and the control gate electrode layer, capacitance to be formed in the second insulating layer between the charge accumulation layer and the control gate electrode layer and capacitance to be formed in the first insulating layer 254 between the charge accumulation layer and the semiconductor layer can be controlled. Accordingly, a voltage value to be applied can also be controlled.

As the interlayer insulating layer 258, silicon oxide, silicon nitride, silicon oxynitride, silicon nitride oxide, or the like can be used, which may be formed in a single layer or a stacked structure of two layers, three layers, or the like. It is to be noted that, in this specification, silicon oxynitride refers to a substance in which the content of oxygen is higher than that of nitrogen, and can also be referred to as silicon oxide containing nitrogen. In the same manner, silicon nitride oxide refers to a substance in which the content of nitrogen is higher than that of oxygen, and can also be referred to as silicon nitride containing oxygen.

In addition, as another material of the interlayer insulating layer 258, a material selected from aluminum nitride, aluminum oxynitride in which the content of oxygen is higher than that of nitrogen, aluminum nitride oxide or aluminum oxide in which the content of nitrogen is higher than that of oxygen, diamond like carbon (DLC), nitrogen-containing carbon, polysilazane, and other substances containing an inorganic insulating material can be used. A material containing siloxane may also be used. Siloxane corresponds to a material containing the Si—O—Si bond. It is to be noted that siloxane is composed of a skeleton structure formed by the bond of silicon (Si) and oxygen (O). As a substituent thereof, an organic group containing at least hydrogen (for example, an alkyl group or an aryl group) is used. Alternatively, a fluoro group may also be used as the substituent. Further alternatively, a fluoro group and an organic group containing at least hydrogen may also be used as the substituent. In addition, an oxazole resin can be used, and for example, photo-curable type polybenzoxazole or the like can be used.

The interlayer insulating layer 258 can be formed by a sputtering method, a PVD (Physical Vapor Deposition) method, a low pressure CVD method (LPCVD method), or a CVD (Chemical Vapor Deposition) method such as a plasma CVD method. Alternatively, a droplet discharging method by which a pattern can be selectively formed, a printing method by which a pattern can be transferred or described (a method, such as a screen printing method or an offset printing method, by which a pattern is formed), or other methods such as a coating method such as a spin coating method, a dipping method, a dispenser method, or the like can also be used.

An etching process for processing into a desired shape may employ either plasma etching (dry etching) or wet etching. In a case of processing a large-sized substrate, plasma etching is suitable. As an etching gas, a fluorine-based gas such as $CF_4$ or $NF_3$ or a chlorine-based gas such as $Cl_2$ or $BCl_3$ is used, to which an inert gas such as He or Ar may be appropriately added. When an etching process by atmospheric pressure discharge is employed, local electric discharge can also be realized, which does not require a mask layer to be formed over an entire surface of the substrate.

The semiconductor layer is preferably formed using a single-crystalline semiconductor or a polycrystalline semiconductor. For example, the semiconductor layer can be obtained by crystallizing a semiconductor layer that is formed over an entire surface of the substrate by a sputtering method, a plasma CVD method, or a low pressure CVD method. The semiconductor material is preferably silicon, and a silicon germanium semiconductor can also be used as well. Crystallization of the semiconductor layer can be performed by a laser crystallization method, a thermal crystallization method using rapid thermal annealing (RTA) or an annealing furnace, a crystallization method using a metal element that promotes the crystallization, or a method combining them.

A p-type impurity may be injected into the semiconductor layer. As the p-type impurity, for example, boron may be used and added at a concentration of approximately from $5\times10^{15}$ atoms/cm$^3$ to $1\times10^{16}$ atoms/cm$^3$. The impurity is added to control the threshold voltage of the semiconductor element, and the impurity effectively operates when it is added to the channel formation region 253.

The first insulating layer 254 may be formed using silicon oxide or a stacked structure of silicon oxide and silicon nitride. The first insulating layer 254 may be formed by deposition of an insulating layer by a plasma CVD method or a low pressure CVD method; however, it is preferably formed by solid-phase oxidation or solid-phase nitridation using plasma treatment. This is because the insulating layer formed by oxidization or nitridation of a semiconductor layer (typically, a silicon layer) by plasma treatment is dense and has high dielectric strength voltage and high reliability. Since the first insulating layer 254 is used as a tunnel insulating layer for injecting charges into the charge accumulation layers 271, 281, and 291, it is preferable that the insulating layer is dense and has high dielectric strength voltage and high reliability. This first insulating layer 254 is preferably formed at a thickness of from 1 to 20 nm, preferably from 3 to 6 nm. For example, when the gate length is 600 nm, the first insulating layer 254 can be formed at a thickness of from 3 to 6 nm.

Plasma used for solid-phase oxidation treatment or solid-phase nitridation treatment by plasma treatment is preferable under the following conditions: excited by microwave (typically, 2.45 GHz) at an electron density of greater than or equal to $1\times10^{11}$ cm$^{-3}$ and less than or equal to $1\times10^{13}$ cm$^{-3}$ and at an electron temperature of greater than or equal to 0.5 eV and less than or equal to 1.5 eV. The conditions are preferred to form a dense insulating layer at a practical reaction rate solid-phase oxidation treatment or solid-phase nitridation treatment at 500° C. or less.

The oxidation of the surface of the semiconductor layer by this plasma treatment is performed under an oxygen atmosphere (e.g., under an atmosphere containing oxygen ($O_2$) or dinitrogen monoxide ($N_2O$), and a rare gas (containing at least one of He, Ne, Ar, Kr, and Xe), or under an atmosphere containing oxygen or dinitrogen monoxide, hydrogen ($H_2$), and a rare gas). The nitridation of the surface of the semiconductor layer by this plasma treatment is performed under a nitrogen atmosphere (e.g., under an atmosphere containing nitrogen ($N_2$) and a rare gas (containing at least one of He, Ne, Ar, Kr, and Xe), under an atmosphere containing nitrogen, hydrogen, and a rare gas, or under an atmosphere containing $NH_3$ and a rare gas). As the rare gas, Ar can be used for example. Further, a gas in which Ar and Kr are mixed may also be used. The plasma treatment includes oxidation treatment, nitridation treatment, oxynitridation treatment, hydrogenation treatment, and surface modification treatment performed on a semiconductor layer, an insulating layer, and a conductive layer. By excitation of plasma with microwave introduction, plasma with a low electron temperature (less than or equal to 3 eV, preferably less than or equal to 1.5 eV) and high electron density (greater than or equal to $1\times10^{11}$ cm$^{-3}$) can be produced. With oxygen radicals (which may include OH radicals) and/or nitrogen radicals (which may include NH radicals) generated by this high-density plasma, the surface of the semiconductor layer can be oxidized and/or nitrided. By mixture of a rare gas such as argon into the plasma treatment gas, oxygen radicals or nitrogen radicals can be effectively generated by excited species of the rare gas.

In FIGS. 2A to 2C, as a preferable example of the first insulating layer 254 formed by plasma treatment, the following steps are conducted: forming a silicon oxide layer at a thickness of 3 to 6 nm over the semiconductor layer by plasma treatment under an oxygen atmosphere, and forming a nitrogen plasma-treated layer over the surface of the silicon oxide layer by plasma treatment under a nitrogen atmosphere. Specifically, the silicon oxide layer is formed at a thickness of 3 to 6 nm over the semiconductor layer by plasma treatment under an oxygen atmosphere. Subsequently, by conduction of plasma treatment under a nitrogen atmosphere, the nitrogen plasma-treated layer containing a high concentration of nitrogen is provided over the surface of the silicon oxide layer or in the vicinity of the surface. It is to be noted that the vicinity of the surface indicates a depth of approximately 0.5 to 1.5 nm from the surface of the silicon oxide layer. For example, by plasma treatment under a nitrogen atmosphere, a structure is obtained in which the silicon oxide layer contains 20 to 50 atomic % nitrogen to a depth of about 1 nm from the surface.

When a silicon layer is used as a typical example of the semiconductor layer, the surface of the silicon layer is oxidized by plasma treatment, so that a dense oxide layer without distortion at the interface can be formed. Furthermore, by nitridation of the surface of the oxide layer by plasma treatment so that oxygen in the superficial layer portion is replaced with nitrogen to form a nitride layer, the density of the insulating layer can be further improved. Consequently, an insulating layer which is high in dielectric strength voltage can be formed.

In any case, by solid-phase oxidation treatment or solid-phase nitridation treatment by plasma treatment described above, an insulating layer that is similar to a thermal oxide film formed at a temperature of 950 to 1050° C. can be obtained even when a glass substrate having a heat resistant temperature of less than or equal to 700° C. is used. That is, a highly reliable tunnel insulating layer can be formed as a tunnel insulating layer of a nonvolatile memory element.

Each of the charge accumulation layers 271, 281, and 291 is formed over the first insulating layer 254. These charge accumulation layers 271, 281, and 291 may be provided in a single layer or a stack of a plurality of layers.

The charge accumulation layers 271, 281, and 291 can be formed using, typically, silicon, a silicon compound, germanium, or a germanium compound as a semiconductor material forming the charge accumulation layers 271, 281, and 291. As a silicon compound, silicon nitride, silicon nitride oxide, silicon carbide, silicon germanium containing germanium at a concentration of greater than or equal to 10 atomic %, metal nitride, metal oxide, or the like can be used. Silicon germanium is a typical example of a germanium compound, and in this case, it is preferable that germanium be contained at a concentration of greater than or equal to 10 atomic % with respect to silicon.

The charge accumulation layer serving as a floating gate is applied to a nonvolatile semiconductor storage device according to the present invention for charge accumulation. However, other materials can be applied as long as the similar function is provided. For example, a ternary system semiconductor including germanium may be used. In addition, the semiconductor material may be hydrogenated. Further, as a layer having a function as a charge accumulation layer of a nonvolatile memory element, the charge accumulation layer can be replaced with an oxide or a nitride of the germanium or a germanium compound.

Further, metal nitride or metal oxide can be used as a material forming the charge accumulation layers 271, 281, and 291. As metal nitride, tantalum nitride, tungsten nitride, molybdenum nitride, titanium nitride, or the like can be used. As metal oxide, tantalum oxide, titanium oxide, tin oxide, or the like can be used.

Further, the charge accumulation layers 271, 281, and 291 may be formed using a stacked structure of the material as described above. When a layer of silicon or a silicon compound, or metal nitride or metal oxide as described above is provided on the upper layer side of the layer formed using germanium or a germanium compound, the layer can be used as a barrier layer for water resistance or chemical resistance in the manufacturing process. Therefore, the substrate can be easily handled in a photolithography step, an etching step, or a cleaning step, whereby productivity can be improved. In other words, the charge accumulation layer can be easily processed.

The second insulating layer 256 is formed using a single layer or a plurality of layers of silicon oxide, silicon oxynitride ($SiO_xN_y$ (x>y>0)), silicon nitride ($SiN_x$), silicon nitride oxide ($SiN_xO_y$ (x>y>0)), and the like by a low pressure CVD method, a plasma CVD method, or the like. Alternatively, the second insulating layer 256 may be formed using aluminum oxide (AlOx), hafnium oxide (HfOx), or tantalum oxide (TaOx). The second insulating layer 256 is formed at a thickness of from 1 to 20 nm, preferably from 5 to 10 nm. For example, a silicon nitride layer is deposited at a thickness of 3 nm, and a silicon oxide layer is deposited thereover at a thickness of 5 nm, to be used. Further, nitride films may also be formed by plasma treatment being performed on surfaces of the charge accumulation layers 271, 281, and 291 to perform nitridation treatment on the surfaces of the the charge accumulation layers 271, 281, and 291 (e.g., silicon nitride in the case where silicon is used for the charge accumulation layers 271, 281, and 291). In any case, one or both of a side of the first insulating layer 254 and a side of the second insulating layer 256, which are in contact with the charge accumulation layers 271, 281, and 291, are nitride films; thus, the charge accumulation layers 271, 281, and 291 can be prevented from being oxidized.

The control gate electrode layers 272, 282, and 292 are preferably formed using a metal selected from tantalum (Ta), tungsten (W), titanium (Ti), molybdenum (Mo), chromium (Cr), niobium (Nb), and the like, or an alloy material or a compound material containing the metal as its main component. Alternatively, polycrystalline silicon to which an impurity element such as phosphorus is added can be used. Further alternatively, a staked structure of one layer or a plurality of layers of a metal nitride layer and a metal layer described above may also be formed as the control gate electrode layers 272, 282, and 292. As the metal nitride, tungsten nitride, molybdenum nitride, or titanium nitride can be used. By the metal nitride layer being provided, adhesion to the second insulating layer 256 can be improved, and the control gate electrode layers 272, 282, and 292 can be prevented from being peeled from the second insulating layer 256. When metal nitride such as tantalum nitride having a high work function is used for the control gate electrode layers 272, 282, and 292, the first insulating layer 254 can be formed to be thick by the synergistic effect with the second insulating layer 256.

The wiring layers 259a and 259b can be formed from a material selected from indium tin oxide (ITO), indium zinc oxide (IZO) in which zinc oxide (ZnO) is mixed with indium oxide, a conductive material in which silicon oxide ($SiO_2$) is mixed with indium oxide, organoindium, organotin, indium oxide containing tungsten oxide, indium zinc oxide containing tungsten oxide, indium oxide containing titanium oxide, or indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of such metals; or metal nitride thereof.

There are the following methods for injecting electrons into the charge accumulation layer: a method utilizing hot electrons and a method utilizing F-N tunneling current. In the case of utilizing hot electrons, a positive voltage is applied to the control gate electrode layer and a high voltage is applied to a drain to generate hot electrons. Thus, the hot electrons can be injected into the charge accumulation layer. In the case of utilizing F-N tunneling current, a positive voltage is applied to the control gate electrode layer so that electrons are injected into the charge accumulation layer from the semiconductor layer by using F-N tunneling current.

Figure 12:
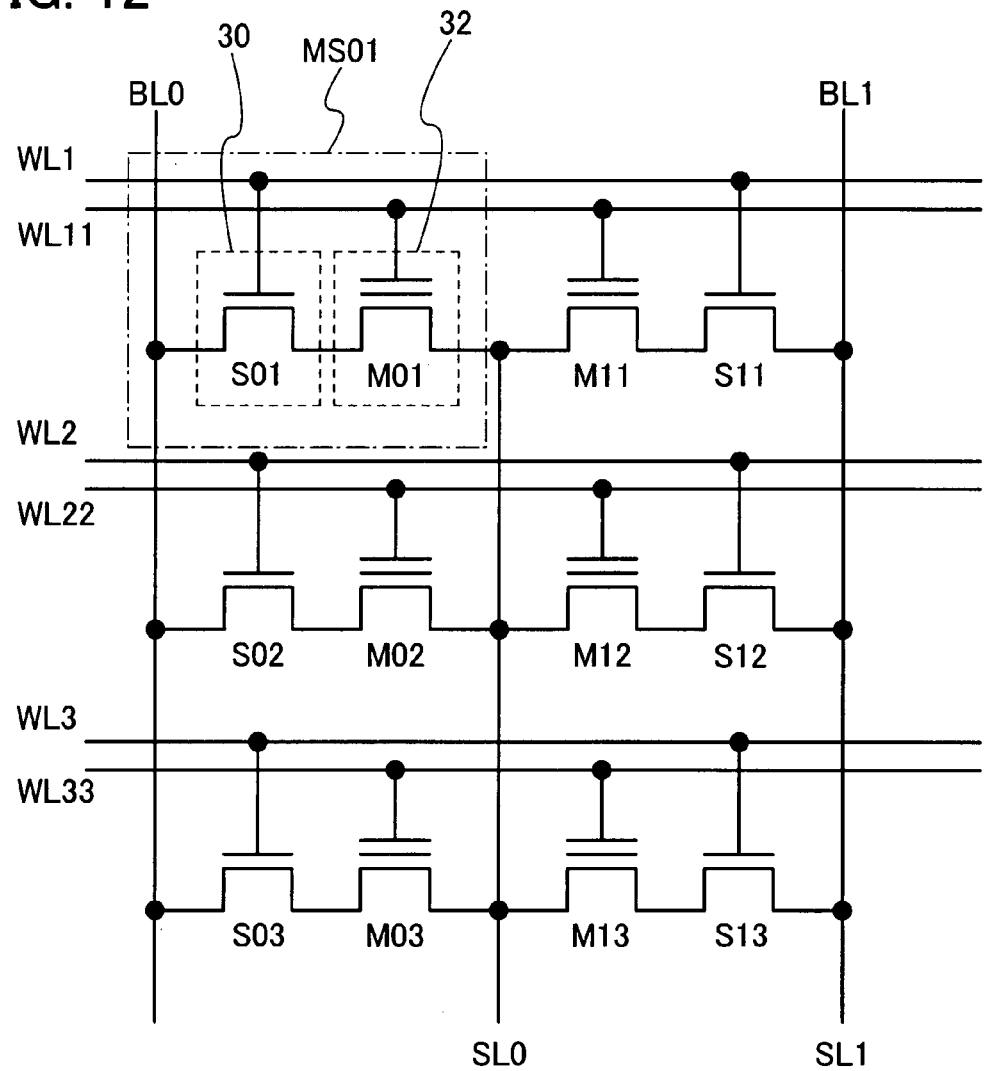
FIG. 12 is a diagram showing an example of an equivalent circuit of a semiconductor device.

As examples of a semiconductor device using the present invention, various modes of nonvolatile semiconductor storages having nonvolatile memory elements can be given. FIG. 12 shows an exemplary equivalent circuit of a nonvolatile memory cell array. A memory cell MS01 which stores data of 1 bit includes a selection transistor S01 and a nonvolatile memory element M01. The selection transistor S01 is connected in series between a bit line BL0 and the nonvolatile memory element M01, and a gate of the selection transistor S01 is connected to a word line WL1. A gate of the nonvolatile memory element M01 is connected to a word line WL11. When writing data into the nonvolatile memory element M01, the word line WL1 and the bit line BL0 are set at H level, a bit line BL1 is set at L level, and a high voltage is applied to the word line WL11, so that charges are accumulated in the charge accumulation layer as described above. When deleting data, the word line WL1 and the bit line BL0 may be set at H level, and a high voltage of negative polarity may be applied to the word line WL11.

In this memory cell MS01, when the selection transistor S01 and the nonvolatile memory element M01 are formed using element regions 30 and 32 respectively which are formed by isolating a semiconductor layer formed continuously over an insulating surface by providing element isolation regions to which an impurity element is added, it is possible to prevent mutual interference with other selection transistors or nonvolatile memory elements. In addition, since both of the selection transistor S01 and the nonvolatile memory element M01 included in the memory cell MS01 are n-channel transistors, when the two elements are formed using one element region, a wiring for connecting the two elements can be omitted.

Figure 13:
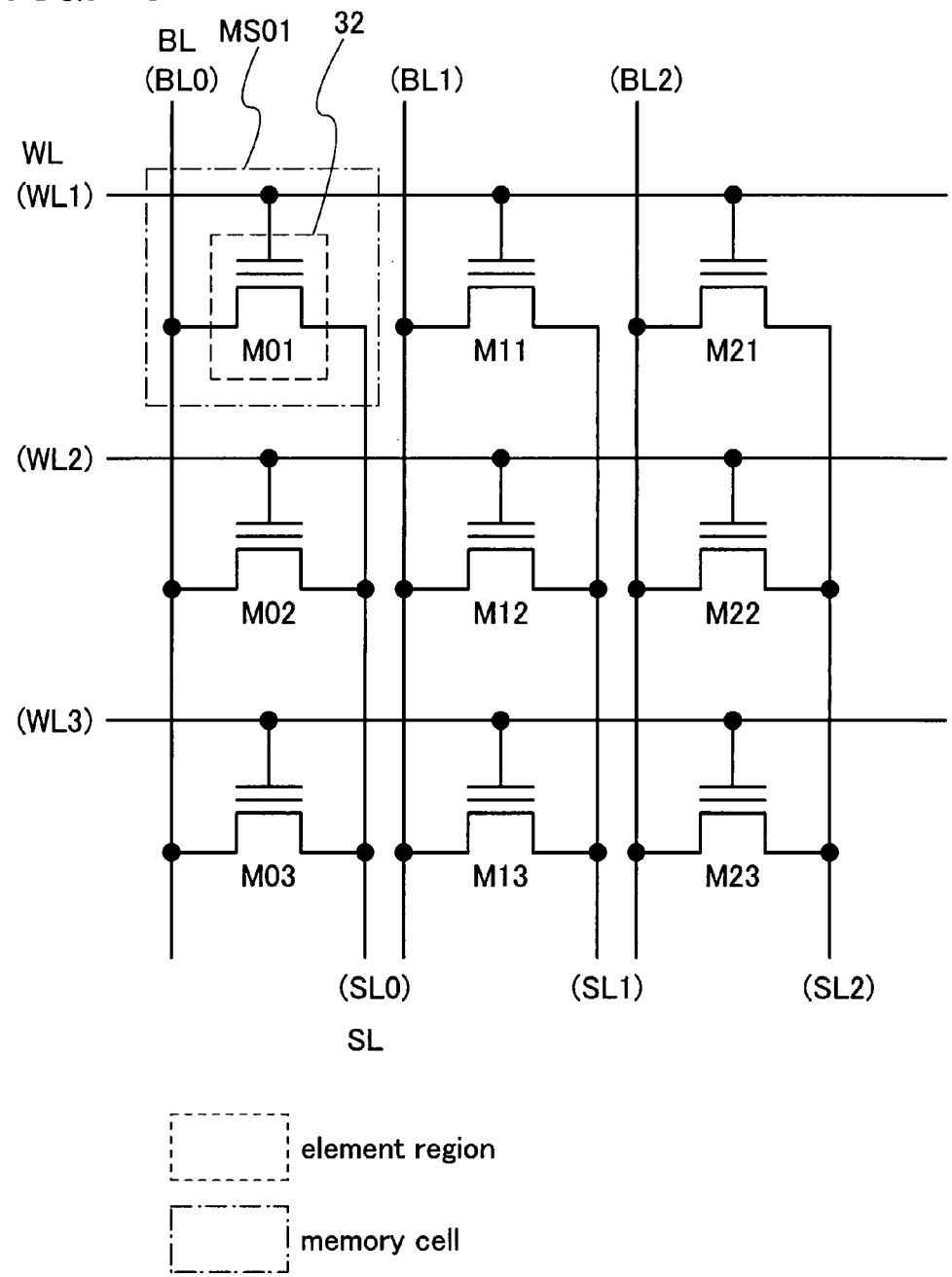
FIG. 13 is a diagram showing an example of an equivalent circuit of a semiconductor device.

FIG. 13 shows an equivalent circuit of a NOR-type memory cell array in which nonvolatile memory elements are connected to a bit line. In this memory cell array, word lines WL and bit lines BL are disposed to intersect each other, and a nonvolatile memory element is disposed at each intersection portion. In the NOR-type memory cell array, drains of the individual nonvolatile memory elements are connected to the bit line BL, and sources of the nonvolatile memory elements are commonly connected to the source line SL.

In this case also, when the nonvolatile memory element M01 in the memory cell MS01 is formed using an element region 32 which is formed by isolating a semiconductor layer formed continuously over an insulating surface by providing element isolation regions to which an impurity element is added, it is possible to prevent mutual interference with other nonvolatile memory elements without dividing the semiconductor layer into a plurality of island-shaped semiconductor layers. Further, when a plurality of nonvolatile memory elements (e.g., M01 to M23 shown in FIG. 13) is regarded as one block, and the nonvolatile memory elements in one block are formed using element regions which are formed by isolating a semiconductor layer formed continuously over an insulating surface by providing element isolation regions to which an impurity element is added, a deletion operation can be conduced per block.

The operation of the NOR-type memory cell array is as follows. In data writing, the source line SL is set at 0 V, a high voltage is applied to the word line WL which is selected to write data, and a potential corresponding to the data of "0" or "1" is applied to the bit line BL. For example, an H-level potential corresponding to "0" or an L-level potential corresponding to "1" is applied to the bit line BL. In the nonvolatile memory element which has received an H-level potential to be written the data of "0", hot electrons are generated in the vicinity of the drain and then injected into the charge accumulation layer. In writing the data of "1", such electron injection does not occur.

In the memory cell which has received the data of "0", hot electrons, which are generated in the vicinity of the drain due to a strong transverse electric field between the drain and the source, are injected into the charge accumulation layer. The consequent state in which the threshold voltage is increased with the electrons injected into the charge accumulation layer corresponds to "0". When writing the data of "1", hot electrons are not generated and a state that the threshold voltage remains low without electrons injected into the charge accumulation layer, i.e., a deleted state is retained.

When deleting data, a positive voltage of about 10 V is applied to the source line SL, and the bit line BL is set in a floating state. Then, by applying a high voltage of negative polarity to the word line WL (applying a high voltage of negative polarity to the control gate), electrons are extracted from the charge accumulation layer. Accordingly, a deleted state with the data of "1" results.

The data reading is conducted through the steps of: setting the source line SL at 0 V, setting the bit line BL at about 0.8 V, applying a reading voltage which is set at an intermediate value between the threshold voltages of the data "0" and "1" to the selected word line WL, and judging the presence of a current drawn into the nonvolatile memory element, using a sense amplifier which is connected to the bit line BL.

Figure 14:
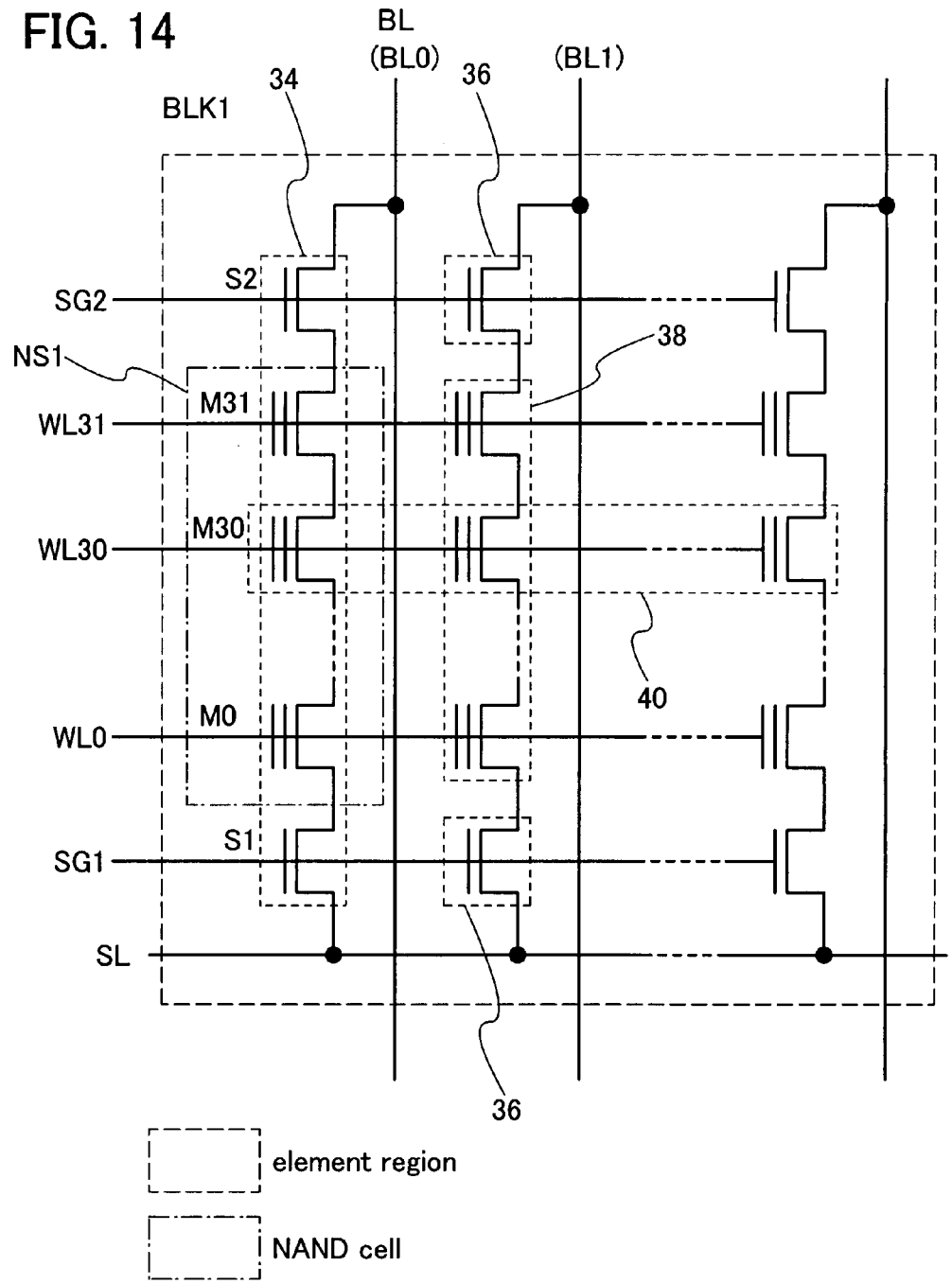
FIG. 14 is a diagram showing an example of an equivalent circuit of a semiconductor device.

FIG. 14 shows an equivalent circuit of a NAND-type memory cell array. A bit line BL is connected to a NAND-type cell NS1 which has a plurality of nonvolatile memory elements connected in series. A plurality of NAND-type cells forms one block BLK. A block BLK1 shown in FIG. 14 has 32 word lines (word lines WL0 to WL31). Nonvolatile memory elements positioned in the same row as the block BLK1 are commonly connected to the word lines of the corresponding row.

In this case, since selection transistors S1 and S2 and nonvolatile memory elements M0 to M31 are connected in series, these elements may be formed together by using one semiconductor layer 34. Accordingly, a wiring for connecting the nonvolatile memory elements can be omitted, and the degree of integration can be increased. Further, isolation of the adjacent NAND-type cells can be conducted easily. It is also possible to separately form a semiconductor layer 36 of the selection transistors S1 and S2 and a semiconductor layer 38 of the NAND-type cell. When conducting a deletion operation by which charges are extracted from the charge accumulation layers of the nonvolatile memory elements M0 to M31, the deletion operation can be conducted per NAND-type cell. In addition, it is also possible to form the nonvolatile memory elements which are commonly connected to one word line (e.g., in the row of M30) by using one semiconductor layer 40.

The writing operation is conducted after setting the NAND-type cell NS1 to a deleted state, i.e., the state in which the threshold voltage of each nonvolatile memory element in the NAND-type cell NS1 is set at a negative value. Writing is conducted sequentially starting from the nonvolatile memory element M0 on the source line SL side. Data writing into the nonvolatile memory element M0 is exemplarily described below.

Figure 24A:
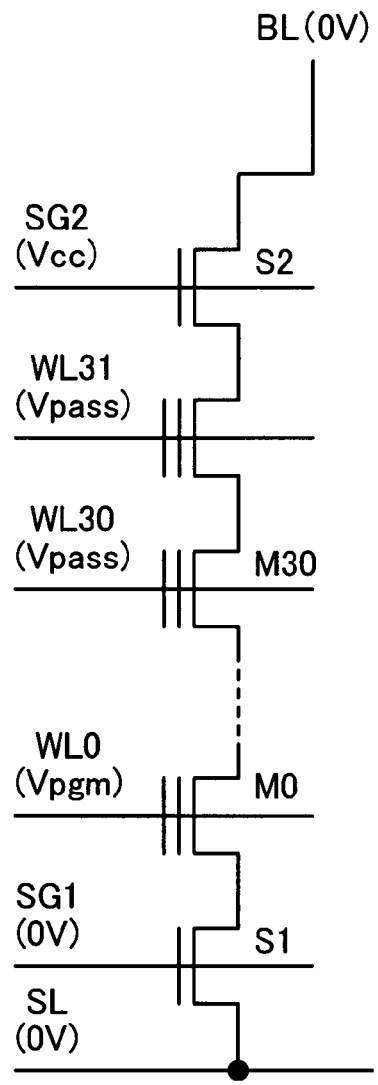
FIGS. 24A and 24B are diagrams illustrating a writing operation of a semiconductor device.

FIG. 24A shows the case of writing "0". The selection transistor S2 is turned on by applying, for example, Vcc (the power supply voltage) to a selection gate line SG2, and the bit line BL is set at 0 V (the ground voltage). The selection transistor S1 is turned off by setting a selection gate line SG1 at 0 V. Next, a word line WL0 connected to the nonvolatile memory element M0 is set at a high voltage of Vpgm (about 20 V), and the other word lines are set at an intermediate voltage of Vpass (about 10 V). Since the voltage of the bit line BL is 0 V, the potential of the channel formation region of the selected nonvolatile memory element M0 is also 0 V. Thus, there is a big potential difference between the word line WL0 and the channel formation region of the nonvolatile memory element M0, and therefore, electrons are injected into the charge accumulation layer of the nonvolatile memory element M0 due to F-N tunnel current as described above. Accordingly, the threshold voltage of the nonvolatile memory element M0 has a positive value (the state in which "0" is written).

Figure 24B:
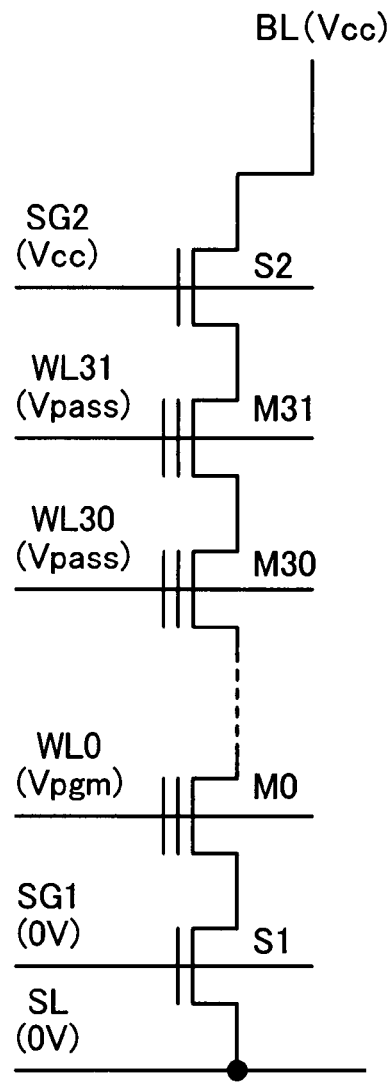

On the other hand, in the case of writing "1", the bit line BL is set at, for example, Vcc (the power supply voltage) as shown in FIG. 24B. Since the selection gate line SG2 has a voltage of Vcc, the selection transistor S2 is turned off when the gate voltage thereof is at Vth (the threshold voltage of the selection transistor S2)>Vcc. Therefore, the channel formation region of the nonvolatile memory element M0 is brought into a floating state. Next, when a high voltage of Vpgm (20 V) is applied to the word line WL0 and an intermediate voltage of Vpass (10 V) is applied to the other word lines, the voltage of the channel formation region of the nonvolatile memory element M0 increases from Vcc-Vth to, for example, about 8 V by the capacitive coupling of each word line and the channel formation region. Although the voltage of the channel formation region is increased, there is a small potential difference between the word line WL0 and the channel formation region of the nonvolatile memory element M0 unlike the case of writing "0". Therefore, electron injection into the charge accumulation layer of the nonvolatile memory element M0 due to F-N tunnel current does not occur. Thus, the threshold voltage of the nonvolatile memory element M01 is kept at a negative value (the state in which "1" is written).

Figure 25A:
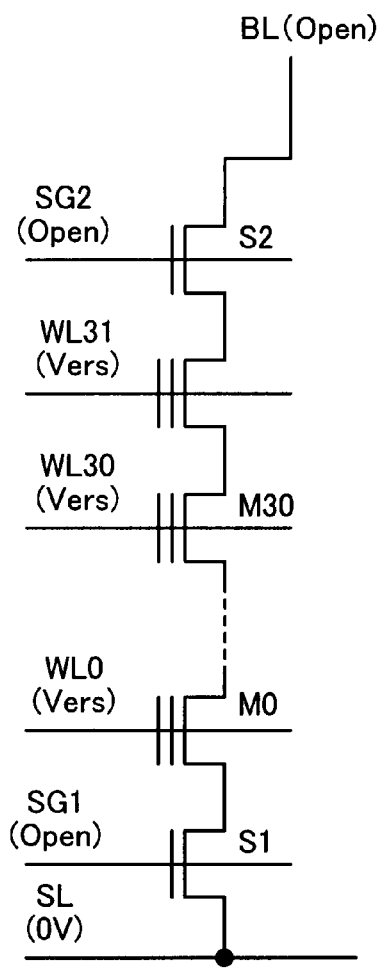
FIGS. 25A and 25B are diagrams illustrating an erasing operation and a reading operation of a semiconductor device.

In the case of conducting a deletion operation, as shown in FIG. 25A, a high voltage of negative polarity (Vers) is applied to a selected word line (WL0), a voltage Von (for example, 3 V) is applied to the word lines WL of the non-selected nonvolatile memory elements, the selection gate line SG1, and the selection gate line SG2, and an open-voltage Vopen (0V) is applied to the bit line BL and the source line SL. Then, electrons in the charge accumulation layer of the selected nonvolatile memory element can be released as described in the above embodiment mode. As a result, the threshold voltage of the selected nonvolatile memory element shifts in the negative direction.

Figure 25B:
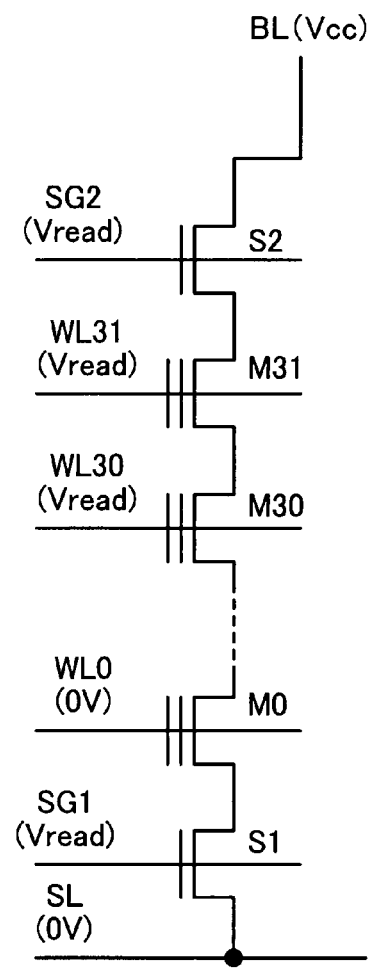

In the reading operation shown in FIG. 25B, the word line WL0 connected to the nonvolatile memory element M0 which is selected to read out data is set at a voltage of Vr (e.g., 0 V), while the word lines WL1 to WL31 connected to the non-selected nonvolatile memory elements and the selection gate lines SG1 and SG2 are set at an intermediate voltage of Vread which is a little higher than the power supply voltage. That is, as shown in FIG. 13, the nonvolatile memory elements other than the selected nonvolatile memory element serve as transfer transistors. Accordingly, it is detected whether a current is flowing into the nonvolatile memory element M0 which is selected to read out data. That is, when data stored in the nonvolatile memory element M0 is "0", the nonvolatile memory element M0 is off; therefore, the bit line BL is not discharged. On the other hand, when data stored in the nonvolatile memory element M0 is "1", the nonvolatile memory element M0 is on; therefore, the bit line BL is discharged.

FIG. 19 shows an example of a circuit block diagram of a nonvolatile semiconductor storage device. In the nonvolatile semiconductor storage device, a memory cell array 52 and a peripheral circuit 54 are formed over the same substrate. The memory cell array 52 has the configuration shown in FIG. 12, 13, or 14. The peripheral circuit 54 has the following configuration.

A row decoder 62 for selecting word lines and a column decoder 64 for selecting bit lines are provided around the memory cell array 52. An address is transmitted to a control circuit 58 through an address buffer 56, and an internal row address signal and an internal column address signal are transmitted to the row decoder 62 and the column decoder 64 respectively.

In order to write or delete data, a potential obtained by boosting the power supply potential is used. Therefore, a booster circuit 60 which is controlled by the control circuit 58 according to the operation mode is provided. The output of the booster circuit 60 is supplied to word lines WL and bit lines BL through the row decoder 62 and the column decoder 64 respectively. Data output from the column decoder 64 is input to a sense amplifier 66. Data read out by the sense amplifier 66 is held in a data buffer 68, and the data is randomly accessed by the control of the control circuit 58. Then, the accessed data is output through a data input/output buffer 70. Meanwhile, data to be written is, after being input through the data input/output buffer 70, once held in the data buffer 68, and then transferred to the column decoder 64 by the control of the control circuit 58.

In this manner, in the nonvolatile semiconductor storage device, the memory cell array 52 is required to use a potential which is different from the power supply potential. Therefore, it is desirable that at least the memory cell array 52 and the peripheral circuit 54 be electrically insulated and isolated from each other.

Therefore, with the use of the present invention, a semiconductor layer can be isolated into a plurality of element regions without being divided into island shapes. Steps resulting from the edge portion of the semiconductor layer are not generated, and thus an insulating layer is formed over a flat semiconductor layer, leading to improvement in coverage of the semiconductor layer with the insulating layer. Therefore, a semiconductor device that is a highly reliable nonvolatile semiconductor storage device in which defects such as a short and leakage current between a charge accumulation layer, a control gate electrode layer, and a semiconductor layer that are caused by a coverage defect of the semiconductor layer with an insulating layer can be prevented and a manufacturing method of such a semiconductor device can be provided. Accordingly, further miniaturization and higher integration of the semiconductor device are possible, and higher performance of the semiconductor device can be achieved. In addition, because defects such as shape defects of the film can be reduced, in the manufacturing process, the semiconductor device can be manufactured with good yield.

Embodiment Mode 3

Figure 15:
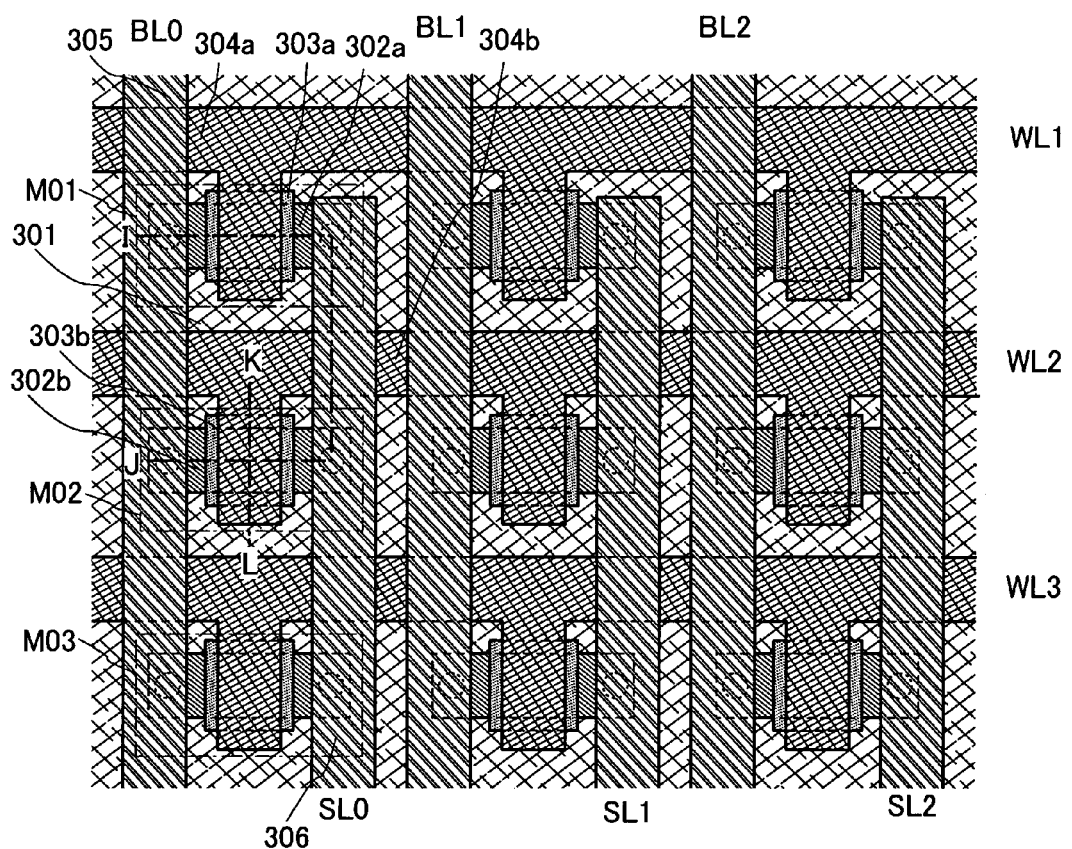
FIG. 15 is a view illustrating a top view of a semiconductor device of the present invention.

In this embodiment mode, an example of a highly reliable semiconductor device having a memory element (also referred to as a storage element) in which defects such as a short and leakage current between a gate electrode layer and a semiconductor layer that are caused by a coverage defect of a semiconductor layer with an insulating layer in a semiconductor element are prevented, will be described with reference to drawings. FIG. 15 is a top view of a semiconductor device of this embodiment mode, FIG. 16A is a cross-sectional view taken along a line I-J in FIG. 15, and FIG. 16B is a cross-sectional view taken along a line K-L in FIG. 15.

FIG. 15 shows an equivalent circuit of a NOR-type memory cell array in which a nonvolatile memory element M (M01, M02, or M03) is connected to a bit line BL (BL0, BL1, or BL2). In this memory cell array, word lines WL (WL1, WL2, and WL3) and bit lines BL (BL0, BL1, and BL2) are provided to intersect each other, and at each intersection, one of the nonvolatile memory elements M (M01, M02, or M03) is disposed. In a NOR-type memory cell array, a drain of each nonvolatile memory element M (M01, M02, or M03) is connected to one of the bit lines BL (BL0, BL1, or BL2). Sources of the nonvolatile memory elements are commonly connected to source lines SL (SL0, SL1, and SL2).

Figure 16A:
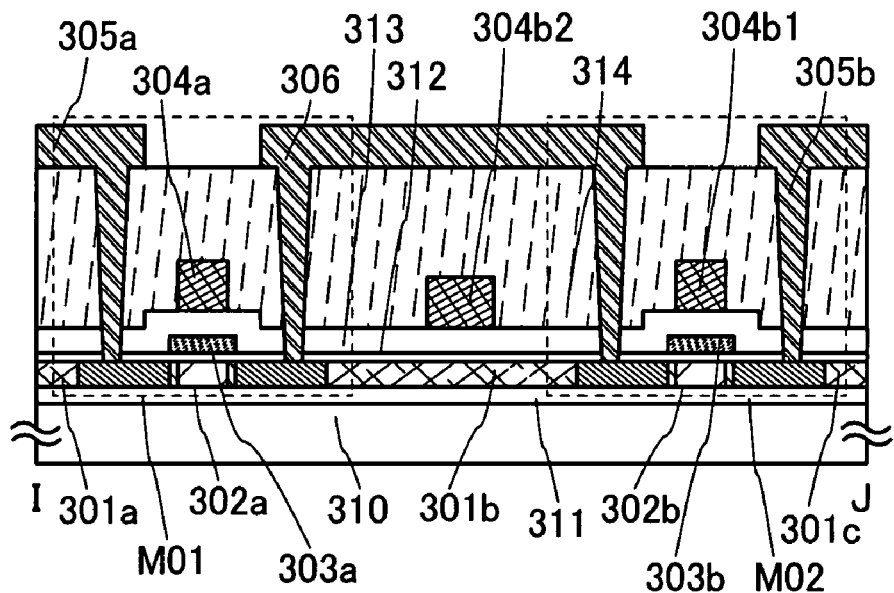
FIGS. 16A and 16B are views illustrating cross-sectional views of a semiconductor device of the present invention.
Figure 16B:
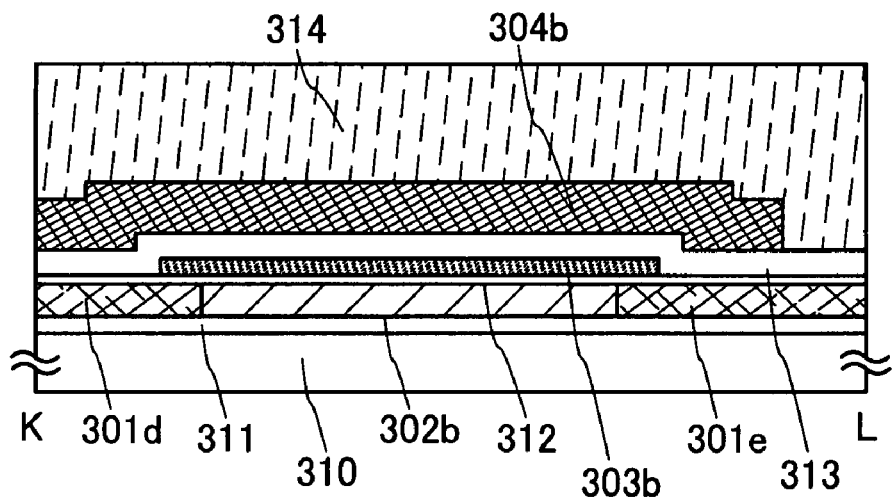

In FIG. 15 and FIGS. 16A and 16B, drains of the memory elements M01, M02, and M03 are connected to the bit line BL 305 (305a and 305b), and sources thereof are connected to the source line SL 306. The memory element M01 includes an element region 302a, a charge accumulation layer 303a, and a control gate electrode layer 304a. The memory element M02 includes an element region 302b, a charge accumulation layer 303b, and a control gate electrode layer 304b. A first insulating layer 312, a second insulating layer 313, and an interlayer insulating layer 314 are formed contiguous with the memory elements M01 and M02. The element region 302a and the element region 302b each have a channel formation region and a high-concentration n-type impurity region and a low-concentration impurity region serving as a source and a drain.

In the semiconductor layer, the element region 302a included in the memory element M01 and the element region 302b included in the memory element M02 are electrically isolated from each other by an element isolation region 301 (301a, 301b, 301c, 301d, and 301e).

The element isolation region is formed by selective addition of a first impurity element that does not contribute to conductivity and a second impurity element that imparts an opposite conductivity type to that of a source region and a drain region in the element region in order to electrically isolate elements from each other in one semiconductor layer.

As the first impurity element that does not contribute to conductivity, an impurity element of at least one or more kinds of oxygen, nitrogen, and carbon can be used. The element isolation region to which the first impurity element is added, conductivity is lowered by mixture of the first impurity element that does not contribute to conductivity, and resistance of the element isolation region is increased because its crystallinity is lowered by a physical impact (it can also be referred to as a so-called sputtering effect) on the semiconductor layer at adding. In the element isolation region with the increased resistance, electron field-effect mobility is also lowered, and accordingly, elements can be electrically isolated from each other. On the other hand, in a region to which an impurity element is not added, electron field-effect mobility that is high enough to be able to serve as an element is kept, and accordingly, the region can be used as an element region.

The element region has a source region, a drain region, and a channel formation region. The source region and the drain region are impurity regions having one conductivity type (for example, n-type impurity regions or p-type impurity regions). An impurity element that imparts an opposite conductivity type to that of the source region and the drain region in the element region is added to the element isolation region, whereby the element isolation region is made to be an impurity region having an opposite conductivity type to that of the source region and the drain region in the element region that is adjacent to the element isolation region. That is, in a case where the source region and the drain region in the element region are n-type impurity regions, the adjacent element isolation region may be formed as a p-type impurity region. Similarly, in a case where the source region and the drain region in the element region are p-type impurity regions, the adjacent element isolation region may be formed as an n-type impurity region. The element region and the element isolation region that are adjacent to each other form a PN junction. Accordingly, the element regions can be further insulated and isolated from each other by the element isolation region provided between the element regions.

One feature of the present invention is that one semiconductor layer is isolated into a plurality of element regions in the manner that resistance of the element isolation region by which the element regions are insulated and isolated from each other is increased by addition of the first impurity element that does not contribute to conductivity, and further, a PN junction is formed in a position where the element region and the element isolation region are in contact with each other by addition of the second impurity element that imparts an opposite conductivity type to that of the source region and the drain region in the element region. By the present invention, the element regions can be isolated from each other by an effect caused by each of the first impurity element and the second impurity element. Thus, a higher effect of insulation and isolation of the element can be obtained.

FIG. 15 and FIGS. 16A and 16B show a case where a plurality of memory elements is formed. Because the element isolation region 301 (301a, 301b, 301c, 301d, and 301e) is provided to be in contact with the element regions 302a and 302b having the n-type impurity regions, the element isolation region 301 may be formed as a p-type impurity region by addition of an impurity element that imparts p-type conductivity (for example, boron (B), aluminum (Al), gallium (Ga), or the like) as a second impurity element that imparts an opposite conductivity type to that of the source region and the drain region in the element region. As a result, the n-type impurity region and the p-type impurity region are alternately adjacent to each other, whereby impurity regions having the same conductivity can be insulated and isolated from each other.

The addition (introduction) of the first impurity element and the second impurity element in forming the element isolation region can be performed by an ion implantation method, an (ion) doping method, or the like.

The resistivity of the element isolation region is preferably greater than or equal to $1 \times 10^{10}$ Ω·cm, and the concentration of the first impurity element such as oxygen, nitrogen, or carbon is preferably greater than or equal to $1 \times 10^{20}$ Ω·cm$^{-3}$ and less than $4 \times 10^{22}$ Ω·cm$^{-3}$.

Crystallinity of the element isolation region is lowered by addition of the impurity element; therefore, it can be said that the element isolation region is made to be amorphous. On the other hand, because the element region is a crystalline semiconductor layer, in a case where a semiconductor element is formed in the element region, crystallinity of the channel formation region is higher than that of the element isolation region, and high electron field-effect mobility can be obtained as a semiconductor element.

As the impurity element added to the element isolation region, a rare gas element such as argon (Ar), neon (Ne), krypton (Kr), or xenon (Xe) may be used. By further addition of such a rare gas element that is an element having comparatively high mass as well as oxygen, nitrogen, and carbon, a physical impact on the semiconductor layer can be increased, whereby crystallinity of the element isolation region can be lowered more effectively.

In FIG. 16B, the charge accumulation layer 303b is formed to extend over the element region 302b and the element isolation regions 301d and 301e in the semiconductor layer, with the first insulating layer 312 interposed between the charge accumulation layer 303b and the semiconductor layer. In the present invention, the element isolation region and the element region are provided in the continuous semiconductor layer; therefore, the element isolation regions 301d and 301e and the element region 302b are contiguous. Thus, the surface thereof has high flatness and no steep step.

The first insulating layer 312 is formed over the highly flat semiconductor layer; therefore, coverage is good and shape defects are not easily generated. Accordingly, defects such as leakage current and a short can be prevented between the charge accumulation layers 303a and 303b formed over the first insulating layer 312 and the element region 302a and 302b, respectively. Thus, a semiconductor device that is a nonvolatile semiconductor storage device of this embodiment mode can be a highly reliable semiconductor device in which defects such as a short and leakage current between the charge accumulation layer and the semiconductor layer that are caused by a coverage defect of the semiconductor layer with the first insulating layer are prevented.

This embodiment mode can be implemented by being combined with other embodiment modes shown in this specification.

Therefore, with the use of the present invention, a semiconductor layer can be isolated into a plurality of element regions without being divided into island shapes. Steps resulting from the edge portion of the semiconductor layer are not generated, and thus an insulating layer is formed over a flat semiconductor layer, leading to improvement in coverage of the semiconductor layer with the insulating layer. Therefore, a semiconductor device that is a highly reliable nonvolatile semiconductor storage device in which defects such as a short and leakage current between a charge accumulation layer, a control gate electrode layer, a gate electrode layer, and a semiconductor layer that are caused by a coverage defect of the semiconductor layer with an insulating layer are prevented and a manufacturing method of such a semiconductor device can be provided. Accordingly, further miniaturization and higher integration of the semiconductor device are possible, and higher performance of the semiconductor device can be achieved. In addition, because defects such as shape defects of the film can be reduced, in the manufacturing process, the semiconductor device can be manufactured with good yield.

Embodiment Mode 4

Figure 17:
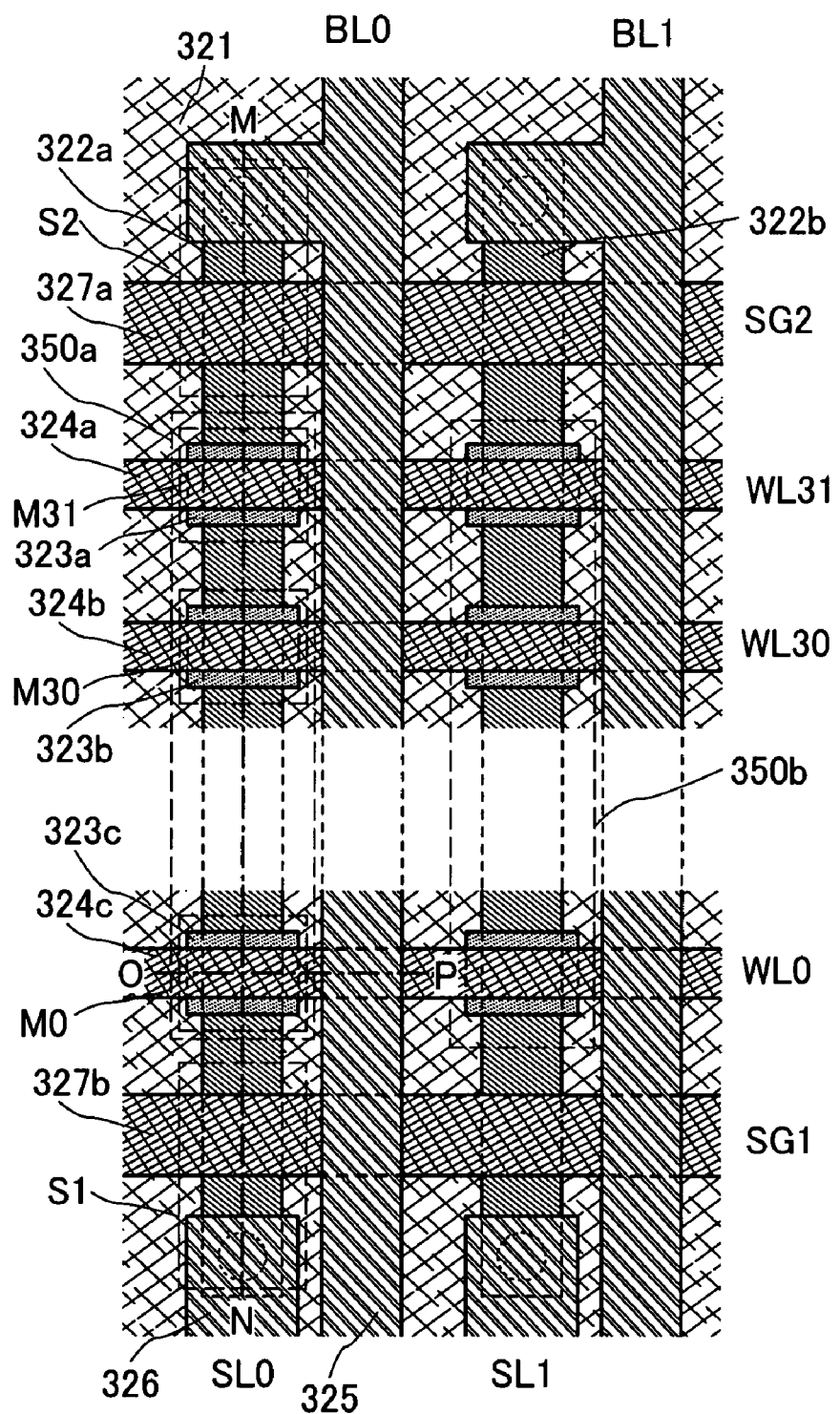
FIG. 17 is a view illustrating a top view of a semiconductor device of the present invention.

In this embodiment mode, an example of a highly reliable semiconductor device having a memory element (also referred to as a storage element) in which defects such as a short and leakage current between a gate electrode layer and a semiconductor layer that are caused by a coverage defect of a semiconductor layer with an insulating layer in a semiconductor element are prevented, will be described with reference to drawings. FIG. 17 is a top view of a semiconductor device of this embodiment mode, FIG. 18A is a cross-sectional view taken along a line M-N in FIG. 17, and FIG. 18B is a cross-sectional view taken along a line O-P in FIG. 17.

In this embodiment mode, a case where a plurality of nonvolatile memory elements is provided in one element region in the structure shown in Embodiment Mode 2 will be described with reference to drawings. It is to be noted that the explanation will be omitted in cases where one the same as that in the above embodiment mode is referred to.

Figure 18A:
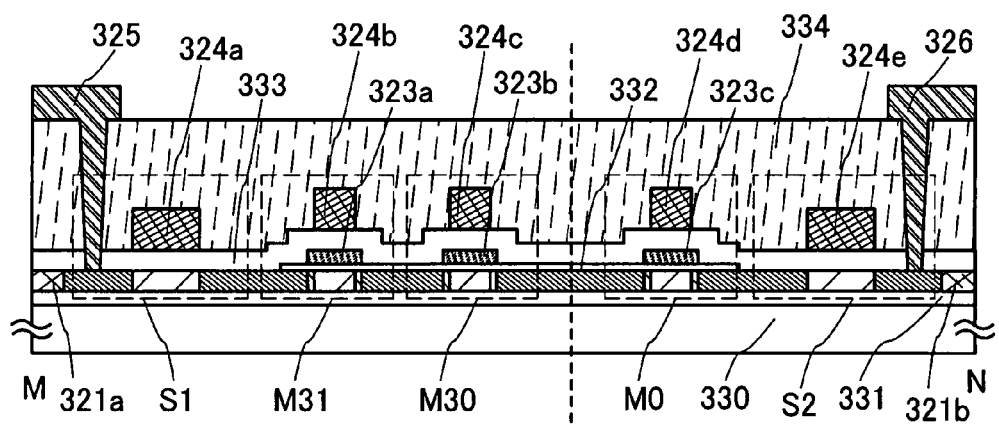
FIGS. 18A and 18B are views illustrating cross-sectional views of a semiconductor device of the present invention.
Figure 18B:
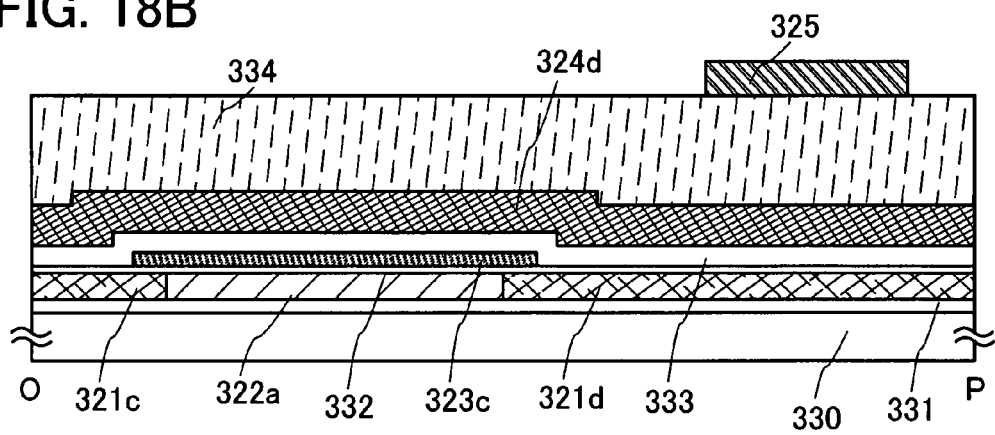

The semiconductor device shown in this embodiment mode is provided with element regions 322a and 322b in a semiconductor layer, which are electrically connected to bit lines BL0 and BL1, respectively, and each of the element regions 322a and 322b is provided with a plurality of nonvolatile memory elements (see FIG. 17 and FIGS. 18A and 18B). Specifically, in the element region 322a, a NAND-type cell 350a having a plurality of nonvolatile memory elements M0 to M30 and M31 is provided between selection transistors S1 and S2. Also, in the element region 322b, a NAND-type cell 350b having a plurality of nonvolatile memory elements is provided between selection transistors. By an element isolation region 321 being provided between the element regions 322a and 322b, the NAND-type cell 350a and the NAND-type cell 350b that are close to each other can be insulated and isolated from each other.

Further, by a plurality of nonvolatile memory elements being provided in one element region, a nonvolatile memory element can be further integrated, and thus a nonvolatile semiconductor storage device with large capacitance can be formed.

In FIG. 17 and FIGS. 18A and 18B, the selection transistors S1 and S2 and the memory elements M0, M30, and M31 are provided over a substrate 330 provided with an insulating layer 331. Gate electrode layers (SG2 and SG1) 327a and 327b, charge accumulation layers 323a, 323b, and 323c, control gate electrode layers (WL31, WL30, and WL0) 324a, 324b, and 324c, a first insulating layer 332, a second insulating layer 333, and an interlayer insulating layer 334 are provided. The selection transistor S1 is connected to the bit line BL0, and the selection transistor S2 is connected to a source line (SL0) 326.

In the semiconductor layer, the element region 322a included in the NAND-type cell 350a and the element region 322b included in the NAND-type cell 350b are electrically isolated from each other by the element isolation region 321 (321a, 321b, 321c, and 321d).

The element isolation region is formed by selective addition of a first impurity element that does not contribute to conductivity and a second impurity element that imparts an opposite conductivity type to that of a source region and a drain region in the element region in order to electrically isolate elements from each other in one semiconductor layer.

As the first impurity element that does not contribute to conductivity, an impurity element of at least one or more kinds of oxygen, nitrogen, and carbon can be used. The element isolation region to which the first impurity element is added, conductivity is lowered by mixture of the first impurity element that does not contribute to conductivity, and resistance of the element isolation region is increased because its crystallinity is lowered by a physical impact (it can also be referred to as a so-called sputtering effect) on the semiconductor layer at adding. In the element isolation region with the increased resistance, electron field-effect mobility is also lowered, and accordingly, elements can be electrically isolated from each other. On the other hand, in a region to which an impurity element is not added, electron field-effect mobility that is high enough to be able to serve as an element is kept, and accordingly, the region can be used as an element region.

The element region has a source region, a drain region, and a channel formation region. The source region and the drain region are impurity regions having one conductivity type (for example, n-type impurity regions or p-type impurity regions). An impurity element that imparts an opposite conductivity type to that of the source region and the drain region in the element region is added to the element isolation region, whereby the element isolation region is made to be an impurity region having an opposite conductivity type to that of the source region and the drain region in the element region that is adjacent to the element isolation region. That is, in a case where the source region and the drain region in the element region are n-type impurity regions, the adjacent element isolation region may be formed as a p-type impurity region. Similarly, in a case where the source region and the drain region in the element region are p-type impurity regions, the adjacent element isolation region may be formed as an n-type impurity region. The element region and the element isolation region that are adjacent to each other form a PN junction. Accordingly, the element regions can be further insulated and isolated from each other by the element isolation region provided between the element regions.

One feature of the present invention is that one semiconductor layer is isolated into a plurality of element regions in the manner that resistance of the element isolation region by which the element regions are insulated and isolated from each other is increased by addition of the first impurity element that does not contribute to conductivity, and further, a PN junction is formed in a position where the element region and the element isolation region are in contact with each other by addition of the second impurity element that imparts an opposite conductivity type to that of the source region and the drain region in the element region. By the present invention, the element regions can be isolated from each other by an effect caused by each of the first impurity element and the second impurity element. Thus, a higher effect of insulation and isolation of the element can be obtained.

FIG. 17 and FIGS. 18A and 18B show a case where a plurality of memory elements is formed. Because the element isolation region 321 (321a, 321b, 321c, and 321d) is provided to be in contact with the element regions 322a and 322b having the n-type impurity regions, the element isolation region 321 may be formed as a p-type impurity region by addition of an impurity element that imparts p-type (for example, boron (B), aluminum (Al), gallium (Ga), or the like) as a second impurity element that imparts an opposite conductivity type to that of the source region and the drain region in the element region. As a result, the n-type impurity region and the p-type impurity region are alternately adjacent to each other, whereby impurity regions having the same conductivity can be insulated and isolated from each other.

The addition (introduction) of the first impurity element and the second impurity element in forming the element isolation region can be performed by an ion implantation method, an (ion) doping method, or the like.

The resistivity of the element isolation region is preferably greater than or equal to $1 \times 10^{10}$ Ω·cm, and the concentration of the impurity element such as oxygen, nitrogen, or carbon is preferably greater than or equal to $1 \times 10^{20}$ Ω·cm$^{-3}$ and less than $4 \times 10^{22}$ Ω·cm$^{-3}$.

Crystallinity of the element isolation region is lowered by addition of the impurity element; therefore, it can be said that the element isolation region is made to be amorphous. On the other hand, because the element region is a crystalline semiconductor layer, in a case where a semiconductor element is formed in the element region, crystallinity of the channel formation region is higher than that of the element isolation region, and high electron field-effect mobility as a semiconductor element can be obtained.

As the impurity element added to the element isolation region, a rare gas element such as argon (Ar), neon (Ne), krypton (Kr), or xenon (Xe) may be used. By further addition of such a rare gas element that is an element having comparatively high mass as well as oxygen, nitrogen, and carbon, a physical impact on the semiconductor layer can be increased, whereby crystallinity of the element isolation region can be lowered more effectively.

In FIG. 18B, the charge accumulation layer 323c is formed to extend over the element region 322a and the element isolation regions 321c and 321d in the semiconductor layer, with the first insulating layer 332 interposed between the charge accumulation layer 323c and the semiconductor layer. In the present invention, the element isolation region and the element region are provided in the continuous semiconductor layer; therefore, the element isolation regions 321c and 321d and the element region 322a are contiguous. Thus, the surface thereof has high flatness and no steep step.

The first insulating layer 332 is formed over the highly flat semiconductor layer; therefore, coverage is good and shape defects are not easily generated. Accordingly, defects such as leakage current and a short can be prevented between the charge accumulation layers 323a, 323b, and 323c formed over the first insulating layer 332 and the element region 322a, respectively. Thus, a semiconductor device that is a nonvolatile semiconductor storage device of this embodiment mode can be a highly reliable semiconductor device in which defects such as a short and leakage current between the charge accumulation layer and the semiconductor layer that are caused by a coverage defect of the semiconductor layer with the first insulating layer are prevented.

This embodiment mode can be implemented by being combined with other embodiment modes shown in this specification.

Therefore, with the use of the present invention, a semiconductor layer can be isolated into a plurality of element regions without being divided into island shapes. Steps resulting from the edge portion of the semiconductor layer are not generated, and thus an insulating layer is formed over a flat semiconductor layer, leading to improvement in coverage of the semiconductor layer with the insulating layer. Therefore, a semiconductor device that is a highly reliable nonvolatile semiconductor storage device in which defects such as a short and leakage current between a charge accumulation layer, a control gate electrode layer, a gate electrode layer, and a semiconductor layer that are caused by a coverage defect of the semiconductor layer with an insulating layer are prevented and a manufacturing method of such a semiconductor device can be provided. Accordingly, further miniaturization and higher integration of the semiconductor device are possible, and higher performance of the semiconductor device can be achieved. In addition, because defects such as shape defects of the film can be reduced, in the manufacturing process, the semiconductor device can be manufactured with good yield.

Embodiment Mode 5

In this embodiment mode, as a semiconductor device to which the present invention is applied, an example of a nonvolatile semiconductor storage device will be described. In the present invention, a plurality of semiconductor elements is manufactured in one semiconductor layer without division of the semiconductor layer into island shapes. The present invention may be applied to all semiconductor elements to be provided in a semiconductor device or part thereof. The present invention may be applied in accordance with a function required for a semiconductor element. An example of a semiconductor device to which the present invention is applied will be described with reference to FIGS. 20A to 20D.

Figure 20A:
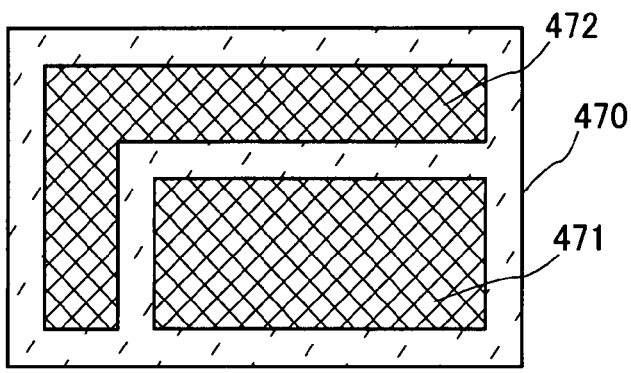
FIGS. 20A to 20D are views illustrating top views of a semiconductor device of the present invention.

FIGS. 20A to 20D are each top views of a semiconductor device of the present invention, which are simply illustrated using a substrate, and a peripheral circuit portion and a memory element portion that are provided over the substrate. In the semiconductor device of this embodiment mode shown in FIGS. 20A to 20D, the memory element portion and the peripheral circuit portion are formed over the same substrate. FIG. 20A shows an example in which a peripheral circuit portion 472 and a memory element portion 471 are provided over a substrate 470, and a semiconductor layer is formed over an entire surface of the substrate 470. Over the substrate 470, regions of the semiconductor layer that are in the peripheral circuit portion 472 and the memory element portion 471 are isolated into an element isolation region, to which the present invention is applied, formed by addition of a first impurity element that does not contribute to conductivity and a second impurity element that imparts an opposite conductivity type to that of the element region, and an element region. Thereby, a plurality of semiconductor elements are formed. The regions of the semiconductor layer other than those in the peripheral circuit portion 472 and the memory element portion 471 provided over the substrate 470 may be made highly resistant in a similar manner to how the element isolation region in the peripheral circuit portion 472 and the memory element portion 471 is, by addition of the first impurity element and the second impurity element that imparts an opposite conductivity type to that of the element region.

Figure 20B:
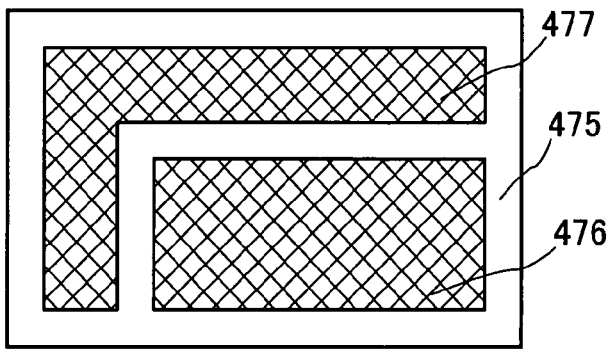

FIG. 20B shows an example in which a semiconductor layer is not formed over an entire surface of a substrate 475. A semiconductor layer in a region other than a peripheral circuit portion 477 and a memory element portion 476 provided over the substrate 475 is removed by etching or the like. The peripheral circuit portion 477 and the memory element portion 476 in FIG. 20B each have a structure in which a plurality of semiconductor elements is formed in one semiconductor layer by an element isolation region that is a high-resistance region to which the first impurity element and the second impurity element that imparts an opposite conductivity type to that of the element region are added, in a similar manner to the peripheral circuit portion 472 and the memory element portion 471 in FIG. 20A. The semiconductor layer in the region over the substrate where semiconductor elements are not formed, may be made highly resistant or removed, as shown in FIG. 20B. The region where a plurality of semiconductor elements is positioned close to each other, for which a detailed isolation processing of a semiconductor layer is required, may have a structure in which a semiconductor layer is removed in a region where spacing between elements is comparatively wide or an element is not formed by application of an element isolation method of the present invention.

Figure 20C:
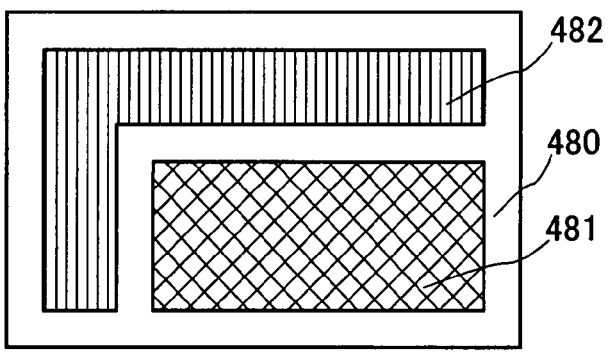

FIG. 20C shows an example in which a different element isolation method is applied in a semiconductor element provided over a substrate 480 in accordance with a function and a size required. In FIG. 20C, a peripheral circuit portion 482 provided over the substrate 480 includes a semiconductor element that is processed into an island shape, and semiconductor elements are isolated from each other by removal of a semiconductor layer by etching. Meanwhile, in a memory element portion 481, an element isolation region to which a first impurity element and a second impurity element that imparts an opposite conductivity type to that of an element region are added is formed in one semiconductor layer, and semiconductor elements are isolated from each other by the element isolation region with the increased resistance. In a case where a characteristic of a semiconductor element required is different in the peripheral circuit portion and the memory element portion, for example, a case where a voltage (for example, a (writing) voltage of approximately 10 to 20 V) applied to a semiconductor element in the memory element portion is higher than a voltage (for example, a voltage of approximately 3 to 5 V) applied to a semiconductor element in the peripheral circuit portion, it is more likely that a coverage defect of the semiconductor layer with a gate insulating layer results in an adverse effect. Accordingly, a semiconductor element may be used, in which an element region in one semiconductor layer is used for the memory element portion 481 in FIG. 20C, and an element region isolated into an island-shaped semiconductor layer is used for the peripheral circuit portion 482. Even in a case where a memory element portion in which a voltage of from approximately 10 to 20 V is required to write and erase, and a peripheral circuit portion that operates at a voltage of from approximately 3 to 7 V to mainly input and output data and control commands are formed over one substrate, mutual interference due to the difference in the voltages applied to each element can be prevented.

Figure 20D:
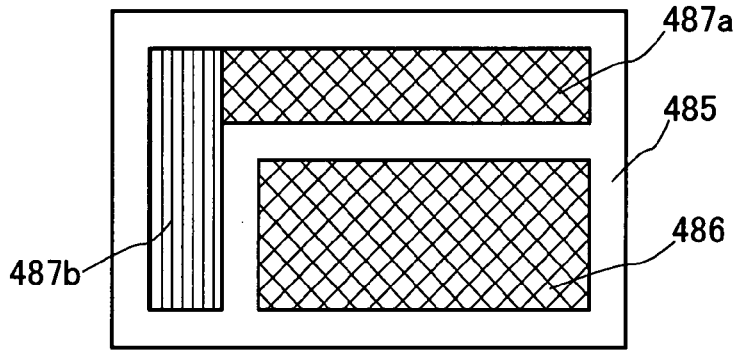

Similarly to FIG. 20C, FIG. 20D shows an example in which a different element isolation method is applied in accordance with a function and a size required in a semiconductor element provided over a substrate 485. In FIG. 20D, a peripheral circuit portion 487*b* provided over the substrate 485 includes a semiconductor element that is processed into an island shape, and semiconductor elements are isolated from each other by removal of a semiconductor layer by etching. Meanwhile, in a peripheral circuit portion 487*a* and a memory element portion 486, an element isolation region to which a first impurity element and a second impurity element that imparts an opposite conductivity type to that of an element region are added is formed in one semiconductor layer, and semiconductor elements are isolated from each other by the element isolation region. In this manner, a structure in which elements are selectively isolated from each other by an island-shaped semiconductor layer in the peripheral circuit portion 487*b* and a structure in which elements are isolated from each other by an element isolation region in one semiconductor layer in the peripheral circuit portion 487*b* and the memory element portion 486 may be used in combination appropriately in accordance with a circuit configuration provided over a substrate.

Different characteristics are required for each semiconductor element provided over a substrate in accordance with functions, and a shape of a semiconductor element (for example, a thickness of a gate insulating layer) is changed in accordance with the characteristic required. In a region with a detailed structure in which semiconductor elements are close to each other, a structure is employed in which an element isolation region is provided in one semiconductor layer and a plurality of semiconductor elements are formed. Meanwhile, in a region where spacing between elements is comparatively wide or thinning of a gate insulating layer is not required so much from a structural point of view, a semiconductor layer is removed and a plurality of semiconductor elements can be manufactured as island-shaped semiconductor layers. By appropriate selection of different element separation methods in accordance with characteristics required over a substrate, a semiconductor device with high performance which is capable of high speed response and is highly reliable can be manufactured.

The element isolation region is formed by selective addition of a first impurity element that does not contribute to conductivity and a second impurity element that imparts an opposite conductivity type to that of a source region and a drain region in the element region in order to electrically isolate elements from each other in one semiconductor layer.

As the first impurity element that does not contribute to conductivity, an impurity element of at least one or more kinds of oxygen, nitrogen, and carbon can be used. The element isolation region to which the first impurity element is added, conductivity is lowered by mixture of the first impurity element that does not contribute to conductivity, and resistance of the element isolation region is increased because its crystallinity is lowered by a physical impact (it can also be referred to as a so-called sputtering effect) on the semiconductor layer at adding. In the element isolation region with the increased resistance, electron field-effect mobility is also lowered, and accordingly, elements can be electrically isolated from each other. On the other hand, in a region to which an impurity element is not added, electron field-effect mobility that is high enough to be able to serve as an element is kept, and accordingly, the region can be used as an element region.

The element region has a source region, a drain region, and a channel formation region. The source region and the drain region are impurity regions having one conductivity type (for example, n-type impurity regions or p-type impurity regions). An impurity element that imparts an opposite conductivity type to that of the source region and the drain region in the element region is added to the element isolation region, whereby the element isolation region is made to be an impurity region having an opposite conductivity type to that of the source region and the drain region in the element region that is adjacent to the element isolation region. That is, in a case where the source region and the drain region in the element region are n-type impurity regions, the adjacent element isolation region may be formed as a p-type impurity region. Similarly, in a case where the source region and the drain region in the element region are p-type impurity regions, the adjacent element isolation region may be formed as an n-type impurity region. The element region and the element isolation region that are adjacent to each other form a PN junction. Accordingly, the element regions can be further insulated and isolated from each other by the element isolation region provided between the element regions.

One feature of the present invention is that one semiconductor layer is isolated into a plurality of element regions in the manner that resistance of the element isolation region by which the element regions are insulated and isolated from each other is increased by addition of the first impurity element that does not contribute to conductivity, and further, PN junctions are successively (repeatedly) formed in positions where the element region and the element isolation region are in contact with each other by addition of the second impurity element that imparts an opposite conductivity type to that of the source region and the drain region in the element region. By the present invention, the element regions can be isolated from each other by an effect caused by each of the first impurity element and the second impurity element. Thus, a higher effect of insulation and isolation of the element can be obtained.

The resistivity of the element isolation region is preferably greater than or equal to $1 \times 10^{10}$ Ω·cm, and the concentration of the first impurity element such as oxygen, nitrogen, or carbon is preferably greater than or equal to $1 \times 10^{20}$ Ω·cm$^{-3}$ and less than $4 \times 10^{22}$ Ω·cm$^{-3}$.

Crystallinity of the element isolation region is lowered by addition of the impurity element; therefore, it can be said that the element isolation region is made to be amorphous. On the other hand, because the element region is a crystalline semiconductor layer, in a case where a semiconductor element is formed in the element region, crystallinity of the channel formation region is higher than that of the element isolation region, and high electron field-effect mobility can be obtained as a semiconductor element.

As the impurity element added to the element isolation region, a rare gas element such as argon (Ar), neon (Ne), krypton (Kr), or xenon (Xe) may be used. By further addition of such a rare gas element that is an element having comparatively high mass as well as oxygen, nitrogen, and carbon, a physical impact on the semiconductor layer can be increased, whereby crystallinity of the element isolation region can be lowered more effectively.

Therefore, according to this embodiment mode, a semiconductor device that is a highly reliable nonvolatile semiconductor memory device in which defects such as a short and leakage current between a charge accumulation layer, a control gate electrode layer, a gate electrode layer, and a semiconductor layer that are caused by a coverage defect of the semiconductor layer with an insulating layer are prevented and a manufacturing method of such a semiconductor device can be provided. Accordingly, further miniaturization and higher integration of the semiconductor device are possible, and higher performance of the semiconductor device can be achieved. In addition, because defects such as shape defects of the film can be reduced, in the manufacturing process, the semiconductor device can be manufactured with good yield.

Embodiment Mode 6

Figure 11A:
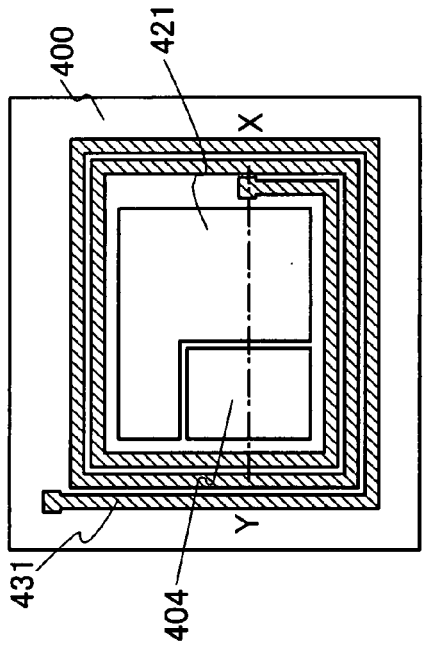
FIGS. 11A and 11B are views respectively illustrating a top view and a cross-sectional view of a semiconductor device of the present invention.

In this embodiment mode, an example of a highly reliable semiconductor device having a memory element (also referred to as a storage element) in which defects such as a short and leakage current between a gate electrode layer and a semiconductor layer that are caused by a coverage defect of a semiconductor layer with an insulating layer in a semiconductor element are prevented, will be described with reference to drawings. FIG. 11A is a top view of a semiconductor device of this embodiment mode, and FIG. 11B is a cross-sectional view taken along a line X-Y in FIG. 11A.

As shown in FIG. 11A, a memory element portion 404, a circuit portion 421, and an antenna 431 that are included in a semiconductor device having a memory element are formed over a substrate 400. A state shown in FIGS. 11A and 11B is in the middle of a manufacturing process, in which the memory element portion, the circuit portion, and the antenna have been formed over the substrate 400 capable of resisting the manufacturing condition. The material and manufacturing process can be selected similarly to Embodiment Mode 3 for manufacturing.

Over the substrate 400, a memory element 441 is provided in the memory element portion 404 while a transistor 442 is provided in the circuit portion 421, with a peeling layer 452 and an insulating layer 453 interposed therebetween. An insulating layer 455 is formed over the memory element 441 and the transistor 442.

Figure 11B:
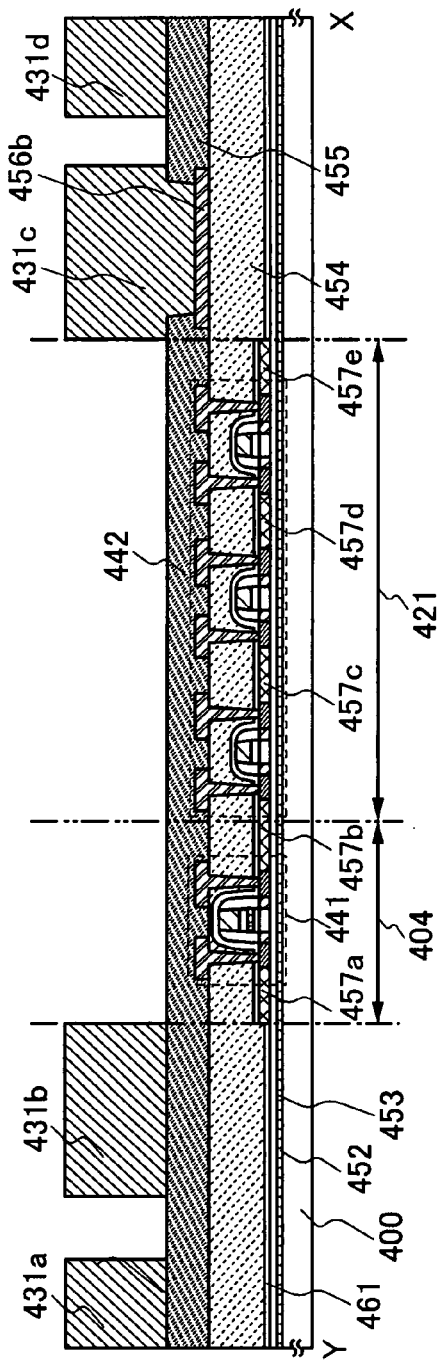

In the semiconductor device shown in FIG. 11B, an antenna 431a, an antenna 431b, an antenna 431c, and an antenna 431d are formed over the insulating layer 455. The antenna 431c is formed to be in contact with a wiring layer 456b in an opening which is formed in the insulating layer 455 so as to reach the wiring layer 456b, which electrically connect the antenna to the memory element portion 404 and the circuit portion 421.

This embodiment mode can be freely combined with the above embodiment mode. The semiconductor device manufactured in this embodiment mode can be provided over a flexible substrate by being peeled from a substrate through a peeling step and by being adhered to a flexible substrate. Thus, a flexible semiconductor device can be obtained.

A flexible semiconductor device formed by attachment of a semiconductor device to a flexible substrate is also referred to as an IC film. The IC film is a flexible semiconductor device having a thickness of less than or equal to 100 µm, preferably, less than or equal to 50 µm, and more preferably, less than or equal to 20 µm, in which a thickness of an included semiconductor layer of less than or equal to 100 µm, preferably, less than or equal to 70 µm.

A flexible substrate corresponds to a film obtained by stacking an adhesive synthetic resin film (e.g., acrylic synthetic resin or epoxy-based synthetic resin) and any of a substrate made of PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like; a film made of polypropylene, polyester, vinyl, polyvinyl fluoride, vinyl chloride, or the like; paper made of a fibrous material; and a base film (e.g., polyester, polyamide, inorganic deposited film, or paper). A film is obtained by applying thermal treatment and pressure treatment to a treatment subject. When conducting thermal treatment and pressure treatment, an adhesive layer provided on the outermost surface of the film or a layer (which is not an adhesive layer) provided on the outermost surface is melted by thermal treatment and then attached to a base substrate by applying pressure. The base substrate may be either provided with or not provided with an adhesive layer. An adhesive layer corresponds to a layer containing an adhesive such as a thermal curing resin, a UV curing resin, an epoxy resin, or a resin additive.

The semiconductor device having memory elements of the present invention may be manufactured by the steps of forming memory elements over a first substrate which can withstand the process conditions (e.g., temperature) and then transferring the memory elements to a second substrate. In addition, in this specification, "to transfer" means "to peel memory elements formed over a first substrate off the first substrate and move them to a second substrate." That is, it can also be said that "to move the position of providing memory elements to another substrate."

It is to be noted that, for the step of transferring memory elements to another substrate, it is possible to appropriately use any of the following methods: a method in which a peeling layer and an insulating layer are formed between a substrate and an element formation layer, a metal oxide film is provided between the peeling layer and the insulating layer, and the metal oxide film is weakened by crystallization so that the element formation layer is peeled off the substrate; a method in which an amorphous silicon film containing hydrogen is provided between a highly heat-resistant substrate and an element formation layer, and the amorphous silicon film is removed by laser irradiation or etching so that the element formation layer is peeled off the substrate; or a method in which a peeling layer and an insulating layer are formed between a substrate and an element formation layer, a metal oxide film is provided between the peeling layer and the insulating layer, the metal oxide film is weakened by crystallization, and a part of the peeling layer is removed by etching using a solution or a halogen fluoride gas such as $NF_3$, $BrF_3$, or $ClF_3$ so that separation occurs at the weakened metal oxide film; or a method in which a substrate over which an element formation layer is formed is removed mechanically or by etching with a solution or a halogen fluoride gas such as $NF_3$, $BrF_3$, or $ClF_3$. Alternatively, it is also possible to use a method in which a film containing nitrogen, oxygen, hydrogen, or the like (e.g., an amorphous silicon film containing hydrogen, an alloy film containing hydrogen, or an alloy film containing oxygen) is used as a peeling layer, and the peeling layer is irradiated with laser light so that nitrogen, oxygen, or hydrogen contained in the peeling layer is dissipated as a gas, thereby promoting separation between the element formation layer and the substrate.

When the above-described peeling methods are combined, the transfer step can be conducted easily. That is, peeling can be conducted with physical force (e.g., by a machine or the like) after making it easier for the peeling layer and the element formation layer to be peeled from each other by conducting laser irradiation, etching the peeling layer with a gas or a solution, and/or mechanically removing the peeling layer using a keen knife.

The antenna may be provided to overlap with the memory element portion or provided around the memory element portion without overlapping. In addition, when the antenna is provided to overlap with the memory element portion, it may overlap with either a part of or an entire surface of the memory element portion. When the antenna portion and the memory element portion overlap with each other, it is possible to reduce noise or the like which is superposed on signals that the antenna communicates or reduce malfunctions of the semiconductor device due to the effect of fluctuation of electromotive force which is generated by electromagnetic induction. Thus, the reliability of the semiconductor device is improved. Further, the size of the semiconductor device can be reduced.

The signal transmission method of the above-described semiconductor device which is capable of wireless data communication can be an electromagnetic coupling method, an electromagnetic induction method, a microwave method, or the like. The transmission method can be selected appropriately by a practitioner in consideration of the intended purpose, and an optimal antenna may be provided in accordance with the transmission method.

For example, in the case of using an electromagnetic coupling method or an electromagnetic induction method (e.g., 13.56 MHz) as the signal transmission method of the semiconductor device, a conductive layer serving as an antenna is formed in an annular form (e.g., a loop antenna) or a helical form (e.g., a spiral antenna) in order to utilize electromagnetic induction which occurs with changes in magnetic density.

In the case of using a microwave method (e.g., UHF band (860 to 960 MHz) or 2.45 GHz band) as the signal transmission method of the semiconductor device, the shape (e.g., length) of a conductive layer serving as an antenna may be appropriately set in consideration of the wavelength of an electromagnetic wave used for signal transmission. For example, a conductive layer serving as an antenna may be formed in a linear form (e.g., a dipole antenna), a flat form (e.g., a patch antenna), a ribbon form, or the like. The shape of the conductive layer serving as the antenna is not limited to the linear form. For example, the conductive layer may be provided in a curved form, a serpentine form, or the like in consideration of the wavelength of electromagnetic waves.

The conductive layer serving as the antenna is formed using a conductive material by a CVD method, a sputtering method, a printing method such as screen printing or gravure printing, a droplet discharge method, a dispensing method, a plating method, or the like. The conductive material is selected from an element such as aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing such an element as a main component. In addition, the conductive layer may be formed to have either a single-layer structure or a stacked structure.

For example, in the case of forming the conductive layer serving as the antenna by a screen printing method, it may be provided by selectively printing a conductive paste in which conductive particles with a particle size of several nm to several tens of μm are dissolved or dispersed in an organic resin. The conductive particles can be at least one of metal particles selected from silver (Ag), gold (Ag), copper (Cu), nickel (Ni), platinum (Pt), palladium (Pd), tantalum (Ta), molybdenum (Mo), and titanium (Ti); fine particles of silver halide; or dispersive nanoparticles. In addition, the organic resin included in the conductive paste can be one or more of organic resins serving as a binder, a solvent, a dispersing agent, and a coating material for the metal particles. Typically, an organic resin such as an epoxy resin and a silicone resin can be given as examples. In addition, it is preferable to form a conductive layer by extruding a conductive paste and baking it. For example, in the case of using fine particles (e.g., a particle size of 1 to 100 nm) containing silver as the main component for a material of the conductive paste, a conductive layer can be obtained by baking and hardening the conductive paste at temperatures in the range of 150 to 300° C. It is also possible to use fine particles of solder or lead-free solder. In that case, fine particles with a particle size of 20 μm or less are preferably used. Solder and lead-free solder have the advantages of low cost. Besides the above-described materials, ceramic, ferrite, or the like may also be used for the antenna.

In the case of using the electromagnetic coupling method or the electromagnetic induction method, and forming the semiconductor device having the antenna to be in contact with metal, it is preferable to provide a magnetic material having magnetic permeability between the semiconductor device and the metal. When the semiconductor device having the antenna is provided in contact with the metal, eddy current flows through the metal in accordance with changes in magnetic field, and in turn, a demagnetizing field which is generated by the eddy current weakens the changes in magnetic field, so that the communication distance decreases. Therefore, by providing a magnetic material having magnetic permeability between the semiconductor device and the metal, eddy current which flows through the metal can be suppressed, and thus a decrease in communication distance can be suppressed. As a magnetic material, ferrite or a thin metal film having high magnetic permeability and low loss of high frequency can be used.

In addition, when providing the antenna, it is possible to directly form semiconductor elements such as transistors and a conductive layer serving as an antenna over one substrate. Alternatively, it is also possible to provide semiconductor elements and a conductive layer serving as an antenna over different substrates, and then attach the substrates to each other so that the semiconductor elements and the antenna are electrically connected.

The present invention is applied to the memory element 441 and the transistor 442. The channel formation regions of these elements are formed in element regions which are provided in one semiconductor layer. The memory element and the transistors are isolated from each other by the element isolation regions 457a, 457b, 457c, 457d, and 457e formed by addition of first impurity elements and second impurity elements. In this manner, when the present invention is employed, a semiconductor layer can be isolated into a plurality of element regions without being divided into island shapes, and a plurality of semiconductor elements can be manufactured. Hence, steps resulting from the edge portion of the semiconductor layer are not generated, and thus an insulating layer is formed over a flat semiconductor layer, leading to improvement in coverage of the semiconductor layer with the insulating layer.

Thus, according to this embodiment mode, a highly reliable semiconductor device a having memory element in which defects such as a short between a charge accumulation layer, a control gate electrode layer, a gate electrode layer, and a semiconductor layer and a leakage current that are caused by a coverage defect of the semiconductor layer with an insulating layer are prevented and a manufacturing method of such a semiconductor device can be provided. Accordingly, further miniaturization and higher integration of the semiconductor device having a memory element are possible, and higher performance of the semiconductor device can be achieved. In addition, because defects such as a shape defect of the film can be reduced, in the manufacturing process, the semiconductor device can be manufactured with good yield.

Embodiment Mode 7

In this embodiment mode, an example of a highly reliable semiconductor device having a CMOS circuit and a memory element in which defects such as a short and leakage current between a gate electrode layer and a semiconductor layer that are caused by a coverage defect of a semiconductor layer with an insulating layer in a semiconductor element are prevented, will be described with reference to drawings. A manufacturing method of a semiconductor device in this embodiment mode will be described in detail with reference to FIGS. 5A to 5F and FIGS. 6A to 6E.

It is to be noted that selection transistors provided in the memory portion require a higher driving voltage than transistors provided in the logic portion; therefore, it is preferable to vary, for example, the thickness of a gate insulating layer or the like of the transistors provided in the memory portion and the thickness of a gate insulating layer or the like of the transistors provided in the logic portion. For example, in order to obtain transistors with low driving voltage and small variations in threshold voltage, it is preferable to form thin film transistors having a thin gate insulating layer. On the other hand, in order to obtain transistors with high driving voltage and a gate insulating layer with high dielectric strength, it is preferable to form thin film transistors having a thick gate insulating layer.

Accordingly, this embodiment mode will describe a case of forming a thin insulating layer for the transistors in the logic portion, which require a low driving voltage and small variations in threshold voltage, and forming a thick insulating layer for the transistors in the memory portion, which require a high driving voltage and high dielectric strength of a gate insulating layer.

As base films over a substrate 100 having an insulating surface, an insulating layer 112a made of a silicon nitride oxide film with a thickness of 10 to 200 nm (preferably, 50 to 150 nm), and an insulating layer 112b made of a silicon oxynitride film with a thickness of 50 to 200 nm (preferably, 100 to 150 nm) are stacked by a sputtering method, a PVD (Physical Vapor Deposition) method, or a CVD (Chemical Vapor Deposition) method such as a low pressure CVD (LPCVD) method or a plasma CVD method. Alternatively, it is also possible to use acrylic acid; methacrylic acid; derivatives thereof; thermally stable polymers such as polyimide, aromatic polyamide, or polybenzimidazole; or a siloxane resin. It is to be noted that the siloxane resin corresponds to a resin having a Si—O—Si bond. Siloxane has a skeletal structure with the bond of silicon (Si) and oxygen (O). As a substituent, an organic group containing at least hydrogen (e.g., an alkyl group or an aryl group) is used. Alternatively, a fluoro group may be used as the substituent. As a further alternative, both an organic group containing at least hydrogen and a fluoro group may be used as the substituent. Further, other resin materials can be used such as a vinyl resin (e.g., polyvinyl alcohol or polyvinyl butyral), an epoxy rein, a phenol resin, a novolac resin, an acrylic rein, a melamine resin, or a urethane resin. In addition, it is also possible to use an organic material such as benzocyclobutene, parylene, fluorinated arylene ether, or polyimide, or a composition material containing water-soluble homopolymers and water-soluble copolymers. Further, an oxazole resin such as photo-curing polybenzoxazole can also be used.

Further, a droplet discharge method, a printing method (a method by which patterns are formed such as screen printing or offset printing), a coating method such as spin coating, a dipping method, a dispensing method, or the like can be used. In this embodiment mode, the insulating layer 112a and the insulating layer 112b are formed by a plasma CVD method. As the substrate 100, a glass substrate, a quartz substrate, a metal substrate, or a stainless steel substrate having an insulating layer formed on its surface can be used. Alternatively, a plastic substrate which can withstand the processing temperature in this embodiment mode, or a flexible substrate such as a film can also be used. As a plastic substrate, a substrate made of PET (polyethylene terephthalate), PEN (polyethylene naphthalate), PES (polyethersulfone), or the like can be used. As a flexible substrate, a synthetic resin such as acrylic can be used.

As the insulating layers serving as base films, silicon oxide, silicon nitride, silicon oxynitride, silicon nitride oxide, or the like can be used, and either a single-layer structure or a stacked structure of two or three layers can be employed.

Next, a semiconductor layer is formed over the base films. The semiconductor layer may be formed to a thickness of 25 to 200 nm (preferably, 30 to 150 nm) by various methods (e.g., a sputtering method, an LPCVD method, or a plasma CVD method). In this embodiment mode, it is preferable to use a crystalline semiconductor layer which is obtained by crystallizing an amorphous semiconductor layer by laser irradiation.

As a method for forming the crystalline semiconductor layer, various methods (e.g., a laser crystallization method, a thermal crystallization method, or a thermal crystallization method using an element which promotes the crystallization such as nickel) may be used. Further, when a microcrystalline semiconductor is crystallized by laser irradiation, the crystallinity thereof can be increased. When an element which promotes the crystallization is not used, heating is conducted under a nitrogen atmosphere at 500° C. for one hour before conducting laser irradiation for an amorphous semiconductor layer, so that the concentration of hydrogen contained in the amorphous semiconductor layer is reduced to $1 \times 10^{20}$ atoms/$cm^3$ or less. This is because when an amorphous semiconductor layer containing much hydrogen is irradiated with laser light, the amorphous semiconductor layer will be destroyed. For the thermal treatment for crystallization, it is possible to use a heating oven, laser irradiation, irradiation with light emitted from a lamp (also called lamp annealing), or the like. As a heating method, there is an RTA method such as GRTA (Gas Rapid Thermal Annealing) method or an LRTA (Lamp Rapid Thermal Annealing) method. GRTA is a method of thermal treatment using a high-temperature gas, and LRTA is a method of thermal treatment using light emitted from a lamp.

Alternatively, in the crystallization step for forming a crystalline semiconductor layer by crystallizing an amorphous semiconductor layer, the crystallization may be conducted by adding an element which promotes the crystallization (also called a catalytic element or a metal element) to the amorphous semiconductor layer and applying thermal treatment (550 to 750° C. for 3 minutes to 24 hours) thereto. The element which promotes the crystallization can be one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au).

As a method for introducing a metal element into the amorphous semiconductor layer, any method by which the metal element can remain on the surface or inside of the amorphous semiconductor layer can be used. For example, a sputtering method, a CVD method, a plasma treatment method (including a plasma CVD method), an adsorption method, or a method of applying a metal-salt solution can be used. Above all, the method using a solution is simple and advantageous in that the concentration of the metal element can be easily controlled. In addition, in order to improve the wettability of the surface of the amorphous semiconductor layer and spread an aqueous solution over an entire surface of the amorphous semiconductor layer, it is desirable to form an oxide film by UV irradiation under an oxygen atmosphere, a thermal oxidation method, treatment with ozone water containing hydroxyl radical or with hydrogen peroxide, or the like.

In order to remove or reduce the element which promotes the crystallization from the crystalline semiconductor layer, a semiconductor layer containing an impurity element is formed in contact with the crystalline semiconductor layer so that it can serve as a gettering sink. As the impurity element, an impurity element that imparts n-type conductivity, an impurity element that imparts p-type conductivity, a rare gas element, or the like can be used. For example, one or more elements selected from phosphorus (P), nitrogen (N), arsenic (As), antimony (Sb), bismuth (Bi), boron (B), helium (He), neon (Ne), argon (Ar), Kr (krypton), and Xe (xenon) can be used. A semiconductor layer containing a rare gas element is formed over the crystalline semiconductor layer containing the element which promotes the crystallization, and thermal treatment (550 to 750° C. for 3 minutes to 24 hours) is applied thereto. The element which promotes the crystallization and is contained in the crystalline semiconductor layer moves toward the semiconductor layer containing the rare gas element so that the element which promotes the crystallization and is contained in the crystalline semiconductor layer is removed or reduced. After that, the semiconductor layer containing the rare gas element serving as the gettering sink is removed.

Laser irradiation can be conducted by scanning laser and the semiconductor layer relative to each other. In addition, a marker may be formed in order to overlap beams with high accuracy or to control the laser irradiation starting position and the laser irradiation termination position in the laser irradiation. The marker may be formed on the substrate at the same time as the formation of the amorphous semiconductor layer.

When laser irradiation is used, a continuous wave (CW) laser beam or a pulsed laser beam can be used. As a laser beam herein, one or more of the following can be used: gas lasers such as an Ar laser, a Kr laser, and an excimer laser; a laser in which a medium such as single-crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ is doped with one or more of dopants such as Nd, Yb, Cr, Ti, Ho, Er, Tm, and Ta; a glass laser; a ruby laser; an alexandrite laser; a Ti:sapphire laser; a copper vapor laser; and a gold vapor laser. When irradiation is conducted with the fundamental wave of such a laser beam or the second to fourth harmonics of the fundamental wave, crystals with a large grain size can be obtained. For example, the second harmonic (532 nm) or the third harmonic (355 nm) of an Nd:YVO$_4$ laser (the fundamental wave of 1064 nm) can be used. This laser can be either a CW laser or a pulsed layer. When the laser is used as a CW laser, a laser power density of about 0.01 to 100 MW/cm$^2$ (preferably, 0.1 to 10 MW/cm$^2$) is required, and irradiation is conducted with a scanning rate set at about 10 to 2000 cm/sec.

It is to be noted that although the laser in which a medium such as single-crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ is doped with one or more of dopants such as Nd, Yb, Cr, Ti, Ho, Er, Tm, and Ta; an Ar ion laser, or a Ti:sapphire laser can be used as a CW laser, it can also be used as a pulsed laser with a repetition rate of 10 MHz or more by being combined with a Q-switch operation or mode locking. When a laser beam with a repetition rate of 10 MHz or more is used, it is possible for a semiconductor layer to be irradiated with the next pulse after it is melted by the previous laser but before it becomes solidified. Therefore, unlike the case of using a pulsed laser with a low repetition rate, it is possible to move a solid-liquid interface continuously in the semiconductor layer. Thus, crystal grains which have grown continuously in the scanning direction can be obtained.

When ceramic (polycrystals) is used as a medium, the medium can be formed into a desired shape in a short time at low cost. When single crystals are used, a medium with a columnar shape having a diameter of several mm and a length of several tens of mm is usually used. However, when ceramic is used, a medium larger than the case of using single crystals can be formed.

In both cases of using single crystals and polycrystals, the concentration of the dopant such as Nd or Yb contained in the medium which directly contributes to light emission cannot be changed largely. Therefore, there is a limitation to improving the output of the laser by increasing the concentration of the dopant. However, in the case of using ceramic, a drastic improvement in output can be achieved because the size of the medium can be significantly increased than the case of using single crystals.

Further, in the case of using ceramic, a medium with a parallelepiped shape or a rectangular parallelepiped shape can be formed easily. When such a medium is used and oscillated light is made travel within the medium in a zigzag manner, the oscillation path can be made long. Therefore, large amplification can be achieved and high output can be obtained. In addition, since a laser beam emitted from the medium with such a shape has a quadrangular cross section, it can easily be shaped into a linear beam unlike the case of using a circular beam, which is advantageous. When the laser beam emitted in this manner is shaped with optics, a linear beam with a short side of 1 mm or less and a long side of several mm to several m can be obtained easily. In addition, when an excitation light is uniformly shone on the medium, a linear beam with uniform energy distribution in the long-side direction can be obtained. Further, it is preferable that the laser be emitted on the semiconductor layer at an incident angle of θ (0<θ<90°) in order to prevent interference of laser.

By irradiation of the semiconductor layer with such a linear beam, an entire surface of the semiconductor layer can be irradiated more uniformly. In the case where uniform irradiation is required from one end to the other end of the linear laser beam, it is necessary to exercise ingenuity, for example, by using slits or the like so as to shield light at a portion where energy is attenuated.

It is also possible to irradiate the semiconductor layer with laser light in an inert gas atmosphere such as a rare gas or nitrogen. Accordingly, roughness of the surface of the semiconductor layer caused by laser irradiation can be suppressed, and variations in the threshold voltage of transistors caused by variations in interface state density can be suppressed.

Crystallization of the amorphous semiconductor layer may also be conducted by combining thermal treatment and laser irradiation. Alternatively, one of thermal treatment and laser irradiation may be conducted a plurality of times.

The thusly obtained semiconductor layer may be doped with a small amount of an impurity element (e.g., boron or phosphorus) in order to control the threshold voltage of thin film transistors. Alternatively, such doping with the impurity element may be conducted before the crystallization step of the amorphous semiconductor layer. When the amorphous semiconductor layer is doped with an impurity element and then subjected to thermal treatment to be crystallized, activation of the impurity element can also be performed. In addition, defects caused in doping can be remedied.

An impurity element is selectively added to the semiconductor layer that is a crystalline semiconductor layer to form an element isolation region. The semiconductor layer is isolated into a plurality of element regions by the element isolation region. Over the semiconductor layer, mask layers 103$a$, 103$b$, 103$c$, and 103$d$ are formed, and an impurity element 104 that does not contribute to conductivity is added. By the addition of the impurity element 104 that does not contribute to conductivity, element isolation regions 651$a$, 651$b$, 651$c$, 651$d$, 651$e$, 651$f$, 651$g$, and 651$h$ and element regions 102$a$, 102$b$, 102$c$, and 102$d$ that are insulated and isolated from each other by those element isolation region are formed in the semiconductor layer (see FIG. 5A).

The element isolation region is formed by selective addition of a first impurity element that does not contribute to conductivity and a second impurity element that imparts an opposite conductivity type to that of a source region and a drain region in the element region in order to electrically isolate elements from each other in one semiconductor layer.

As the first impurity element that does not contribute to conductivity, an impurity element of at least one or more kinds of oxygen, nitrogen, and carbon can be used. The element isolation region to which the first impurity element is added, conductivity is lowered by mixture of the first impurity element that does not contribute to conductivity, and resistance of the element isolation region is increased because its crystallinity is lowered by a physical impact (it can also be referred to as a so-called sputtering effect) on the semiconductor layer at adding. In the element isolation region with the increased resistance, electron field-effect mobility is also lowered, and accordingly, elements can be electrically isolated from each other. On the other hand, in a region to which an impurity element is not added, electron field-effect mobility that is high enough to be able to serve as an element is kept, and accordingly, the region can be used as an element region.

The element region has a source region, a drain region, and a channel formation region. The source region and the drain region are impurity regions having one conductivity type (for example, n-type impurity regions or p-type impurity regions). An impurity element that imparts an opposite conductivity type to that of the source region and the drain region in the element region is added to the element isolation region, whereby the element isolation region is formed as an impurity region having an opposite conductivity type to that of the source region and the drain region in the adjacent element region. That is, in a case where the source region and the drain region in the element region are n-type impurity regions, the adjacent element isolation region may be formed as a p-type impurity region. Similarly, in a case where the source region and the drain region in the element region are p-type impurity regions, the adjacent element isolation region may be formed as an n-type impurity region. The element region and the element isolation region that are adjacent to each other form a PN junction. Accordingly, the element regions can be further insulated and isolated from each other by the element isolation region provided between the element regions.

One feature of the present invention is that one semiconductor layer is isolated into a plurality of element regions in the manner that resistance of the element isolation region by which the element regions are insulated and isolated from each other is increased by addition of the first impurity element that does not contribute to conductivity, and further, a PN junction is formed in a position where the element region and the element isolation region are in contact with each other by addition of the second impurity element that imparts an opposite conductivity type to that of the source region and the drain region in the element region. By the present invention, the element regions can be isolated from each other by an effect caused by each of the first impurity element and the second impurity element. Thus, a higher effect of insulation and isolation of the element can be obtained.

The resistivity of the element isolation region is preferably greater than or equal to $1 \times 10^{10}$ $\Omega \cdot cm$, and the concentration of the impurity element such as oxygen, nitrogen, or carbon is preferably greater than or equal to $1 \times 10^{20}$ $\Omega \cdot cm^{-3}$ and less than $4 \times 10^{22}$ $\Omega \cdot cm^{-3}$.

Crystallinity of the element isolation region is lowered by addition of the impurity element; therefore, it can be said that the element isolation region is made to be amorphous. On the other hand, because the element region is a crystalline semiconductor layer, in a case where a semiconductor element is formed in the element region, crystallinity of the channel formation region is higher than that of the element isolation region, and high electron field-effect mobility can be obtained as a semiconductor element.

As the impurity element added to the element isolation region, a rare gas element such as argon (Ar), neon (Ne), krypton (Kr), or xenon (Xe) may be used. By further addition of such a rare gas element that is an element having comparatively high mass as well as oxygen, nitrogen, and carbon, a physical impact on the semiconductor layer can be increased, whereby crystallinity of the element isolation region can be lowered more effectively.

Next, over the semiconductor layer, mask layers 652a, 652b, 652c, and 652d that cover the element regions 102a, 102b, 102c, and 102d and the element isolation regions 651c and 651d are formed, and an impurity element 653 that imparts p-type conductivity is added. By the addition of the impurity element 653 that imparts p-type conductivity, element isolation regions 101a, 101b, 101c, 101d, 101e, and 101f, which are p-type impurity regions, are formed in the semiconductor layer (see FIG. 5B).

Then, over the semiconductor layer, mask layers 654a, 654b, 654c, and 654d that cover the element regions 102a, 102b, 102c, and 102d and the element isolation regions 101a, 101b, 101c, 101d, 101e, and 101f are formed, and an impurity element 655 that imparts n-type conductivity is added. By the addition of the impurity element 655 that imparts n-type conductivity, element isolation regions 656a and 656b, which are n-type impurity regions, are formed in the semiconductor layer (see FIG. 5C).

In this embodiment mode, the element isolation region and the element region are provided in the continuous semiconductor layer. Accordingly, the element isolation regions 101a, 101b, 101c, 101d, 101e, and 101f and the element region 656a and 656b that are insulated and isolated from each other by those element isolation regions are contiguous in the semiconductor layer. Thus, the surface thereof has high flatness and no steep step.

A mask is removed, a first insulating layer 105 is formed over the semiconductor layer, and a charge accumulation layer 106 is formed over the first insulating layer 105.

The first insulating layer 105 is formed over the highly flat semiconductor layer; therefore, coverage is good and shape defects are not easily generated. Accordingly, defects such as leakage current and a short can be prevented between the charge accumulation layer 106 formed over the first insulating layer 105 and the element region 102c. Thus, a semiconductor device that is a nonvolatile semiconductor storage device of this embodiment mode can be a highly reliable semiconductor device in which defects such as a short and leakage current between the charge accumulation layer and the semiconductor layer that are caused by a coverage defect of the semiconductor layer with the first insulating layer are prevented.

The first insulating layer 105 can be formed by applying thermal treatment, plasma treatment, or the like to the semiconductor layer. For example, by performance of oxidation treatment, nitridation treatment, or oxynitridation treatment by high density plasma treatment on the semiconductor layer, the first insulating layer 105 is formed as an oxide film, a nitride film, or an oxynitride film on the semiconductor layer. It is to be noted that the first insulating layer 105 may also be formed by a plasma CVD method or a sputtering method.

For example, when a semiconductor layer containing Si as a main component is used as the semiconductor layer, and oxidation treatment or nitridation treatment by high density plasma treatment is performed on the semiconductor layer, a silicon oxide layer or a silicon nitride layer is formed as the first insulating layer 105. In addition, after performing oxidization treatment on the semiconductor layer by high density plasma treatment, nitridation treatment may be performed by performing high density plasma treatment again. In that case, a silicon oxide layer is formed to be in contact with the semiconductor layer and a nitrogen plasma-treated layer is formed on the surface of the silicon oxide layer or in the vicinity of the surface.

Here, the first insulating layer 105 is formed at a thickness of 1 to 10 nm, preferably 1 to 5 nm. For example, a silicon oxide layer with a thickness of about 3 nm is formed over the surface of the semiconductor layer by performing oxidation treatment by high density plasma treatment on the semiconductor layer, and then nitridation treatment by high density plasma is performed thereon to form a nitrogen plasma-treated layer on the surface of the silicon oxide layer or in the vicinity of the surface. Specifically, first, a silicon oxide layer is formed at a thickness of 3 to 6 nm on the semiconductor layer by plasma treatment under an oxygen atmosphere. Subsequently, by conducting plasma treatment under a nitrogen atmosphere, a nitrogen plasma-treated layer containing a high concentration of nitrogen is provided over the surface of the silicon oxide layer or in the vicinity of the surface. Here, by conducting plasma treatment under a nitrogen atmosphere, a structure is obtained in which 20 to 50 atomic % nitrogen is contained in a region from the surface of the silicon oxide layer to a depth of about 1 nm. In the nitrogen plasma-treated layer, silicon containing oxygen and nitrogen (silicon oxynitride) is formed. At this time, it is preferable to continuously perform oxidation treatment and nitridation treatment by high density plasma treatment without exposure to the air. By continuously conducting such high density plasma treatment, mixture of contaminants can be prevented and improvement in production efficiency can be achieved.

In the case of oxidizing the semiconductor layer by high density plasma treatment, the plasma treatment is conducted under an oxygen atmosphere (e.g., an atmosphere containing oxygen ($O_2$) or dinitrogen monoxide ($N_2O$) and a rare gas (containing at least one of He, Ne, Ar, Kr, and Xe), or an atmosphere containing oxygen or dinitrogen monoxide, hydrogen ($H_2$), and a rare gas). Meanwhile, in the case of nitriding the semiconductor layer by high density plasma treatment, the plasma treatment is conducted under a nitrogen atmosphere (e.g., an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas).

As the rare gas, Ar can be used, for example. Alternatively, a mixed gas of Ar and Kr can also be used. In the case of performing high density plasma treatment under a rare gas atmosphere, the first insulating layer 105 may contain the rare gas (which includes at least one of He, Ne, Ar, Kr, and Xe) which has been used for the plasma treatment. For example, when Ar is used, the first insulating layer 105 may contain Ar.

The high density plasma treatment is conducted in the atmosphere containing the above-described gas, with the conditions of a plasma electron density of $1 \times 10^{11}$ $cm^{-3}$ or more and a plasma electron temperature of 1.5 eV or less. Specifically, the plasma treatment is conducted with a plasma electron density greater than or equal to $1 \times 10^{11}$ $cm^{-3}$ and less than or equal to $1 \times 10^{13}$ $cm^{-3}$, and a plasma electron temperature greater than or equal to 0.5 eV and less than or equal to 1.5 eV. Since the plasma electron density is high and the electron temperature in the vicinity of the treatment subject (here, the semiconductor layer) formed on the substrate 100 is low, plasma damage to the treatment subject can be prevented. In addition, since the plasma electron density is as high as $1 \times 10^{11}$ $cm^{-3}$ or more, an oxide or nitride film which is formed by oxidizing or nitriding the treatment subject by plasma treatment is superior in uniformity of the film thickness or the like to a film formed by a CVD method, a sputtering method, or the like. Thus, a dense film can be obtained. Further, since the plasma electron temperature is set as low as 1.5 eV or less, oxidation or nitridation treatment can be performed at a temperature lower than that of the conventional plasma treatment or thermal oxidation treatment. For example, even when the plasma treatment is performed at a temperature lower than the strain point of a glass substrate by 100° C. or more, oxidation or nitridation treatment can be sufficiently performed. As a frequency for generating plasma, high frequency such as microwaves (e.g., 2.45 GHz) can be used.

In this embodiment mode, in the case of oxidizing a treatment subject by high density plasma treatment, a mixed gas of oxygen ($O_2$), hydrogen ($H_2$), and argon (Ar) is introduced. The mixed gas used here may be introduced with an oxygen flow rate of 0.1 to 100 sccm, a hydrogen flow rate of 0.1 to 100 sccm, and an argon flow rate of 100 to 5000 sccm. It is to be noted that the mixed gas is preferably introduced with a ratio of oxygen:hydrogen:argon=1:1:100. For example, the mixed gas may be introduced with an oxygen flow rate of 5 sccm, a hydrogen flow rate of 5 sccm, and an argon flow rate of 500 sccm.

In the case of conducting nitridation by high density plasma treatment, a mixed gas of nitrogen ($N_2$) and argon (Ar) is introduced. The mixed gas used here may be introduced with a nitrogen flow rate of 20 to 2000 sccm and an argon flow rate of 100 to 10000 sccm. For example, the mixed gas may be introduced with a nitrogen flow rate of 200 sccm and an argon flow rate of 1000 sccm.

In this embodiment mode, the first insulating layer 105 formed over the semiconductor layer that is provided in the memory portion serves as a tunnel insulating layer of a non-volatile memory element which is completed subsequently. Thus, the thinner the first insulating layer 105 is, the easier it will be for tunnel current to flow through the layer, and thus higher-speed operation of the memory can be achieved. In addition, the thinner the first insulating layer 105 is, the easier it will be for charges to be accumulated in a charge accumulation layer that is formed subsequently, at a low voltage, and thus lower power consumption of the semiconductor device can be achieved. Therefore, the first insulating layer 105 is preferably formed to be thin.

As a general method for forming a thin insulating layer over a semiconductor layer, there is a thermal oxidation method. However, when a substrate which does not have a sufficiently high melting point such as a glass substrate is used as the substrate 100, it is very difficult to form the first insulating layer 105 by a thermal oxidation method. In addition, an insulating layer formed by a CVD method or a sputtering method does not have a sufficient film quality due to its internal defects, and has a problem in that defects such as pin holes will be generated when the film is formed to be thin. Further, when an insulating layer is formed by the CVD method or the sputtering method, the coverage of the ends of the semiconductor layer is not enough, and there may be a case where a conductive film or the like formed over the first insulating layer 105 subsequently is shorted to the semiconductor layer. Thus, by formation of the first insulating layer 105 by high density plasma treatment as shown in this embodiment mode, an insulating layer that is denser than an insulating layer formed by a CVD method, a sputtering method, or the like can be formed. As a result, high-speed operation of the memory can be achieved and the charge holding properties can be improved. It is to be noted that in the case of forming the first insulating layer 105 by a CVD method or a sputtering method, it is preferable to perform high density plasma oxidation, nitridation, or oxynitridation treatment to the surface of the insulating layer after forming the insulating layer.

The charge accumulation layer 106 serving as a floating gate can be formed using silicon (Si), a silicon compound, germanium (Ge), or a germanium compound. As a silicon compound, silicon nitride, silicon nitride oxide, silicon carbide, silicon germanium which contains 10 atomic % or more of germanium, metal nitride, metal oxide or the like can be used. As a typical example of a germanium compound, silicon germanium can be given, in which case 10 atomic % or more of germanium is preferably contained with respect to silicon. This is because, if the concentration of germanium is less than or equal to 10 atomic %, the effect of the germanium as the constituent element would be small, and the bandgap of the charge accumulation layer would not become effectively small.

The charge accumulation layer 106 is applied to the semiconductor device according to the present invention for charge accumulation. However, other materials can be applied as long as the similar function is provided. For example, a ternary semiconductor containing germanium may be used, or the semiconductor material may be hydrogenated. Alternatively, as a material having a function of the charge accumulation layer of the nonvolatile memory element, the charge accumulation layer can be replaced with an oxide or a nitride of the germanium or the germanium compound.

As a material for forming the charge accumulation layer 106, metal nitride or metal oxide can be used. As metal nitride, tantalum nitride, tungsten nitride, molybdenum nitride, titanium nitride, or the like can be used. As metal oxide, tantalum oxide, titanium oxide, tin oxide, or the like can be used.

It is also possible to form the charge accumulation layer 106 to have a stacked structure of the above-described materials. When a layer made of the above-described silicon, silicon compound, metal nitride, or metal oxide is formed above a layer made of germanium or a germanium compound, the upper layer can be used as a barrier layer for water resistance or chemical resistance in the manufacturing process. Therefore, handling of the substrate in photolithography, etching, and washing processes becomes easier, and thus the productivity can be improved. That is, the processing of the charge accumulation layer can be facilitated.

Figure 5A:
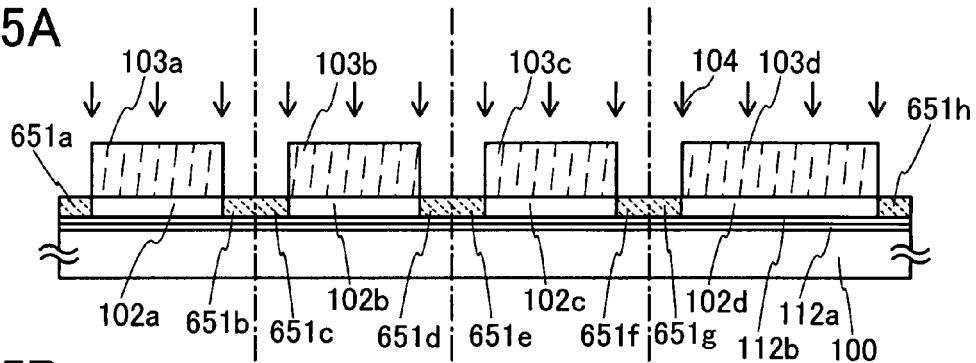
FIGS. 5A to 5F are views illustrating a manufacturing method of a semiconductor device of the present invention.
Figure 5B:
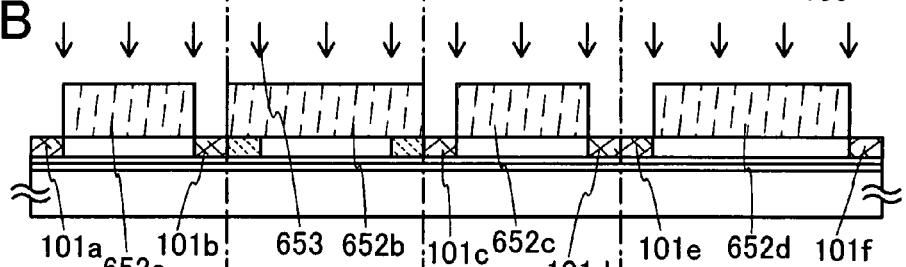
Figure 5C:
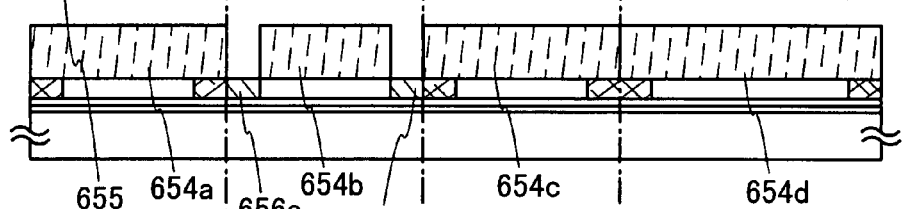
Figure 5D:
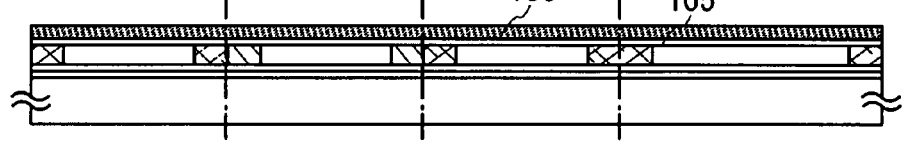
Figure 5E:
Figure 5F:
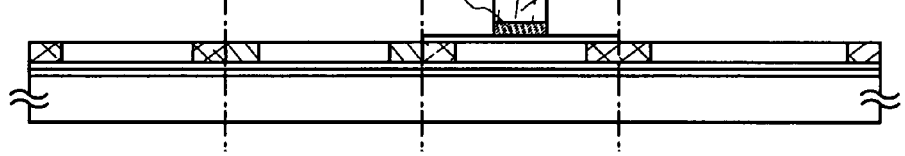

The first insulating layer 105 and the charge accumulation layer 106 are processed into desired shapes so that a first insulating layer 107 and a charge accumulation layer 108 are formed over the element region 102c which is used as the memory element (see FIG. 5E). Further, a mask layer 120 is formed over the charge accumulation layer 108 and the charge accumulation layer 108 is selectively etched using the mask layer 120, thereby forming a charge accumulation layer 109 (see FIG. 5F).

Next, impurity regions are formed in specific regions of the element region 102d. Here, after removing the mask layer 120, mask layers 121a to 121f are selectively formed so as to cover the element regions 102a to 102c and a part of the element region 102d. Then, an impurity element 119 is introduced into a part of the element region 102d which is not covered with mask layers 121a to 121f so that impurity regions 122a and 122b are formed (see FIG. 6A). As the impurity element, an impurity element that imparts n-type conductivity or an impurity element that imparts p-type conductivity is used. As the n-type impurity element, phosphorus (P), arsenic (As), or the like can be used. As the p-type impurity element, boron (B), aluminum (Al), gallium (Ga), or the like can be used. Here, phosphorus (P) is introduced as the impurity element into the element region 102d.

Next, a second insulating layer 123 is formed so as to cover the element region 102d and the first insulating layer 107 and the charge accumulation layer 109 that are formed above the element region 102c.

The second insulating layer 123 is formed to have either a single layer or stacked layers by a CVD method, a sputtering method, or the like, using an insulating material such as silicon oxide, silicon nitride, silicon oxynitride ($SiO_xN_y$) ($x>y>0$), or silicon nitride oxide ($SiN_xO_y$) ($x>y>0$). Alternatively, the second insulating layer 123 can be formed using aluminum oxide ($AlO_x$), hafnium oxide ($HfO_x$), or tantalum oxide ($TaO_x$). For example, in the case of providing the second insulating layer 123 to have a single layer, a silicon oxynitride film or a silicon nitride oxide film is formed at a thickness of 5 to 50 nm by a CVD method. Meanwhile, in the case of providing the second insulating layer 123 to have a three-layer structure, a silicon oxynitride film is formed as a first insulating layer, a silicon nitride film is formed as a second insulating layer, and a silicon oxynitride film is formed as a third insulating layer. Further, oxide or nitride of germanium can be used for the second insulating layer 123.

It is to be noted that the second insulating layer 123 formed above the element region 102c serves as a control insulating layer of a nonvolatile memory element which is completed subsequently, and the second insulating layer 123 formed above the element region 102d serves as a gate insulating layer of a transistor which is completed subsequently.

Next, a third insulating layer 135 is formed so as to cover the element regions 102a and 102b.

The third insulating layer 135 is formed by using any of the above-described methods used for forming the first insulating layer 105. For example, by performance of oxidation treatment, nitridation treatment, or oxynitridation treatment by high density plasma treatment on the semiconductor layer including the element isolation regions 101a to 101d, the third insulating layer 135 is formed as a silicon oxide film, a silicon nitride film, or a silicon oxynitride film on the semiconductor layer, respectively.

Here, the third insulating layer 135 is formed to a thickness of 1 to 20 nm, preferably 1 to 10 nm. For example, a silicon oxide film is formed on the surface of the semiconductor layer including the element regions 102a and 102b and the element isolation regions 101a to 101d by performance of oxidation treatment by high density plasma treatment on the semiconductor layer. Then, nitridation treatment by high density plasma treatment is performed on the silicon oxide film so that a silicon oxynitride film is formed on the surface of the silicon oxide film. In this case, the surface of the second insulating layer 123 formed above the element regions 102c and 102d is also oxidized or nitrided so that an oxide film or an oxynitride film is formed. The third insulating layer 135 formed above the element regions 102a and 102b serves as a gate insulating layer of transistors which are completed subsequently.

Next, a conductive film is formed so as to cover the third insulating layer 135 formed above the element regions 102a and 102b in the semiconductor layer and also cover the second insulating layer 123 formed above the element regions 102c and 102d. Here, an example is shown where a first conductive film and a second conductive film are sequentially stacked as the conductive film. Needless to say, the conductive film may be formed to have a single layer or a stacked structure of three layers or more.

The first conductive film and the second conductive film can be formed using an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as a main component. Alternatively, a metal nitride film obtained by nitriding the above-described metal can be used. Further, a semiconductor material typified by polycrystalline silicon doped with an impurity element such as phosphorus can also be used.

Here, a stacked structure is provided such that the first conductive film is formed using tantalum nitride and the second conductive film is stacked thereover using tungsten.

Alternatively, the first conductive film may be formed as either a single-layer film or a stacked film using tungsten nitride, molybdenum nitride, and/or titanium nitride, and the second conductive film may also be formed as either a single-layer film or a stacked film using tantalum, molybdenum, and/or titanium.

Next, the first and second conductive films which are stacked are selectively etched to be removed so that the first conductive film and the second conductive film remain above a part of the element regions 102a to 102d in the semiconductor layer. Thus, first conductive layers 124a to 124d and second conductive layers 125a to 125d which serve as gate electrode layers are formed (see FIG. 6B). It is to be noted that the first conductive layer 124c and the second conductive layer 125c formed above the element region 102c which is provided in the memory portion serve as control gate electrode layers of a nonvolatile memory element which is completed subsequently. In addition, the first conductive layers 124a, 124b, and 124d and the second conductive layers 125a, 125b, and 125d serve as gate electrode layers of transistors which are completed subsequently.

Figure 6A:
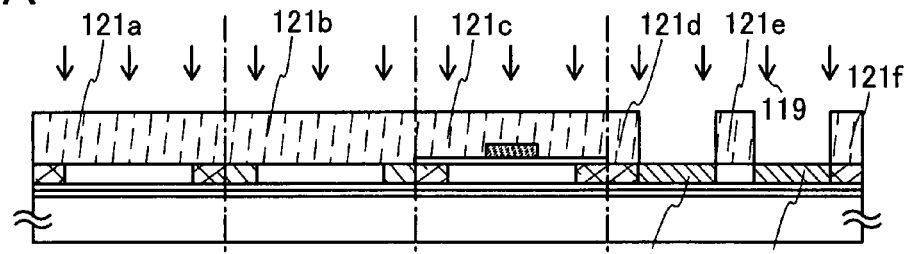
FIGS. 6A to 6E are views illustrating a manufacturing method of a semiconductor device of the present invention.

Next, mask layers 126a to 126e are selectively formed so as to cover the element regions 102a, 102c, and 102d. Then, an impurity element 127 is introduced into the element region 102b, using the mask layers 126a to 126e, the first conductive layer 124b, and the second conductive layer 125b as masks, thereby forming impurity regions (see FIG. 6C). As the impurity element, an impurity element that imparts n-type conductivity or an impurity element that imparts p-type conductivity is used. As the n-type impurity element, phosphorus (P), arsenic (As), or the like can be used. As the p-type impurity element, boron (B), aluminum (Al), gallium (Ga), or the like can be used. Here, an impurity element (e.g., boron (B)) having a conductivity type opposite to that of the impurity element which has been introduced into the element region 102d in FIG. 6A is introduced. As a result, high-concentration impurity regions 132a and 132b which form a source region and a drain region and a channel formation region 134 are formed.

Next, mask layers 128a to 128g are selectively formed so as to cover the element region 102b. Then, an impurity element 129 is introduced into the element regions 102a, 102c, and 102d, using the mask layers 128a to 128g, the first conductive layers 124a, 124c, and 124d, and the second conductive layers 125a, 125c, and 125d as masks, thereby forming impurity regions (see FIG. 6D). As the impurity element, an impurity element that imparts n-type conductivity or an impurity element that imparts p-type conductivity is used. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element.

Figure 6B:
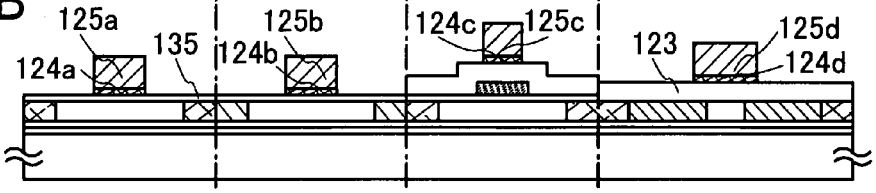
Figure 6C:
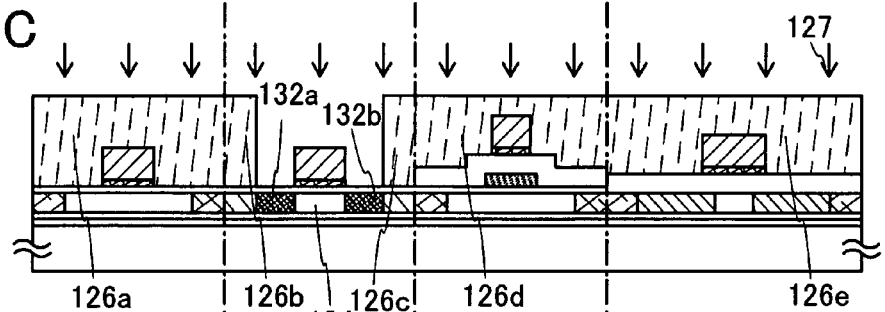
Figure 6D:
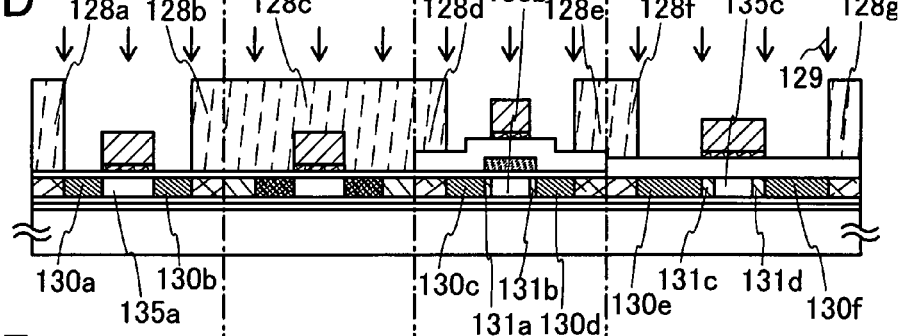
Figure 6E:
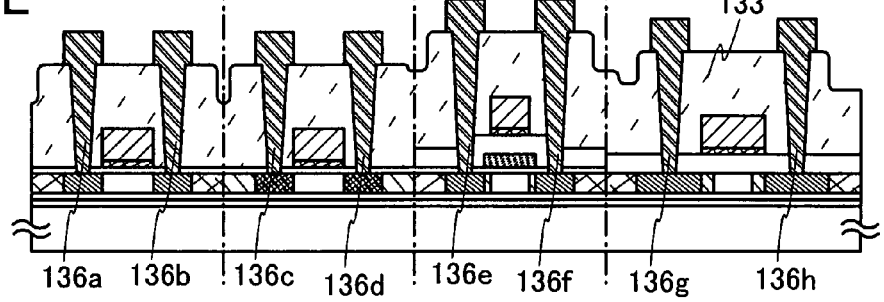

In FIG. 6D, by introduction of the impurity element 129, high-concentration impurity regions 130a and 130b which form a source region and a drain region and a channel formation region 135a are formed in the element region 102a. In the element region 102c, high-concentration impurity regions 130c and 130d which form a source region and a drain region, low-concentration impurity regions 131a and 131b which form LDD regions, and a channel formation region 135b are formed. In the element region 102d, high-concentration impurity regions 130e and 130f which form a source region and a drain region, low-concentration impurity regions 131c and 131d which form LDD regions, and a channel formation region 135c are formed.

The low-concentration impurity regions 131a and 131b formed in the element region 102c are formed by an impurity element introduced in FIG. 6D which has passed through the charge accumulation layer 109 serving as the floating gate. Thus, the channel formation region 135b is formed in a region of the element region 102c which overlaps with both of the second conductive layer 125c and the charge accumulation layer 109; the low-concentration impurity regions 131a and 131b are formed in a region of the element region 102c which overlaps with the charge accumulation layer 109 but does not overlap with the second conductive layer 125c; and the high-concentration impurity regions 130c and 130d are formed in a region of the element region 102c which overlaps with neither the charge accumulation layer 109 nor the second conductive layer 125c.

Next, an insulating layer 133 is formed so as to cover the second insulating layer 123, the third insulating layer 135, the first conductive layers 124a to 124d, and the second conductive layers 125a to 125d. Then, wiring layers 136a to 136h, which are electrically connected to the high-concentration impurity regions 130a to 130f, 132a, and 132b formed in the element regions 102a to 102d, are formed over the insulating layer 133 (see FIG. 6E).

The insulating layer 133 can be formed to have either a single layer or a stacked structure by a CVD method, a sputtering method, or the like, using an insulating layer containing oxygen or nitrogen such as silicon oxide ($SiO_x$), silicon nitride ($SiN_x$), silicon oxynitride ($SiO_xN_y$) (x>y>0), or silicon nitride oxide ($SiN_xO_y$) (x>y>0); a film containing carbon such as DLC (diamond-like carbon); an organic material such as epoxy, polyimide, polyamide, polyvinyl phenol, benzocyclobutene, or acrylic; and/or a siloxane material such as a siloxane resin.

The wiring layers 136a to 136h are formed to have either a single layer or stacked layers by a CVD method, a sputtering method, or the like, using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (Cu), and silicon (Si), or an alloy material or a compound material containing such an element as a main component. An alloy material containing aluminum as a main component corresponds to, for example, a material containing aluminum as a main component and also containing nickel, or an alloy material containing aluminum as a main component and also containing nickel and one or both of carbon and silicon. The wiring layers 136a to 136h are preferably formed to have a stacked structure of a barrier film, an aluminum silicon (Al—Si) film, and a barrier film, or a stacked structure of a barrier film, an aluminum silicon (Al—Si) film, a titanium nitride (TiN) film, and a barrier film. It is to be noted that the barrier film corresponds to a thin film made of titanium, a nitride of titanium, molybdenum, or a nitride of molybdenum. Aluminum and aluminum silicon, which have low resistance values and are inexpensive, are most suitable for the material of the wiring layers 136a to 136h. In addition, when the barrier layers are provided as the top layer and the bottom layer, generation of hillocks of aluminum or aluminum silicon can be prevented. Further, when a barrier film made of titanium which is an element having an excellent reducing property is used, even if a thin natural oxide film is formed on the crystalline semiconductor layer, the natural oxide film can be chemically reduced and thus an excellent contact between the barrier film and the crystalline semiconductor layer can be obtained.

Therefore, with the use of the present invention, a semiconductor layer can be isolated into a plurality of element regions without being divided into island shapes, and steps resulting from the edge portion of the semiconductor layer are not generated. Thus, an insulating layer can be formed over a flat semiconductor layer, and the coverage of the semiconductor layer with the insulating layer can be improved. Therefore, a semiconductor device that is a highly reliable semiconductor storage device in which defects such as a short and leakage current between a charge accumulation layer, a control gate electrode layer, a gate electrode layer, and a semiconductor layer that are caused by a coverage defect of the semiconductor layer with an insulating layer are prevented and a manufacturing method of such a semiconductor device can be provided. Accordingly, further miniaturization and higher integration of the semiconductor device having memory elements are possible, and higher performance of the semiconductor device can be achieved. In addition, because defects such as shape defects of the film can be reduced, in the manufacturing process, the semiconductor device can be manufactured with good yield.

This embodiment mode can be freely implemented in combination with any of the other embodiment modes.

Embodiment Mode 8

In this embodiment mode, examples of other highly reliable semiconductor devices having a CMOS circuit and a memory element, in which defects such as a short and leakage current between a gate electrode layer and a semiconductor layer that are caused by a coverage defect of a semiconductor layer with an insulating layer in a semiconductor element are prevented, will be described with reference to drawings. A manufacturing method of a semiconductor device in this embodiment mode will be described in detail with reference to FIGS. 7A to 7F and FIGS. 8A to 8E. This embodiment mode shows a semiconductor device in which shapes of a gate electrode layer and a control gate electrode layer differ from those in the semiconductor device in Embodiment Mode 7. It is to be noted that in a case where the same portions as the above embodiment mode are denoted, explanation thereof will be omitted.

A stack of an insulating layer 112a and an insulating layer 112b serving as a base film is formed as a base film over a substrate 100 having an insulating surface.

Next, a semiconductor layer 150 is formed over the base film. The semiconductor layer 150 may be formed at a thickness of 25 to 200 nm (preferably, 30 to 150 nm) by various methods (e.g., a sputtering method, an LPCVD method, or a plasma CVD method). In this embodiment mode, it is preferable to use a crystalline semiconductor layer which is obtained by crystallizing an amorphous semiconductor layer by laser.

The thusly obtained semiconductor layer may be doped with a small amount of an impurity element (e.g., boron or phosphorus) in order to control the threshold voltage of thin film transistors. Alternatively, such doping with the impurity element may be conducted before the step of crystallizing the amorphous semiconductor layer. When the amorphous semiconductor layer is doped with an impurity element and then thermal treatment is conducted in order to crystallize the amorphous semiconductor layer, the thermal treatment can also activate the impurity element. In addition, defects caused in doping can be remedied.

A mask is removed, and a first insulating layer 105 is formed over the semiconductor layer 150.

The first insulating layer 105 can be formed by applying thermal treatment, plasma treatment, or the like to the semiconductor layer. For example, by performance of oxidation treatment, nitridation treatment, or oxynitridation treatment by high density plasma treatment on the semiconductor layer, the first insulating layer 105 is formed as an oxide film, a nitride film, or an oxynitride film on the semiconductor layer. It is to be noted that the first insulating layer 105 may also be formed by a plasma CVD method or a sputtering method.

For example, when a semiconductor layer containing Si as a main component is used as the semiconductor layer, and oxidation treatment or nitridation treatment by high density plasma is performed on the semiconductor layer, a silicon oxide layer or a silicon nitride layer is formed as the first insulating layer 105. In addition, after performing oxidization treatment on the semiconductor layer by high density plasma treatment, nitridation treatment may be performed by performing high density plasma treatment again. In that case, a silicon oxide layer is formed to be in contact with the semiconductor layer and a nitrogen plasma-treated layer is formed on the surface of the silicon oxide layer or in the vicinity of the surface.

Here, the first insulating layer 105 is formed at a thickness of 1 to 10 nm, preferably 1 to 5 nm. For example, a silicon oxide layer with a thickness of about 3 nm is formed over the surface of the semiconductor layer by performing oxidation treatment by high density plasma on the semiconductor layer, and then nitridation treatment by high density plasma is performed thereon to form a nitrogen plasma-treated layer on the surface of the silicon oxide layer or in the vicinity of the surface. Specifically, first, a silicon oxide layer is formed at a thickness of 3 to 6 nm on the semiconductor layer by plasma treatment under an oxygen atmosphere. Subsequently, by conducting plasma treatment under a nitrogen atmosphere, a nitrogen plasma-treated layer containing a high concentration of nitrogen is provided over the surface of the silicon oxide layer or in the vicinity of the surface. Here, by conducting plasma treatment under a nitrogen atmosphere, a structure is obtained in which 20 to 50 atomic % nitrogen is contained in a region from the surface of the silicon oxide layer to a depth of about 1 nm. In the nitrogen plasma-treated layer, silicon containing oxygen and nitrogen (silicon oxynitride) is formed. At this time, it is preferable to continuously perform oxidation treatment and nitridation treatment by high density plasma without exposure to the air. By continuously conducting such high density plasma treatment, mixture of contaminants can be prevented and improvement in production efficiency can be achieved.

In this embodiment mode, the first insulating layer 105 formed over the semiconductor layer that is provided in the memory portion serves as a tunnel insulating layer of a nonvolatile memory element which is completed subsequently. Thus, the thinner the first insulating layer 105 is, the easier it will be for tunnel current to flow through the layer, and thus higher-speed operation of the memory can be achieved. In addition, the thinner the first insulating layer 105 is, the easier it will be for charges to be accumulated in a charge accumulation layer that is formed subsequently, at a low voltage, and thus lower power consumption of the semiconductor device can be achieved. Therefore, the first insulating layer 105 is preferably formed to be thin.

An impurity element is selectively added to the semiconductor-layer that is a crystalline semiconductor layer through the first insulation layer 105 to form an element isolation region. The semiconductor layer is isolated into a plurality of element regions by the element isolation region. Over the semiconductor layer, mask layers 103a, 103b, 103c, and 103d are formed, and an impurity element 104 that does not contribute to conductivity is added. By the addition of the impurity element 104 that does not contribute to conductivity, element isolation regions 651a, 651b, 651c, 651d, 651e, 651f, 651g, and 651h and element regions 102a, 102b, 102c, and 102d that are insulated and isolated from each other by those element isolation region are formed (see FIG. 7B).

Next, over the semiconductor layer, mask layers 652a, 652b, 652c, and 652d that cover the element regions 102a, 102b, 102c, and 102d and the element isolation regions 651c and 651d are formed, and an impurity element 653 that imparts p-type conductivity is added through the first insulating layer 105. By the addition of the impurity element 653 that imparts p-type conductivity, element isolation regions 101a, 101b, 101c, 101d, 101e, and 101f that are p-type impurity regions are formed in the semiconductor layer (see FIG. 7C).

Next, over the semiconductor layer, mask layers 654a, 654b, 654c, and 654d that cover the element regions 102a, 102b, 102c, and 102d and the element isolation regions 101a, 101b, 101c, 101d, 101e, and 101f are formed, and an impurity element 655 that imparts n-type conductivity is added through the first insulating layer 105. By the addition of the impurity element 655 that imparts n-type conductivity, element isolation regions 656a and 656b that are n-type impurity regions are formed in the semiconductor layer (see FIG. 7D).

In this embodiment mode, the element isolation region and the element region are provided in the continuous semiconductor layer. Accordingly, the element isolation regions 101a, 101b, 101c, 101d, 101e, and 101f and the element isolation regions 656a and 656b and the element regions 102a, 102b, 102c, and 102d that are insulated and isolated from each other by the element isolation regions are contiguous in the semiconductor layer. Thus, the surface thereof has high flatness and no steep step.

Since an impurity element is added to the semiconductor layer 150 through the first insulating layer 105 by a doping method or the like, physical energy in adding the impurity element can be controlled. Therefore, the energy in adding can be decreased to a level that does not cause damage or the like to the semiconductor layer, and the crystallinity of the semiconductor layer can be selectively lowered to form element isolation regions. It is also possible to once remove the first insulating layer 105 after forming the element isolation regions and the element regions by introduction of an impurity element and then form the first insulating layer 105 again. Further, plasma treatment may be performed on the insulating layer which is formed again so that the surface becomes densified.

The element isolation region is formed by selective addition of a first impurity element that does not contribute to conductivity and a second impurity element that imparts an opposite conductivity type to that of a source region and a drain region in the element region in order to electrically isolate elements from each other in one semiconductor layer.

As the first impurity element that does not contribute to conductivity, an impurity element of at least one or more kinds of oxygen, nitrogen, and carbon can be used. The element isolation region to which the first impurity element is added, conductivity is lowered by mixture of the first impurity element that does not contribute to conductivity, and resistance of the element isolation region is increased because its crystallinity is lowered by a physical impact (it can also be referred to as a so-called sputtering effect) on the semiconductor layer at adding. In the element isolation region with the increased resistance, electron field-effect mobility is also lowered, and accordingly, elements can be electrically isolated from each other. On the other hand, in a region to which an impurity element is not added, electron field-effect mobility that is high enough to be able to serve as an element is kept, and accordingly, the region can be used as an element region.

The element region has a source region, a drain region, and a channel formation region. The source region and the drain region are impurity regions having one conductivity type (for example, n-type impurity regions or p-type impurity regions). An impurity element that imparts an opposite conductivity type to that of the source region and the drain region in the element region is added to the element isolation region, whereby the element isolation region is made to be an impurity region having an opposite conductivity type to that of the source region and the drain region in the element region that is adjacent to the element isolation region. That is, in a case where the source region and the drain region in the element region are n-type impurity regions, the adjacent element isolation region may be formed as a p-type impurity region. Similarly, in a case where the source region and the drain region in the element region are p-type impurity regions, the adjacent element isolation region may be formed as an n-type impurity region. The element region and the element isolation region that are adjacent to each other form a PN junction. Accordingly, the element regions can be further insulated and isolated from each other by the element isolation region provided between the element regions.

One feature of the present invention is that one semiconductor layer is isolated into a plurality of element regions in the manner that resistance of the element isolation region by which the element regions are insulated and isolated from each other is increased by addition of the first impurity element that does not contribute to conductivity, and further, a PN junction is formed in a position where the element region and the element isolation region are in contact with each other by addition of the second impurity element that imparts an opposite conductivity type to that of the source region and the drain region in the element region. By the present invention, the element regions can be isolated from each other by an effect caused by each of the first impurity element and the second impurity element. Thus, a higher effect of insulation and isolation of the element can be obtained.

The resistivity of the element isolation region is preferably greater than or equal to $1 \times 10^{10}$ $\Omega \cdot$cm, and the concentration of the impurity element such as oxygen, nitrogen, or carbon is preferably greater than or equal to $1 \times 10^{20}$ $\Omega \cdot$cm$^{-3}$ and less than $4 \times 10^{22}$ $\Omega \cdot$cm$^{-3}$.

Crystallinity of the element isolation region is lowered by addition of the impurity element; therefore, it can be said that the element isolation region is made to be amorphous. On the other hand, because the element region is a crystalline semiconductor layer, in a case where a semiconductor element is formed in the element region, crystallinity of the channel formation region is higher than that of the element isolation region, and high electron field-effect mobility can be obtained as a semiconductor element.

As the impurity element added to the element isolation region, a rare gas element such as argon (Ar), neon (Ne), krypton (Kr), or xenon (Xe) may be used. By further addition of such a rare gas element that is an element having comparatively high mass as well as oxygen, nitrogen, and carbon, a physical impact on the semiconductor layer can be increased, whereby crystallinity of the element isolation region can be lowered more effectively.

The first insulating layer 105 is formed over the highly flat semiconductor layer; therefore, coverage is good and shape defects are not easily generated. Accordingly, defects such as leakage current and a short can be prevented between the charge accumulation layer 106 formed over the first insulating layer 105 and the element region 102c. Thus, a semiconductor device that is a nonvolatile semiconductor storage device of this embodiment mode can be a highly reliable semiconductor device in which defects such as a short and leakage current between the charge accumulation layer and the semiconductor layer that are caused by a coverage defect of the semiconductor layer with the first insulating layer are prevented.

A charge accumulation layer 106 is formed over the first insulating layer 105 (see FIG. 7E).

The charge accumulation layers 271, 281, and 291 can be formed using typically silicon, a silicon compound, germanium, or a germanium compound as a semiconductor material forming the charge accumulation layers 271, 281, and 291. As a silicon compound, silicon nitride, silicon nitride oxide, silicon carbide, silicon germanium containing germanium at a concentration of greater than or equal to 10 atomic %, metal nitride, metal oxide, or the like can be used. Silicon germanium is a typical example of a germanium compound, and in this case, it is preferable that germanium be contained at a concentration of greater than or equal to 10 atomic % with respect to silicon. This is because, if the concentration of germanium is less than or equal to 10 atomic %, the effect of the germanium as the constituent element would be small, and the bandgap of the charge accumulation layer would not become effectively small.

The charge accumulation layer 106 is applied to a semiconductor device according to the present invention for charge accumulation. However, other materials can be applied as long as the similar function is provided. For example, a ternary system semiconductor including germanium may be used. In addition, the semiconductor material may be hydrogenated. Further, as a layer having a function as a charge accumulation layer of a nonvolatile memory element, the charge accumulation layer can be replaced with an oxide or a nitride of the germanium or a germanium compound.

Further, metal nitride or metal oxide can be used as a material forming the charge accumulation layer 106. As metal nitride, tantalum nitride, tungsten nitride, molybdenum nitride, titanium nitride, or the like can be used. As metal oxide, tantalum oxide, titanium oxide, tin oxide, or the like can be used.

Further, the charge accumulation layer 106 may be formed using a stacked structure of the material as described above. When a layer of silicon or a silicon compound, or metal nitride or metal oxide as described above is provided on the upper layer side of the layer formed using germanium or a germanium compound, the layer can be used as a barrier layer for water resistance or chemical resistance in the manufacturing process. Therefore, the substrate can be easily handled in a photolithography step, an etching step, or a cleaning step, whereby productivity can be improved. In other words, the charge accumulation layer can be easily processed.

The first insulating layer 105 and the charge accumulation layer 106 are processed into desired shapes to form a first insulating layer 107 and a charge accumulation layer 108 over the element region 102c which is used as the memory element (see FIG. 7F). Further, a mask layer 120 is formed over the charge accumulation layer 108 and the charge accumulation layer 108 is selectively etched using the mask layer 120, thereby forming a charge accumulation layer 109 (see FIG. 8A).

Next, a second insulating layer 123 is formed so as to cover the first insulating layer 107 and the charge accumulation layer 109 formed above the element region 102d and the element region 102c.

It is to be noted that the second insulating layer 123 formed above the element region 102c serves as a control insulating layer of a nonvolatile memory element which is completed subsequently, and the second insulating layer 123 formed above the element region 102d serves as a gate insulating layer of a transistor which is completed subsequently.

Next, a third insulating layer 135 is formed so as to cover the element regions 102a and 102b.

Next, a conductive film is formed so as to cover the third insulating layer 135 formed above the element regions 102a and 102b in the semiconductor layer and also cover the second insulating layer 123 formed above the element regions 102c and 102d. Here, an example is shown where a first conductive film and a second conductive film are sequentially stacked as the conductive film. Needless to say, the conductive film may be formed to have a single layer or a stacked structure of three layers or more.

Next, the first and second conductive films which are stacked are selectively etched and removed so that the first conductive film and the second conductive film remain above a part of the element regions 102a to 102d in the semiconductor layer. Thus, first conductive layers 154a to 154d and second conductive layers 155a to 155d which serve as gate electrode layers are formed (see FIG. 8B). It is to be noted that the first conductive layer 154c and the second conductive layer 155c formed above the element region 102c which is provided in the memory portion serve as control gate electrode layers of a nonvolatile memory element which is completed subsequently. Further, the first conductive layers 154a, 154b, and 154d and the second conductive layers 155a, 155b, and 155d serve as gate electrode layers of transistors which are completed subsequently.

Next, mask layers 156a to 156e are selectively formed so as to cover the element regions 102a, 102c, and 102d. Then, an impurity element 157 is introduced into the element region 102b, using the mask layers 156a to 156e, the first conductive layer 154b, and the second conductive layer 155b as masks, thereby forming impurity regions (see FIG. 8C). As the impurity element, an impurity element that imparts n-type conductivity or an impurity element that imparts p-type conductivity is used. As the n-type impurity element, phosphorus (P), arsenic (As), or the like can be used. As the p-type impurity element, boron (B), aluminum (Al), gallium (Ga), or the like can be used. Here, an impurity element (e.g., boron (B)) is introduced. As a result, high-concentration impurity regions 162a and 162b which form a source region and a drain region, low-concentration impurity regions 164a and 164b which form LDD regions, and a channel formation region 165 are formed in the element region 102b.

Next, mask layers 158a to 158g are selectively formed so as to cover the element region 102b. Then, an impurity element 159 is introduced into the element regions 102a, 102c, and 102d, using the mask layers 158a to 158g, the first conductive layers 154a, 154c, and 154d, and the second conductive layers 155a, 155c, and 155d as masks, thereby forming impurity regions (see FIG. 8D). As the impurity element, an impurity element that imparts n-type conductivity or an impurity element that imparts p-type conductivity is used. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element.

Figure 8A:
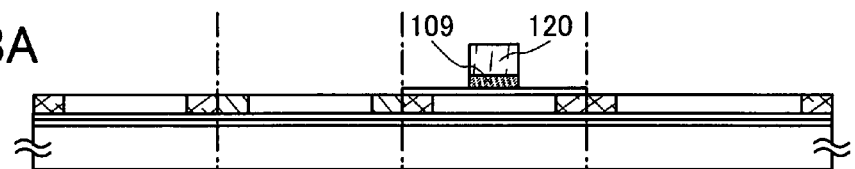
FIGS. 8A to 8E are views illustrating a manufacturing method of a semiconductor device of the present invention.
Figure 8B:
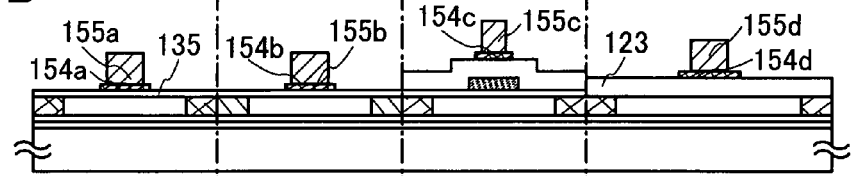
Figure 8C:
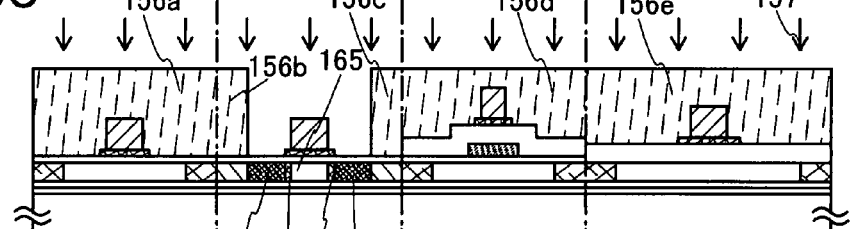
Figure 8D:
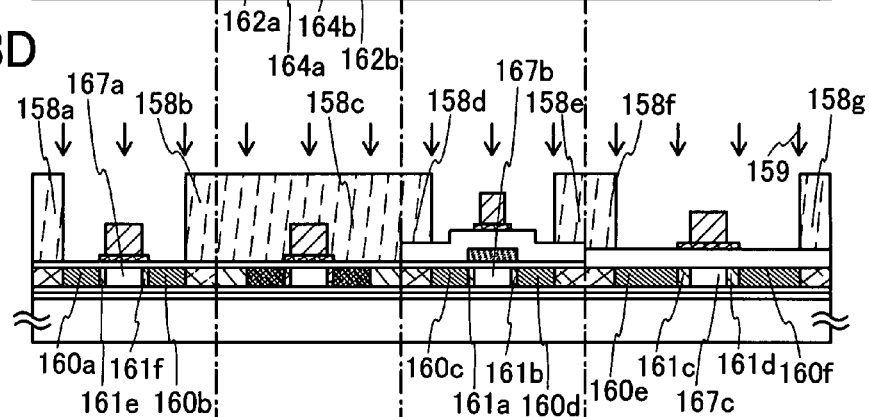
Figure 8E:
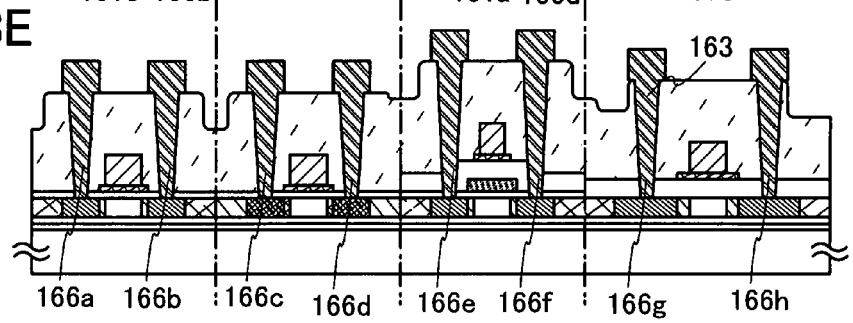

In FIG. 8D, by introduction of the impurity element, high-concentration impurity regions 160a and 160b which form a source region and a drain region, low-concentration impurity regions 161e and 161f which form LDD regions, and a channel formation region 167a are formed in the element region 102a. In the element region 102c, high-concentration impurity regions 160c and 160d which form a source region and a drain region, low-concentration impurity regions 161a and 161b which form LDD regions, and a channel formation region 167b are formed. In the element region 102d, high-concentration impurity regions 160e and 160f which form a source region and a drain region, low-concentration impurity regions 161c and 161d which form LDD regions, and a channel formation region 167c are formed.

Next, an insulating layer 163 is formed so as to cover the second insulating layer 123, the third insulating layer 135, the first conductive layers 154a to 154d, and the second conductive layers 155a to 155d. Then, wiring layers 166a to 166h, which are electrically connected to the high-concentration impurity regions 160a to 160f, 162a, and 162b formed in the element regions 102a to 102d, are formed over the insulating layer 163 (see FIG. 8E).

Therefore, with the use of the present invention, a semiconductor layer can be isolated into a plurality of element regions without being divided into island shapes, and steps resulting from the edge portion of the semiconductor layer are not generated. Thus, an insulating layer can be formed over a flat semiconductor layer, and the coverage of the semiconductor layer with the insulating layer can be improved. Therefore, a semiconductor device that is a highly reliable semiconductor storage device in which defects such as a short and leakage current between a charge accumulation layer, a control gate electrode layer, a gate electrode layer, and a semiconductor layer that are caused by a coverage defect of the semiconductor layer with an insulating layer are prevented and a manufacturing method of such a semiconductor device can be provided. Accordingly, further miniaturization and higher integration of the semiconductor device are possible, and higher performance of the semiconductor device can be achieved. In addition, because defects such as shape defects of the film can be reduced, in the manufacturing process, the semiconductor device can be manufactured with good yield.

This embodiment mode can be implemented by being combined with other embodiment modes disclosed in this specification.

Embodiment Mode 9

In this embodiment mode, an example of a highly reliable semiconductor device having a CMOS circuit and a memory element, in which defects such as a short and leakage current between a gate electrode layer and a semiconductor layer that are caused by a coverage defect of a semiconductor layer with an insulating layer in a semiconductor element are prevented, will be described with reference to drawings. A manufacturing method of a semiconductor device in this embodiment mode will be described in detail with reference to FIGS. 9A to 9C and FIGS. 10A to 10C. This embodiment mode shows a semiconductor device different from the semiconductor device in Embodiment Mode 7 in shapes of a first insulating layer and a second insulating layer. It is to be noted that the same reference numerals are used in a case where the same portions as the above embodiment mode are denoted, and explanation will be omitted.

In Embodiment Mode 9, a semiconductor device having a CMOS circuit and a memory element in this embodiment mode is manufactured to the stage shown in FIG. 6B.

Figure 9A:
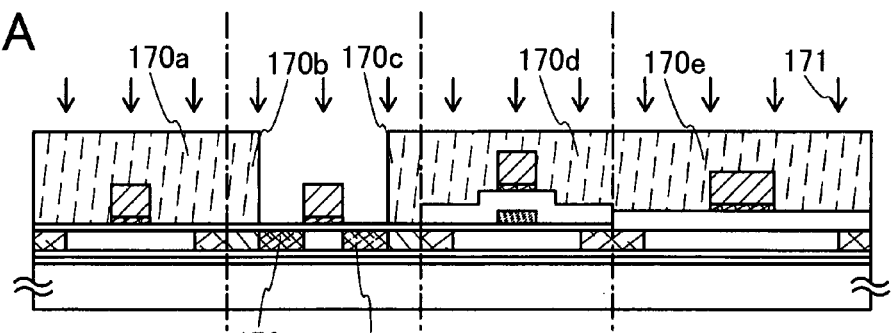
FIGS. 9A to 9C are views illustrating a manufacturing method of a semiconductor device of the present invention.

As shown in FIG. 9A, mask layers 170a, 170b, 170c, 170d, and 170e are selectively formed so as to cover the element regions 102a, 102c and 102d, and an impurity element 171 is introduced into the element region 102b using the mask layers 170a to 170e, the first conductive layer 154b, and the second conductive layer 155b as masks to form impurity regions (see FIG. 9A). As the impurity element, an impurity element that imparts n-type conductivity or an impurity element that imparts p-type conductivity is used. As the impurity element that imparts n-type conductivity, phosphorus (P), arsenic (As), or the like can be used. As the impurity element that imparts p-type that imparts n-type conductivity, boron (B), aluminum (Al), gallium (Ga), or the like can be used. Here, the impurity element (for example, boron (B)) is introduced. As a result, impurity regions 172a and 172b are formed in the element region 102b.

Figure 9B:
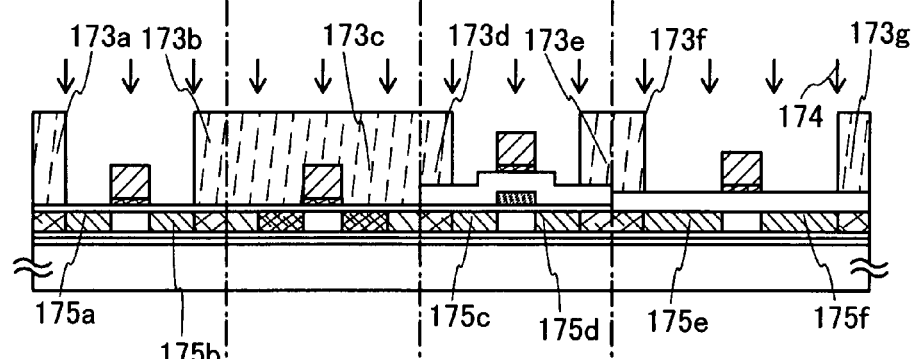
Figure 9C:
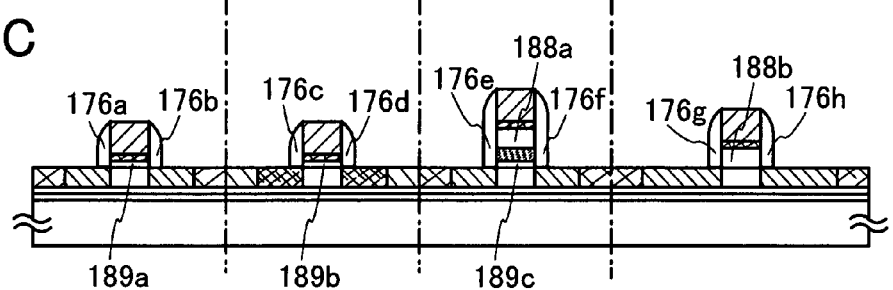

Next, mask layers 173a, 173b, 173c, 173d, 173e, 713f, and 173g are selectively formed so as to cover the element region 102b, and an impurity element 174 is introduced into the element regions 102a, 102c, and 102d using the mask layers 173a to 173g, the first conductive layers 154a, 154c, and 154d, and the second conductive layers 155a, 155c, and 155d as masks to form impurity regions (see FIG. 9B). As the impurity element, an impurity element that imparts n-type conductivity or an impurity element that imparts p-type conductivity is used. As the impurity element that imparts n-type conductivity, phosphorus (P), arsenic (As), or the like can be used. As the impurity element that imparts p-type conductivity, boron (B), aluminum (Al), gallium (Ga), or the like can be used. Here, phosphorus (P) is used as the impurity element.

In FIG. 9B, impurity regions 175a and 175b are formed in the element region 102a by the introduction of the impurity element 174. Further, impurity regions 175c and 175d are formed in the element region 102c. Furthermore, impurity regions 175e and 175f are formed in the element region 102d.

Next, a first insulating layer 107, a second insulating layer 123, and a third insulating layer 135 are selectively etched using the first conductive layers 154a to 154d and the second conductive layers 155a to 155d as masks to form insulating layers 188a and 188b and insulating layers 189a, 189b, and 189c. Insulating layers (also referred to as sidewalls) 176a, 176b, 176c, 176d, 176e, 176f, 176g, and 176h that are in contact with side surfaces of the first conductive layers 154a to 154d, the second conductive layers 155a to 155d, a charge accumulation layer 109, the insulating layers 188a and 188b, and the insulating layers 189a to 189c are formed.

Figure 10A:
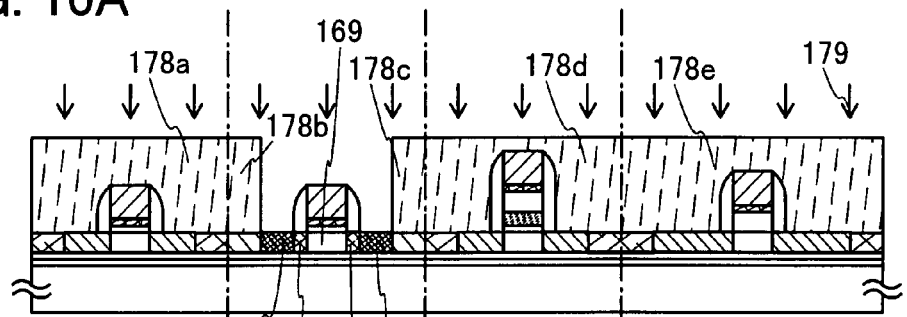
FIGS. 10A to 10C are views illustrating a manufacturing method of a semiconductor device of the present invention.

As shown in FIG. 10A, mask layers 178a, 178b, 178c, 178d, and 178e are selectively formed so as to cover the element regions 102a, 102c and 102d, and an impurity element 179 is introduced into the element region 102b using the mask layers 178a to 178e, the first conductive layer 154b, the second conductive layer 155b, and the insulating layers 176c, 176d, and 189a as masks to form impurity regions (see FIG. 10A). As the impurity element, an impurity element that imparts n-type conductivity or an impurity element that imparts p-type conductivity is used. As the impurity element that imparts n-type conductivity, phosphorus (P), arsenic (As), or the like can be used. As the impurity element that imparts p-type conductivity, boron (B), aluminum (Al), gallium (Ga), or the like can be used. Here, the impurity element (for example, boron (B)) is introduced. As a result, high-concentration impurity regions 180a and 180b forming a source region and a drain region, low-concentration impurity regions 187a and 187b forming LDD regions, and a channel formation region 169 are formed in the element region 102b.

Figure 10B:
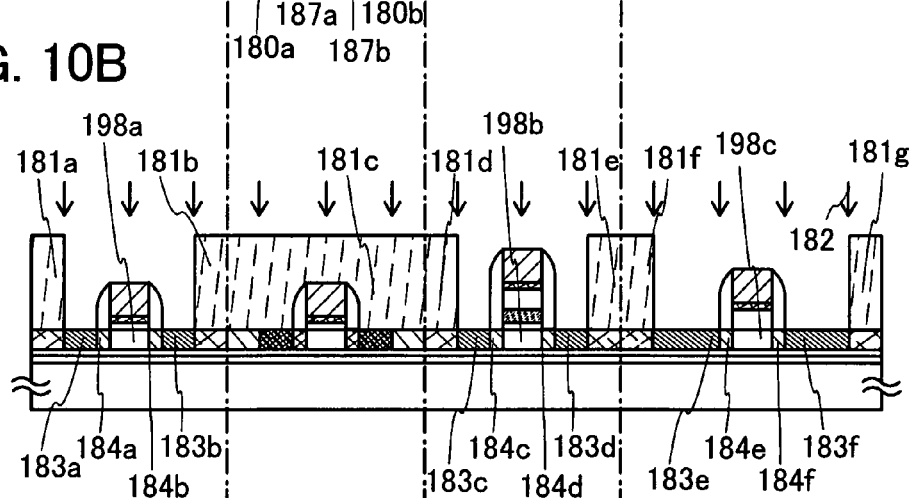
Figure 10C:
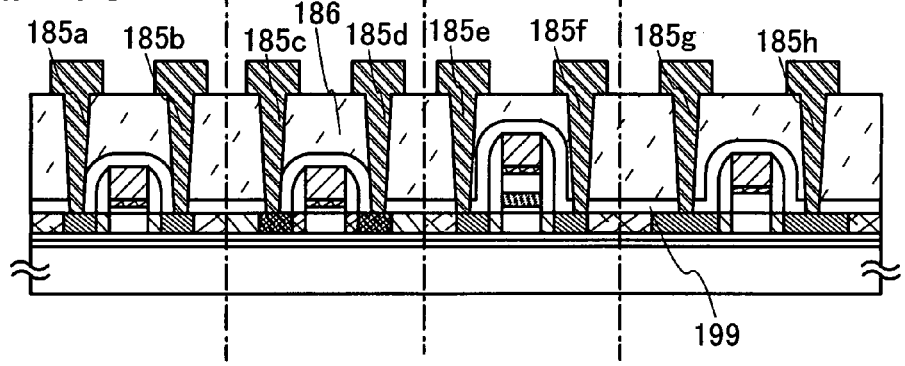

Next, mask layers 181a, 181b, 181c, 181d, 181e, 181f, and 181g are selectively formed so as to cover the element region 102b, and an impurity element 182 is introduced into the element regions 102a, 102c, and 102d using the mask layers 181a to 181g, the first conductive layers 154a, 154c, and 154d, the second conductive layers 155a, 155c, and 155d, and the insulating layers 176a, 176b, 176e, 176f, 176g, and 176h as masks to form impurity regions (see FIG. 10B). As the impurity element, an impurity element that imparts n-type conductivity or an impurity element that imparts p-type conductivity is used. As the impurity element that imparts n-type conductivity, phosphorus (P), arsenic (As), or the like can be used. As the impurity element that imparts p-type conductivity, boron (B), aluminum (Al), gallium (Ga), or the like can be used. Here, phosphorus (P) is used as the impurity element.

In FIG. 10B, by the introduction of the impurity element, high-concentration impurity regions 183a and 183b forming a source region and a drain region, low-concentration impurity regions 184a and 184b forming LDD regions, and a channel formation region 198a are formed in the element region 102a. Further, high-concentration impurity regions 183c and 183d forming a source region and a drain region, low-concentration impurity regions 184c and 184d forming LDD regions, and a channel formation region 198b are formed in the element region 102c. Furthermore, high-concentration impurity regions 183e and 183f forming a source region and a drain region, low-concentration impurity regions 184e and 184f forming LDD regions, and a channel formation region 198c are formed in the element region 102d.

Then, insulating layers 199 and 186 are formed so as to cover the first conductive layers 154a to 154d, the second conductive layers 155a to 155d, and the insulating layers 176a to 176h. Over the insulating layers 199 and 186, wiring layers 185a, 185b, 185c, 185d, 185e, 185f, 185g, and 185h that are electrically connected to the high-concentration impurity regions 183a to 183f, 180a and 180b that are formed in the element regions 102a, 102b, 102c, and 102d are formed (see FIG. 10C).

Also in the semiconductor element in this embodiment mode, an element isolation region including first and second impurity elements is formed in the semiconductor layer, and element regions in which element isolation is performed are used.

The element isolation region is formed by selective addition of a first impurity element that does not contribute to conductivity and a second impurity element that imparts an opposite conductivity type to that of a source region and a drain region in the element region in order to electrically isolate elements from each other in one semiconductor layer.

As the first impurity element that does not contribute to conductivity, an impurity element of at least one or more kinds of oxygen, nitrogen, and carbon can be used. The element isolation region to which the first impurity element is added, conductivity is lowered by mixture of the first impurity element that does not contribute to conductivity, and resistance of the element isolation region is increased because its crystallinity is lowered by a physical impact (it can also be referred to as a so-called sputtering effect) on the semiconductor layer at adding. In the element isolation region with the increased resistance, electron field-effect mobility is also lowered, and accordingly, elements can be electrically isolated from each other. On the other hand, in a region to which an impurity element is not added, electron field-effect mobility that is high enough to be able to serve as an element is kept, and accordingly, the region can be used as an element region.

The element region has a source region, a drain region, and a channel formation region. The source region and the drain region are impurity regions having one conductivity type (for example, n-type impurity regions or p-type impurity regions). An impurity element that imparts an opposite conductivity type to that of the source region and the drain region in the element region is added to the element isolation region, whereby the element isolation region is made to be an impurity region having an opposite conductivity type to that of the source region and the drain region in the element region that is adjacent to the element isolation region. That is, in a case where the source region and the drain region in the element region are n-type impurity regions, the adjacent element isolation region may be formed as a p-type impurity region. Similarly, in a case where the source region and the drain region in the element region are p-type impurity regions, the adjacent element isolation region may be formed as an n-type impurity region. The element region and the element isolation region that are adjacent to each other form a PN junction. Accordingly, the element regions can be further insulated and isolated from each other by the element isolation region provided between the element regions.

One feature of the present invention is that one semiconductor layer is isolated into a plurality of element regions in the manner that resistance of the element isolation region by which the element regions are insulated and isolated from each other is increased by addition of the first impurity element that does not contribute to conductivity, and further, a PN junction is formed in a position where the element region and the element isolation region are in contact with each other by addition of the second impurity element that imparts an opposite conductivity type to that of the source region and the drain region in the element region. By the present invention, the element regions can be isolated from each other by an effect caused by each of the first impurity element and the second impurity element. Thus, a higher effect of insulation and isolation of the element can be obtained.

The resistivity of the element isolation region is preferably greater than or equal to $1 \times 10^{10}$ $\Omega \cdot$cm, and the concentration of the impurity element such as oxygen, nitrogen, or carbon is preferably greater than or equal to $1 \times 10^{20}$ $\Omega \cdot$cm$^{-3}$ and less than $4 \times 10^{22}$ $\Omega \cdot$cm$^{-3}$.

Crystallinity of the element isolation region is lowered by addition of the impurity element; therefore, it can be said that the element isolation region is made to be amorphous. On the other hand, because the element region is a crystalline semiconductor layer, in a case where a semiconductor element is formed in the element region, crystallinity of the channel formation region is higher than that of the element isolation region, and high electron field-effect mobility can be obtained as a semiconductor element.

As the impurity element added to the element isolation region, a rare gas element such as argon (Ar), neon (Ne), krypton (Kr), or xenon (Xe) may be used. By further addition of such a rare gas element that is an element having comparatively high mass as well as oxygen, nitrogen, and carbon, a physical impact on the semiconductor layer can be increased, whereby crystallinity of the element isolation region can be lowered more effectively.

Therefore, with the use of the present invention, a semiconductor layer can be isolated into a plurality of element regions without being divided into island shapes, and steps resulting from the edge portion of the semiconductor layer are not generated. Thus, an insulating layer can be formed over a flat semiconductor layer, and the coverage of the semiconductor layer with the insulating layer can be improved. Therefore, a semiconductor device that is a highly reliable semiconductor storage device in which defects such as a short and leakage current between a charge accumulation layer, a control gate electrode layer, a gate electrode layer, and a semiconductor layer that are caused by a coverage defect of the semiconductor layer with an insulating layer are prevented and a manufacturing method of such a semiconductor device can be provided. Accordingly, further miniaturization and higher integration of the semiconductor device having memory elements are possible, and higher performance of the semiconductor device can be achieved. In addition, because defects such as shape defects of the film can be reduced, in the manufacturing process, the semiconductor device can be manufactured with good yield.

This embodiment mode can be combined with other embodiment modes disclosed in this specification.

Embodiment Mode 10

In this embodiment mode, as a semiconductor device in which defects such as a short and leakage current between a charge accumulation layer, a control gate electrode layer, and a semiconductor layer that are caused by a coverage defect of a semiconductor layer with an insulating layer are prevented, an example of other nonvolatile semiconductor storage devices will be described with reference to drawings.

The memory elements shown in Embodiment Modes 2 to 9 each show an example in which metal or a semiconductor material is used as a charge accumulation layer. In this embodiment mode, an insulating layer, for example, an insulating layer including a conductive particle or a semiconductor particle such as silicon or germanium is used as a charge accumulation layer.

The charge accumulation layer is applied to a nonvolatile semiconductor storage device according to the present invention for charge accumulation. However, other materials can be applied as long as they have a similar function. The charge accumulation layer can be formed using an insulating layer having a defect that traps charges in a film or an insulating layer including a conductive particle or a semiconductor particle such as silicon or germanium. Representative examples of such materials are a silicon compound and a germanium compound. As a silicon compound, there are silicon nitride to which oxygen is added, silicon oxide to which nitrogen is added, silicon nitride to which oxygen and hydrogen are added, silicon oxide to which nitrogen and hydrogen are added, and the like. As a germanium compound, there are germanium nitride, germanium oxide, germanium nitride to which oxygen is added, germanium oxide to which nitrogen is added, germanium nitride to which oxygen and hydrogen are added, germanium oxide to which nitrogen and hydrogen are added, and the like. Further, a germanium particle or a silicon germanium particle may be included in the charge accumulation layer.

Also in the memory element in this embodiment mode, an element isolation region including first and second impurity elements is formed in the semiconductor layer, and element regions that are insulated and isolated are used.

The element isolation region is formed by selective addition of a first impurity element that does not contribute to conductivity and a second impurity element that imparts an opposite conductivity type to that of a source region and a drain region in the element region in order to electrically isolate elements from each other in one semiconductor layer.

As the first impurity element that does not contribute to conductivity, an impurity element of at least one or more kinds of oxygen, nitrogen, and carbon can be used. The element isolation region to which the first impurity element is added, conductivity is lowered by mixture of the first impurity element that does not contribute to conductivity, and resistance of the element isolation region is increased because its crystallinity is lowered by a physical impact (it can also be referred to as a so-called sputtering effect) on the semiconductor layer at adding. In the element isolation region with the increased resistance, electron field-effect mobility is also lowered, and accordingly, elements can be electrically isolated from each other. On the other hand, in a region to which an impurity element is not added, electron field-effect mobility that is high enough to be able to serve as an element is kept, and accordingly, the region can be used as an element region.

The element region has a source region, a drain region, and a channel formation region. The source region and the drain region are impurity regions having one conductivity type (for example, n-type impurity regions or p-type impurity regions). An impurity element that imparts an opposite conductivity type to that of the source region and the drain region in the element region is added to the element isolation region, whereby the element isolation region is made to be an impurity region having an opposite conductivity type to that of the source region and the drain region in the element region that is adjacent to the element isolation region. That is, in a case where the source region and the drain region in the element region are n-type impurity regions, the adjacent element isolation region may be formed as a p-type impurity region. Similarly, in a case where the source region and the drain region in the element region are p-type impurity regions, the adjacent element isolation region may be formed as an n-type impurity region. The element region and the element isolation region that are adjacent to each other form a PN junction. Accordingly, the element regions can be further insulated and isolated from each other by the element isolation region provided between the element regions.

One feature of the present invention is that one semiconductor layer is isolated into a plurality of element regions in the manner that resistance of the element isolation region by which the element regions are insulated and isolated from each other is increased by addition of the first impurity element that does not contribute to conductivity, and further, PN junctions are successively (repeatedly) formed in positions where the element region and the element isolation region are in contact with each other by addition of the second impurity element that imparts an opposite conductivity type to that of the source region and the drain region in the element region. By the present invention, the element regions can be isolated from each other by an effect caused by each of the first impurity element and the second impurity element. Thus, a higher effect of insulation and isolation of the element can be obtained.

The resistivity of the element isolation region is preferably greater than or equal to $1 \times 10^{10}$ $\Omega \cdot cm$, and the concentration of the impurity element such as oxygen, nitrogen, or carbon is preferably greater than or equal to $1 \times 10^{20}$ $\Omega \cdot cm^{-3}$ and less than $4 \times 10^{22}$ $\Omega \cdot cm^{-3}$.

Crystallinity of the element isolation region is lowered by addition of the impurity element; therefore, it can be said that the element isolation region is made to be amorphous. On the other hand, because the element region is a crystalline semiconductor layer, in a case where a semiconductor element is formed in the element region, crystallinity of the channel formation region is higher than that of the element isolation region, and high electron field-effect mobility can be obtained as a semiconductor element.

As the impurity element added to the element isolation region, a rare gas element such as argon (Ar), neon (Ne), krypton (Kr), or xenon (Xe) may be used. By further addition of such a rare gas element that is an element having comparatively high mass as well as oxygen, nitrogen, and carbon, a physical impact on the semiconductor layer can be increased, whereby crystallinity of the element isolation region can be lowered more effectively.

Therefore, with the use of the present invention, a semiconductor layer can be isolated into a plurality of element regions without being divided into island shapes, and steps resulting from the edge portion of the semiconductor layer are not generated. Thus, an insulating layer can be formed over a flat semiconductor layer, and the coverage of the semiconductor layer with the insulating layer can be improved. Therefore, a semiconductor device that is a highly reliable semiconductor storage device in which defects such as a short and leakage current between a gate electrode layer and a semiconductor layer that are caused by a coverage defect of the semiconductor layer with an insulating layer are prevented and a manufacturing method of such a semiconductor device can be provided. Accordingly, further miniaturization and higher integration of the semiconductor device having memory elements are possible, and higher performance of the semiconductor device can be achieved. In addition, because defects such as shape defects of the film can be reduced, in the manufacturing process, the semiconductor device can be manufactured with good yield.

This embodiment mode can be implemented by being combined with other embodiment modes disclosed in this specification.

Embodiment Mode 11

In this embodiment mode, an example of a highly reliable semiconductor device in which defects such as a short and leakage current between a gate electrode layer and a semiconductor layer that are caused by a coverage defect of a semiconductor layer with an insulating layer in a semiconductor element are prevented, will be described with reference to drawings.

Embodiment Modes 1 to 10 show an example where a semiconductor layer is provided over a substrate having an insulating surface. However, this embodiment mode shows an example of using a semiconductor substrate formed of Si or the like or an SOI substrate instead of the above-described thin film processes.

An SOI (Silicon on Insulator) substrate in which a single crystalline semiconductor layer is formed over an insulating surface can be formed using a method performed by sticking of a wafer or a method called SIMOX in which an insulating layer is formed inside by implantation of an oxygen ion into a Si substrate.

Also in the memory element in this embodiment mode, an element isolation region including first and second impurity elements is formed in the semiconductor layer, and element regions in which element isolation is performed are used.

The element isolation region is formed by selective addition of a first impurity element that does not contribute to conductivity and a second impurity element that imparts an opposite conductivity type to that of a source region and a drain region in the element region in order to electrically isolate elements from each other in one semiconductor layer.

As the first impurity element that does not contribute to conductivity, an impurity element of at least one or more kinds of oxygen, nitrogen, and carbon can be used. The element isolation region to which the first impurity element is added, conductivity is lowered by mixture of the first impurity element that does not contribute to conductivity, and resistance of the element isolation region is increased because its crystallinity is lowered by a physical impact (it can also be referred to as a so-called sputtering effect) on the semiconductor layer at adding. In the element isolation region with the increased resistance, electron field-effect mobility is also lowered, and accordingly, elements can be electrically isolated from each other. On the other hand, in a region to which an impurity element is not added, electron field-effect mobility that is high enough to be able to serve as an element is kept, and accordingly, the region can be used as an element region.

The element region has a source region, a drain region, and a channel formation region. The source region and the drain region are impurity regions having one conductivity type (for example, n-type impurity regions or p-type impurity regions). An impurity element that imparts an opposite conductivity type to that of the source region and the drain region in the element region is added to the element isolation region, whereby the element isolation region is made to be an impurity region having an opposite conductivity type to that of the source region and the drain region in the element region that is adjacent to the element isolation region. That is, in a case where the source region and the drain region in the element region are n-type impurity regions, the adjacent element isolation region may be formed as a p-type impurity region. Similarly, in a case where the source region and the drain region in the element region are p-type impurity regions, the adjacent element isolation region may be formed as an n-type impurity region. The element region and the element isolation region that are adjacent to each other form a PN junction. Accordingly, the element regions can be further insulated and isolated from each other by the element isolation region provided between the element regions.

One feature of the present invention is that one semiconductor layer is isolated into a plurality of element regions in the manner that resistance of the element isolation region by which the element regions are insulated and isolated from each other is increased by addition of the first impurity element that does not contribute to conductivity, and further, PN junctions are successively (repeatedly) formed in positions where the element region and the element isolation region are in contact with each other by addition of the second impurity element that imparts an opposite conductivity type to that of the source region and the drain region in the element region. By the present invention, the element regions can be isolated from each other by an effect caused by each of the first impurity element and the second impurity element. Thus, a higher effect of insulation and isolation of the element can be obtained.

The resistivity of the element isolation region is preferably greater than or equal to $1\times10^{10}$ $\Omega\cdot$cm, and the concentration of the impurity element such as oxygen, nitrogen, or carbon is preferably greater than or equal to $1\times10^{20}$ $\Omega\cdot$cm$^{-3}$ and less than $4\times10^{22}$ $\Omega\cdot$cm$^{-3}$.

Crystallinity of the element isolation region is lowered by addition of the impurity element; therefore, it can be said that the element isolation region is made to be amorphous. On the other hand, because the element region is a crystalline semiconductor layer, in a case where a semiconductor element is formed in the element region, crystallinity of the channel formation region is higher than that of the element isolation region, and high electron field-effect mobility can be obtained as a semiconductor element.

As the impurity element added to the element isolation region, a rare gas element such as argon (Ar), neon (Ne), krypton (Kr), or xenon (Xe) may be used. By further addition of such a rare gas element that is an element having comparatively high mass as well as oxygen, nitrogen, and carbon, a physical impact on the semiconductor layer can be increased, whereby crystallinity of the element isolation region can be lowered more effectively.

Therefore, with the use of the present invention, a semiconductor layer can be isolated into a plurality of element regions without being divided into island shapes. Further, volume expansion of the element isolation region does not occur because thermal treatment at high temperature is not performed, whereby flatness of the surface of the semiconductor layer (or a semiconductor substrate) is well maintained. Steps resulting from the edge portion of the semiconductor layer are not generated. Thus, an insulating layer is formed over a flat semiconductor layer, leading to improvement in coverage of the semiconductor layer with the insulating layer. Therefore, a semiconductor device that is a highly reliable nonvolatile semiconductor storage device in which defects such as a short and leakage current between a charge accumulation layer, a control gate electrode layer, a gate electrode layer, and a semiconductor layer that are caused by a coverage defect of the semiconductor layer with an insulating layer are prevented and a manufacturing method of such a semiconductor device can be provided without conducting a complicated manufacturing process. Accordingly, further miniaturization and higher integration of the semiconductor device are possible, and higher performance of the semiconductor device can be achieved. In addition, since such defects caused by shape defects of the film can be reduced, in the manufacturing process, the semiconductor device can be manufactured with good yield.

This embodiment mode can be implemented by being combined with other embodiment modes disclosed in this specification.

Embodiment Mode 12

In this embodiment mode, examples of the application example of a semiconductor device capable of wireless data communication, which includes the above-described nonvolatile semiconductor storage device formed using the present invention and the like, will be described. A semiconductor device capable of wireless data communication is also called an RFID tag, an ID tag, an IC tag, an IC chip, an RF tag, a wireless tag, an electronic tag, or a wireless chip depending on the use application.

Figure 22A:
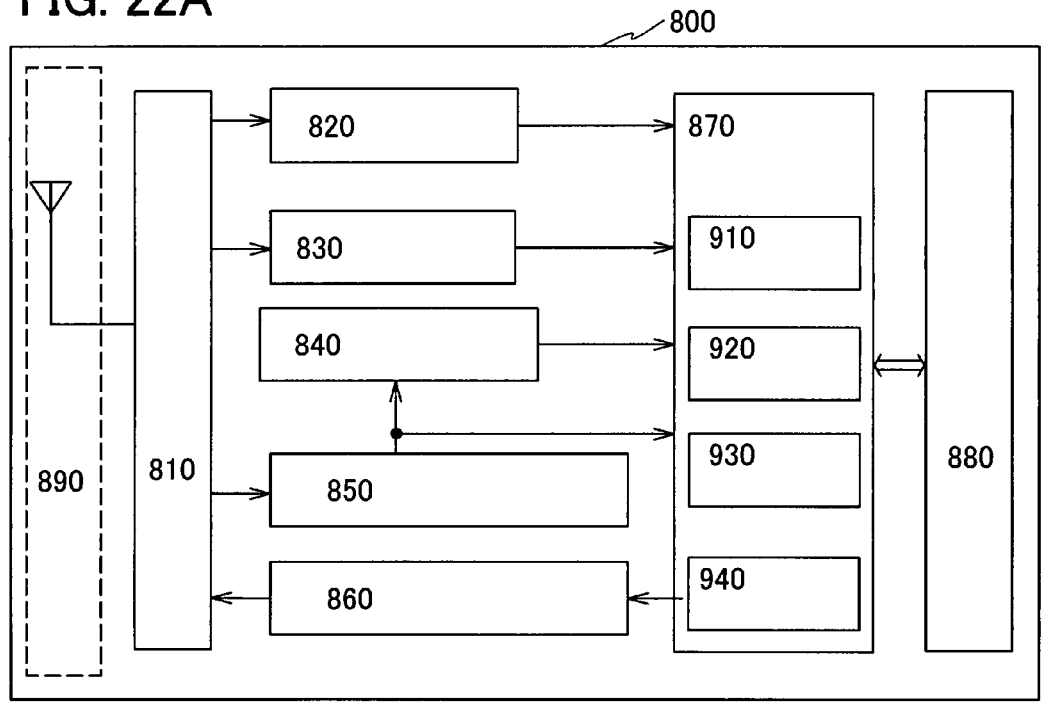
FIGS. 22A to 22C are views illustrating application examples of a semiconductor device of the present invention.

A semiconductor device 800 has a function of wireless data communication, and includes a high-frequency circuit 810, a power supply circuit 820, a reset circuit 830, a clock generation circuit 840, a data demodulation circuit 850, a data modulation circuit 860, a control circuit 870 for controlling other circuits, a memory circuit 880, and an antenna 890 (FIG. 22A). The high-frequency circuit 810 is a circuit which receives signals from the antenna 890, and outputs signals which are received from the data modulation circuit 860 to the antenna 890; the power supply circuit 820 is a circuit which generates power supply potentials from the signals received; the reset circuit 830 is a circuit which generates reset signals; the clock generation circuit 840 is a circuit which generates various clock signals based on the signals input from the antenna 890; the data demodulation circuit 850 is a circuit which demodulates the signals received and outputs them to the control circuit 870; and the data modulation circuit 860 is a circuit which modulates the signals received from the control circuit 870. The control circuit 870 includes, for example, a code extraction circuit 910, a code judging circuit 920, a CRC judging circuit 930, and an output unit circuit 940. It is to be noted that the code extraction circuit 910 is a circuit which extracts a plurality of codes included in the instructions transmitted to the control circuit 870; the code judging circuit 920 is a circuit which judges the content of the instructions by comparing the extracted code with a reference code; and the CRC judging circuit 930 is a circuit which detects the presence of transmission errors or the like based on the judged code.

Next, an example of the operation of the above-described semiconductor device is described. First, the antenna 890 receives a radio signal. When the radio signal is transmitted to the power supply circuit 820 through the high-frequency circuit 810, the power supply circuit 820 generates a high power supply potential (hereinafter referred to as VDD). VDD is supplied to each circuit included in the semiconductor device 800. In addition, a signal transmitted to the data demodulation circuit 850 through the high-frequency circuit 810 is demodulated (hereinafter the signal is referred to as a demodulated signal). Further, a signal transmitted to the reset circuit 830 through the high-frequency circuit 810 and the demodulated signal which has passed through the clock generation circuit 840 are transmitted to the control circuit 870. The signals transmitted to the control circuit 870 are analyzed by the code extraction circuit 910, the code judging circuit 920, the CRC judging circuit 930, and the like. Then, data on the semiconductor device which is stored in the memory circuit 880 is output in response to the analyzed signal. The output data of the semiconductor device is encoded in the output unit circuit 940. Further, the encoded data of the semiconductor device 800 is modulated in the data modulation circuit 860, and then transmitted as a radio signal through the antenna 890. Note that the low power supply potential (hereinafter referred to as VSS) is common to the plurality of circuits included in the semiconductor device 800; therefore, GND can be used as the VSS. In addition, the nonvolatile semiconductor memory device and the like formed using the invention can be applied to the memory circuit 880.

In this manner, by communicating signals between the semiconductor device 800 and a reader/writer, data on the semiconductor device can be read out.

The semiconductor device 800 may be either of a type where power supply to each circuit is conducted by using electromagnetic waves without providing a built-in battery, or of a built-in battery type where power supply to each circuit is conducted by using both electromagnetic waves and a built-in battery.

Figure 22B:
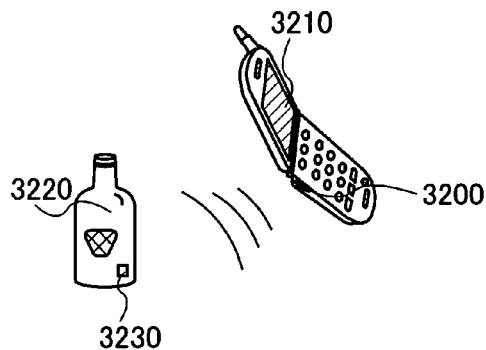
Figure 22C:
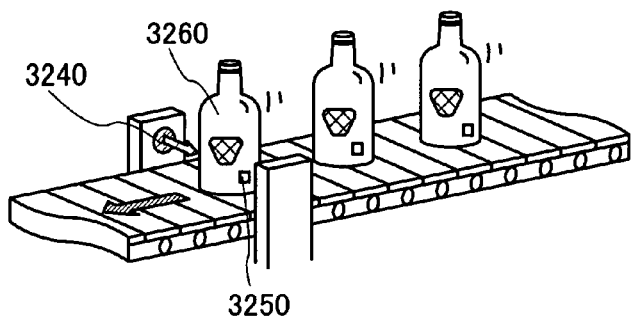

Next, examples of the application of the semiconductor device which can perform wireless data communication are described. A side surface of a portable terminal which includes a display portion 3210 is provided with a reader/writer 3200, and a side surface of a product 3220 is provided with a semiconductor device 3230 (FIG. 22B). When the reader/writer 3200 is put close to the semiconductor device 3230 provided on the product 3220, data on the raw material or source of the product, inspection result in each production step, history of the distribution process, product description, and the like is displayed on the display portion 3210. In addition, when carrying a product 3260 on a belt conveyor, inspection of the product 3260 can be conducted by using a reader/writer 3240 and a semiconductor device 3250 provided on the product 3260 (FIG. 22C). In this manner, by using the semiconductor device for a system, data acquisition can be easily conducted, and thus a higher function and higher added value can be realized.

A nonvolatile semiconductor storage device or the like which is a semiconductor device formed using the present invention can be applied to various fields of electronic devices having memories. For example, the nonvolatile semiconductor storage device of the present invention can be applied to electronic devices such as cameras (e.g., video cameras or digital cameras), goggle displays (e.g., head mounted displays), navigation systems, audio reproducing apparatuses (e.g., car audio or audio component sets), computers, game machines, portable information terminals (e.g., mobile computers, mobile phones, portable game machines, or electronic books), and image reproducing devices provided with storage media (specifically, a device for reproducing the content of a storage medium such as a DVD (Digital Versatile Disc) and having a display for displaying the reproduced image). FIGS. 23A to 23E show specific examples of such electronic devices.

Figure 23A:
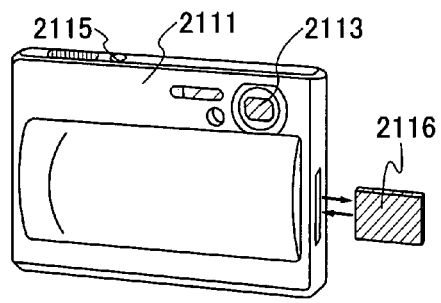
FIGS. 23A to 23E are views illustrating application examples of a semiconductor device of the present invention.
Figure 23B:
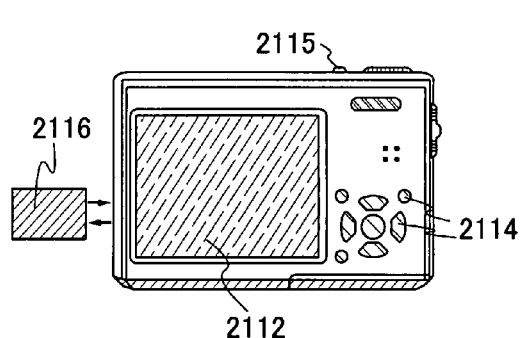

FIGS. 23A and 23B show digital cameras. FIG. 23B shows a rear side of FIG. 23A. This digital camera includes a housing 2111, a display portion 2112, a lens 2113, operating keys 2114, a shutter 2115, and the like. In addition, the digital camera also includes a removable nonvolatile memory 2116, and data picked up by the digital camera is stored in the memory 2116. A nonvolatile semiconductor storage device or the like which is a semiconductor device formed using the present invention can be applied to the memory 1225.

Figure 23C:
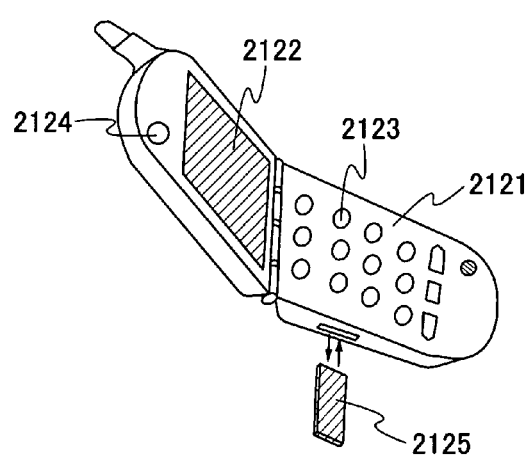

FIG. 23C shows a mobile phone which is one typical example of a portable terminal. This mobile phone includes a housing 2121, a display portion 2122, operating keys 2123, and the like. In addition, the mobile phone also includes a removable nonvolatile memory 2125, and data such as the phone number of the mobile phone, image data, audio data, and the like can be stored in the memory 2125 and reproduced. A nonvolatile semiconductor storage device or the like which is a semiconductor device formed using the present invention can be applied to the memory 2125.

Figure 23D:
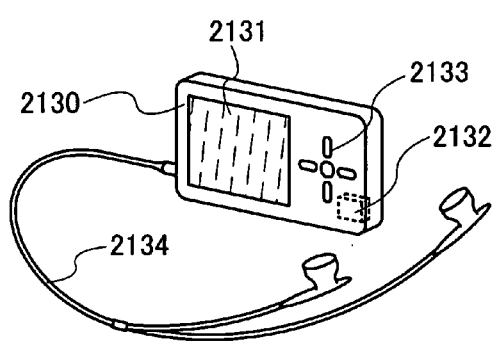

FIG. 23D shows a digital player which is one typical example of an audio device. The digital player shown in FIG. 23D includes a main body 2130, a display portion 2131, a memory portion 2132, operating portions 2133, a pair of earphones 2134, and the like. It is to be noted that instead of the pair of earphones 2134, headphones or wireless earphones can be used. A nonvolatile semiconductor storage device or the like that is a semiconductor device formed using the present invention can be applied to the memory portion 2132. In addition, by using a NAND-type nonvolatile memory with a storage capacity of 20 to 200 gigabytes (GB), and operating the operating portions 2133, images or audio (music) can be recorded and reproduced. It is to be noted that by displaying white text on a black background of the display portion 2131, power consumption can be suppressed. This is particularly effective for the portable audio device. Note also that the nonvolatile semiconductor storage device provided in the memory portion 2132 may be removable.

Figure 23E:
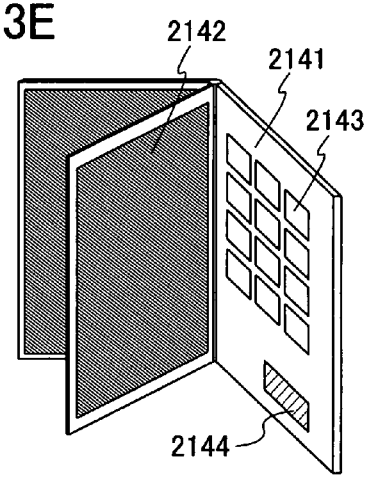

FIG. 23E shows an e-book device (also called an e-book reader). This e-book device includes a main body 2141, a display portion 2142, operating keys 2143, and a memory portion 2144. In addition, a modem may be built into the main body 2141, or a structure capable of wireless data transmission/reception may be employed. A nonvolatile semiconductor storage device or the like which is a semiconductor device formed using the present invention can be applied to the memory portion 2144. In addition, by using a NAND-type nonvolatile memory with a storage capacity of 20 to 200 gigabytes (GB), and operating the operating keys 2143, images or audio (music) can be recorded and reproduced. It is to be noted that the nonvolatile semiconductor storage device provided in the memory portion 2144 may be removable.

As described above, the applicable range of the semiconductor device of the present invention (in particular, a nonvolatile semiconductor storage device or the like which is a semiconductor device formed using the present invention) is so wide that the semiconductor device can be applied to various fields of electronic devices having memories.

Embodiment Mode 13

According to the present invention, a semiconductor device serving as a chip including a processor circuit (hereinafter also called a processor chip, a wireless chip, a wireless processor, a wireless memory, or a wireless tag) can be formed. The semiconductor device of the present invention can be used for various applications. For example, the present invention can be applied to bills, coins, securities, documents, bearer bonds, packaging containers, books, storage media, personal belongings, vehicles, foods, clothes, healthcare items, consumer products, medicals, electronic devices, and the like.

A semiconductor device having memory elements formed using the present invention can be freely transferred to various substrates. Therefore, inexpensive materials can be selected for the substrate, and the semiconductor device can be provided with various functions according to the intended use, and further, the semiconductor device can be manufactured at low cost. Therefore, since a chip including a processor circuit according to the present invention has characteristics of a low cost, compact size, thin body, and lightweight, it is suitable for bills, coins, books which are often carried about, personal belongings, clothes, and the like.

Figure 21A:
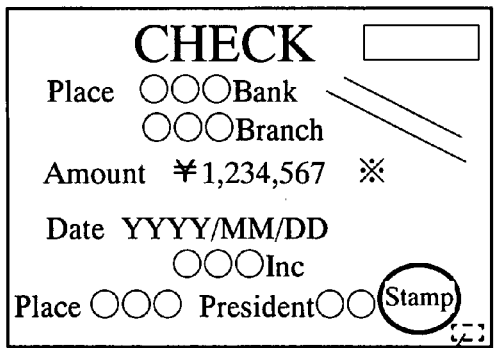
FIGS. 21A to 21G are views illustrating application examples of a semiconductor device of the present invention.
Figure 21B:
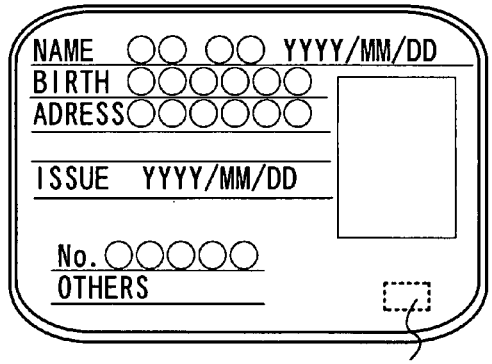
Figure 21C:
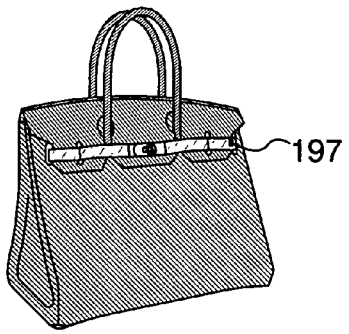
Figure 21D:
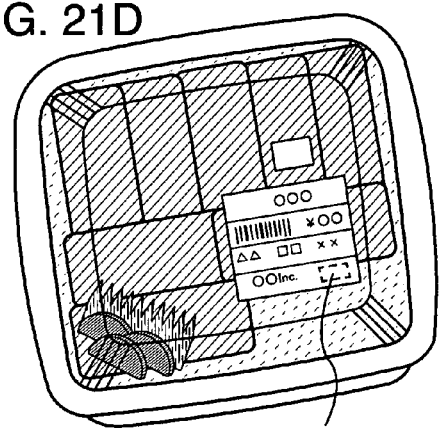
Figure 21E:
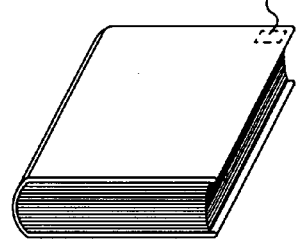
Figure 21F:
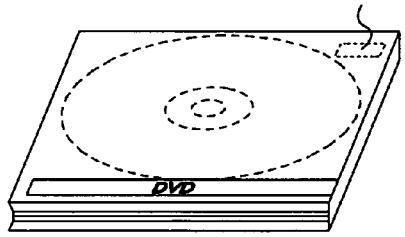
Figure 21G:
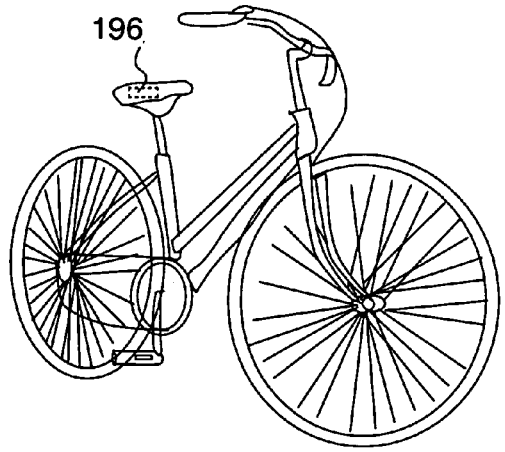

The bills and coins are currency in the market and include notes that are circulating as the real money in specific areas (cash vouchers), memorial coins, and the like. The securities include checks, certificates, promissory notes, and the like, and can be provided with a chip 190 including a processor circuit (FIG. 21A). The documents include driver's licenses, resident's cards, and the like, and can be provided with a chip 191 including a processor circuit (see FIG. 21B). The personal belongings include shoes, a pair of glasses, and the like, and can be provided with a chip 197 including a processor circuit (see FIG. 21C). The bearer bonds include stamps, rice coupons, various gift coupons, and the like. The packaging containers include paper for wrapping a lunch box or the like, plastic bottles, and the like, and can be provided with a chip 193 including a processor circuit (see FIG. 21D). The books include documents and the like, and can be provided with a chip 194 including a processor circuit (see FIG. 21E). The storage media include DVD software, video tapes, and the like, and can be provided with a chip 195 including a processor circuit (see FIG. 21F). The means of transportation include wheeled cycles or vehicles such as bicycles, vessels, and the like, and can be provided with a chip 196 including a processor circuit (see FIG. 21G). The foods include food items, beverages, and the like. The clothes include clothing, footwear, and the like. The healthcare items include medical devices, health appliances, and the like. The consumer products include furniture, lighting apparatuses, and the like. The medicals include medicines, agricultural chemicals, and the like. The electronic devices include liquid crystal display devices, EL display devices, television sets (television receivers or thin television receivers), mobile phones, and the like.

The semiconductor device of the present invention is mounted on a printed board, attached to a surface of a product, or embedded in a product, so that it is fixed on the product. For example, the semiconductor device of the present invention is embedded in paper of a book or an organic resin of a package. The semiconductor device of the present invention can realize a compact size, slim body, and lightweight. Therefore, even when it is fixed on a product, the design of the product itself will not be spoiled. In addition, when the semiconductor device of the present invention is applied to bills, coins, securities, bearer bonds, documents, and the like, authentication functions can be provided. In addition, when the semiconductor device of the present invention is applied to packaging containers, storage media, personal belongings, foods, clothes, consumer products, electronic devices, and the like, efficiency of a system such as an inspection system can be increased.

This application is based on Japanese Patent Application serial No. 2006-126984 filed in Japan Patent Office on Apr. 28, 2006, the entire contents of which are hereby incorporated by reference.

What is claimed is:

1. A semiconductor device comprising:
a semiconductor layer including an element isolation region and an element region, over an insulating surface,
wherein the element region includes a source region, a drain region, a channel formation region and a gate electrode over the channel formation region with a gate insulating film interposed therebetween,
wherein the element isolation region and the element region are in contact with each other,
wherein the element isolation region has a stacked structure of a second element isolation region and a first element isolation region over the second element isolation region;
wherein the first element isolation region includes a first impurity element;
wherein the second element isolation region includes a second impurity element;
wherein the first impurity element is at least one or more kinds of oxygen, nitrogen, and carbon,
wherein the second impurity element is an impurity element that imparts an opposite conductivity type to that of the source region and the drain region to the element isolation region,
wherein crystallinity of the element isolation region is lower than that of the channel formation region;
wherein the gate insulating film is in contact with the element isolation region and the source region, the drain region, and the channel formation region of the element region, and
wherein the element isolation region is formed using a semiconductor layer.

2. The semiconductor device according to claim 1,
wherein an insulating layer is formed over the element isolation region and the element region,
wherein a conductive layer is formed over the insulating layer, and
wherein the conductive layer is provided to extend over the element isolation region and the element region with the insulating layer interposed between the conductive layer and the element isolation region and the element region.

3. The semiconductor device according to claim 1,
wherein the source region or the drain region, and the element isolation region form a pn junction.

4. The semiconductor device according to claim 2,
wherein the source region or the drain region, and the element isolation region form a pn junction.

5. A semiconductor device comprising:
a semiconductor layer including an element isolation region, and a first element region and a second element region, over an insulating surface,
wherein the first element region and the second element region are adjacent to each other with the element isolation region interposed therebetween,
wherein the first element region includes a first source region, a first drain region, a first channel formation region, and a first gate electrode over the first channel formation region with a gate insulating film interposed therebetween;
wherein the second element region includes a second source region, a second drain region, a second channel formation region, and a second gate electrode over the second channel formation region with the gate insulating film interposed therebetween;
wherein the first source region, the first drain region, the second source region, and the second drain region have the same conductivity type;
wherein the element isolation region has a stacked structure of a second element isolation region and a first element isolation region over the second element isolation region;
wherein the first element isolation region includes a first impurity element;
wherein the second element isolation region includes a second impurity element;
wherein the first impurity element is at least one or more kinds of oxygen, nitrogen, and carbon;
wherein the second impurity element is an impurity element that imparts an opposite conductivity type to that of the first source region, the first drain region, the second source region, and the second drain region to the element isolation region;
wherein crystallinity of the element isolation region is lower than that of the first channel formation region and the second channel formation region;
wherein the gate insulating film is in contact with the element isolation region, the first source region, the first drain region, and the first channel formation region of the first element region, and the second source region, the second drain region, and the second channel formation region of the second element region, and
wherein the element isolation region is formed using a semiconductor layer.

6. The semiconductor device according to claim 5,
wherein an insulating layer is formed over the element isolation region, the first element region, and the second element region,
wherein a conductive layer is formed over the insulating layer, and
wherein the conductive layer is provided to extend over the element isolation region and the first element region, or the element isolation region and the second element region with the insulating layer interposed between the conductive layer, and the element isolation region and the element region.

7. The semiconductor device according to claim 5,
wherein the first source region or the first drain region and the element isolation region form a pn junction, and the second source region or the second drain region and the element isolation region form a pn junction.

8. The semiconductor device according to claim 6,
wherein the first source region or the first drain region and the element isolation region form a pn junction, and the second source region or the second drain region and the element isolation region form a pn junction.

9. The semiconductor device according to claim 1,
wherein concentration of the first impurity element included in the element isolation region is greater than or equal to $1 \times 10^{20}$ $\Omega \cdot cm^{-3}$ and less than $4 \times 10^{22}$ $\Omega \cdot cm^{-3}$.

10. The semiconductor device according to claim 5,
wherein concentration of the first impurity element included in the element isolation region is greater than or equal to $1 \times 10^{20}$ $\Omega \cdot cm^{-3}$ and less than $4 \times 10^{22}$ $\Omega \cdot cm^{-3}$.

11. The semiconductor device according to claim 6,
wherein concentration of the first impurity element included in the element isolation region is greater than or equal to $1 \times 10^{20}$ $\Omega \cdot cm^{-3}$ and less than $4 \times 10^{22}$ $\Omega \cdot cm^{-3}$.

12. A semiconductor device comprising:
a semiconductor layer including a first element region, a first element isolation region, a second element isolation region, and a second element region, over an insulating surface,
wherein the first element region includes a first source region, a first drain region, a first channel formation region, and a first gate electrode over the first channel formation region with a gate insulating film interposed therebetween;
wherein the second element region includes a second source region, a second drain region, a second channel formation region, and a second gate electrode over the second channel formation region with the gate insulating film interposed therebetween;
wherein the first source region and the first drain region are n-type impurity regions;
wherein the second source region and the second drain region are p-type impurity regions;
wherein the first source region and the first drain region are interposed between the first element isolation region and another first element isolation region;
wherein the second source region and the second drain region are interposed between the second element isolation region and another second element isolation region;
wherein the first element isolation region includes a first impurity element of at least one or more kinds of oxygen, nitrogen, and carbon and an impurity element that imparts p-type conductivity to the first element isolation region;
wherein the second element isolation region includes a first impurity element of at least one or more kinds of oxygen, nitrogen, and carbon and an impurity element that imparts n-type conductivity to the second element isolation region;
wherein crystallinity of the first element isolation region and the second element isolation region is lower than that of the first channel formation region and the second channel formation region;
wherein the gate insulating film is in contact with the first element isolation region, the second element isolation region, the first source region, the first drain region, and the first channel formation region of the first element region, and the second source region, the second drain region, and the second channel formation region of the second element region, and
wherein the element isolation region is formed using a semiconductor layer.

13. The semiconductor device according to claim 12,
wherein an insulating layer is formed over the first element region, the first element isolation region, the second element region, and the second element isolation region,
wherein a conductive layer is formed over the insulating layer, and
wherein the conductive layer is provided to extend over the first element region, the first element isolation region, the second element region, and the second element isolation region.

14. The semiconductor device according to claim 12,
wherein the first source region or the first drain region and the first element isolation region form a pn junction, and
wherein the second source region or the second drain region and the second element isolation region form a pn junction.

15. The semiconductor device according to claim 13,
wherein the first source region or the first drain region and the first element isolation region form a pn junction, and
wherein the second source region or the second drain region and the second element isolation region form a pn junction.

16. The semiconductor device according to claim 12,
wherein concentration of the first impurity element included in the first element isolation region and the second element isolation region is greater than or equal to $1\times10^{20}$ $\Omega\cdot cm^{-3}$ and less than $4\times10^{22}$ $\Omega\cdot cm^{-3}$.

17. The semiconductor device according to claim 1, wherein the gate insulating film is in contact with entire upper surfaces of the element isolation region and the element region.

18. The semiconductor device according to claim 5, wherein the gate insulating film is in contact with entire upper surfaces of the element isolation region, the first element region, and the second element region.

19. The semiconductor device according to claim 12, wherein the gate insulating film is in contact with entire upper surfaces of the first element region, the first element isolation region, the second element isolation region, and the second element region.

20. The semiconductor device according to claim 1, wherein resistivity of, the element isolation region is greater than or equal to $1\times10^{10}$ $\Omega\cdot cm$.

21. The semiconductor device according to claim 1, wherein a rare gas element is used for the element isolation region.

* * * * *